(12) United States Patent
Sasayama

(10) Patent No.: US 7,435,021 B2
(45) Date of Patent: Oct. 14, 2008

(54) AUTOMATIC DEVELOPMENT METHOD OF PHOTOSENSITIVE LITHOGRAPHIC PRINTING PLATE AND AUTOMATIC DEVELOPMENT DEVICE THEREOF

(75) Inventor: Hiroyuki Sasayama, Haibara-gun (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 11/878,142

(22) Filed: Jul. 20, 2007

(65) Prior Publication Data

US 2007/0269206 A1   Nov. 22, 2007

Related U.S. Application Data

(62) Division of application No. 11/062,480, filed on Feb. 23, 2005, now abandoned.

(30) Foreign Application Priority Data

Feb. 23, 2004 (JP) .............................. 2004-046269

(51) Int. Cl.
*G03D 3/00* (2006.01)
*G03D 3/02* (2006.01)
*G03B 27/32* (2006.01)

(52) U.S. Cl. .................... 396/564; 396/626; 355/27
(58) Field of Classification Search ................ 396/564, 396/573, 575, 578, 582, 611, 626; 430/398, 430/399, 419, 420, 434; 355/27, 77
See application file for complete search history.

(56) References Cited

U.S. PATENT DOCUMENTS

| 4,882,246 | A | 11/1989 | Ohba et al. |
|---|---|---|---|
| 5,701,542 | A | 12/1997 | Sasayama |
| 5,716,743 | A | 2/1998 | Stein et al. |
| 5,930,547 | A | 7/1999 | Stein et al. |
| 6,315,467 | B1 | 11/2001 | Oishi et al. |
| 6,364,544 | B1 | 4/2002 | Sasayama et al. |
| 6,866,432 | B2 * | 3/2005 | Sasayama .................. 396/571 |

FOREIGN PATENT DOCUMENTS

| EP | 0767410 A2 | 4/1997 |
|---|---|---|
| EP | 1122610 A2 | 8/2001 |
| JP | 2516022 | 4/1996 |
| JP | 9-96910 | 4/1997 |

\* cited by examiner

*Primary Examiner*—Rodney E Fuller
(74) *Attorney, Agent, or Firm*—Buchanan Ingersoll & Rooney PC

(57) ABSTRACT

A developer replenishing method of an automatic development device of photosensitive lithographic printing plate including developing a plurality of exposed photosensitive lithographic printing plates with a developer containing an electrolyte and keeping the developer activity constant by replenishing with a replenisher. The method includes obtaining certain defined values, conducting defined calculations, comparing defined values and, dependent on the comparison, setting new values An automatic development device which carries out the method is also set forth.

4 Claims, 13 Drawing Sheets

AUTOMATIC DEVELOPMENT METHOD OF PHOTOSENSITIVE LITHOGRAPHIC PRINTING PLATE AND AUTOMATIC DEVELOPMENT DEVICE THEREOF

CROSS REFERENCE TO RELATED APPLICATION

This application is a divisional of application Ser. No. 11/062,480 filed Feb. 23, 2005, which claims priority to Japanese Application No. 2004-046269 filed on Feb. 23, 2004, the disclosures of all of which are incorporated herein by reference in their entirety.

BACKGROUND OF THE INVENTION

1. Field of the Invention

The present invention relates to an automatic development method of, for example, photosensitive lithographic printing plate and an automatic development device thereof. In particular, the invention relates to a technology for controlling a fluctuation of the sensitivity of a developer against changes of the development processing condition in the minimum level.

2. Description of the Related Art

In general, in an automatic development device of photosensitive lithographic printing plate, a replenishing system due to aging and due to processing in which a development replenisher is replenished in a developing tank where a developer is stored, a plate area of a lithographic printing plate to be processed is measured, and the development replenisher is replenished in an amount corresponding to the measured value (this system will be hereinafter referred to as "area-based replenishing system due to aging") is employed as a measure for managing the sensitivity of the developer.

However, in such an area-based replenishing system due to aging, a high-precision plate area measurement device of lithographic printing plate is required in a development processing section of the automatic development device, and therefore, there was a problem of complication of the structure and an increase of the costs. Also, it is difficult to distinguish whether the photosensitive side of the lithographic printing plate is a single side or double sides (hereinafter referred to as "single side/double sides") and to distinguish the plate type (such as a plate having a different coating amount of the photosensitive layer). For these reasons, there was encountered such a problem that if a necessary replenishing amount of the development replenisher changes due to the changes of the plate area, single side/double sides and plate type of the lithographic printing plate, it becomes difficult to adequately achieve the replenishment of the development replenisher amount.

Then, so far, as described in, for example, Japanese Patent No. 2,516,022 (JP-A-64-21451), a replenishing system in which an electric conductivity of a developer is measured, the measured value is compared with an electric conductivity value exhibiting an optimum sensitivity as previously experimentally determined (this electric conductivity value will be hereinafter referred to as "adequate electric conductivity value"), and when the measured value is lower than the adequate electric conductivity value, a development replenisher is replenished (this system will be hereinafter referred to as "electric conductivity-based replenishing system") was employed as a method of replenishing a development replenisher of an automatic development device for photosensitive lithographic printing plate. In such an electric conductivity-based replenishing system, even if the plate area, single side/double sides and plate type of the lithographic printing plate to be processed change, it is possible to replenish an adequate amount of the development replenisher, thereby keeping the sensitivity of the developer adequate.

However, in general, there is an empirical fact that the adequate electric conductivity value is different between a developer which has fatigued only by carbon dioxide gas due to aging and a developer which has fatigued only by plate processing (in the case of silicate based treating agent, fatigue due to aging (fatigue by carbon dioxide gas)—recovery by replenishment: 65 mS/cm, fatigue by processing—recovery by replenishment: 55 mS/cm; and in the case of non-silicate based treating agent, fatigue due to aging—recovery by replenishment: 56 mS/cm, fatigue by processing—recovery by replenishment: 39 mS/cm;). For this reason, in the foregoing electric conductivity-based replenishing system, in the case where the processing frequency, for example, the daily processing amount, is different from an expected value, a rate of the actual replenishing amount due to aging to the actual replenishing amount due to processing is also different from an expected value. Therefore, there is encountered such a problem that an adequate electric conductivity value of the whole of the developer in a developing tank calculated from the respective adequate electric conductivities changes and a difference from the preset adequate electric conductivity value is generated, whereby it becomes impossible to adequately keep the sensitivity of the developer.

On the other hand, JP-A-9-96910 proposes an automatic developing device in which a time interval for replenishment is measured, a necessary replenishing amount due to aging is determined within that time interval, by considering a value obtained by subtracting this replenishing amount due to aging from the replenishing amount per unit time as a replenishing amount due to processing, the replenishing amount due to processing and the replenishing amount due to aging are respectively determined, and the electric conductivity of developer is controlled by the electric conductivity value calculated from a proportion of the resulting replenishing amount due to processing and replenishing amount due to aging. According to this measure, even if the plate area, single side/double sides and plate type of the lithographic printing plate to be processed change, by estimating a proportion of the replenishing amount due to processing to the replenishing amount due to aging, it is possible to deduce an adequate electric conductivity value of developer.

However, according to the foregoing method of controlling the electric conductivity of developer by the electric conductivity value determined from a proportion of the replenishing amount due to processing to the replenishing amount due to aging as calculated from the time interval for replenishment, in the case where the fatigue condition due to aging is different, there is encountered such a problem that a precise proportion of the replenishing amount due to processing to the replenishing amount due to aging cannot be determined. Examples of the case where the fatigue condition due to aging is different include the case where the concentration of carbon dioxide gas in the circumferential atmosphere changes and the case where the wind velocity in the circumferential atmosphere changes. It is known that with respect to the former, the subject proportion changes depending upon the number of workers in a room where the automatic developing device is placed; and that with respect to the latter, the subject proportion changes depending upon the position of an air port or the air volume of an air conditioner. That is, according to the foregoing replenishing method, the previously experimentally determined replenishing amount due to aging in every unit time is different from the actual replenishing amount due to aging in every unit time depending upon increase or decrease of the number of workers in a room or the state of an air conditioner so that a precise replenishing amount due to aging cannot be determined from the time interval for replenishment. Thus, there is fear that a wrong target electric conductivity value is calculated.

SUMMARY OF THE INVENTION

An object of the invention is to provide a developer replenishing method of an automatic developing device of photosensitive lithographic printing plate capable of controlling a fluctuation of the sensitivity of a developer against changes of the development processing condition in the minimum level while employing a cheap construction as a developing section of the automatic development device.

The foregoing object of the invention can be achieved by the following constructions.

(1). A developer replenishing method of an automatic development device of photosensitive lithographic printing plate including: developing a plurality of exposed photosensitive lithographic printing plates with a developer containing an electrolyte; and keeping a developer activity constant, the method comprises:

measuring an electric conductivity of the developer at every fixed period;

replenish a replenisher of an amount corresponding to a replenishing amount setting value due to aging at every fixed time;

replenish a replenisher of an amount corresponding to a replenishing amount setting value due to processing in every processing of a plate having a fixed area;

calculating an operating value of electric conductivity from the replenishing amount due to aging and the replenishing amount due to processing; and increasing or decreasing the replenishing amount setting value due to aging and the replenishing amount setting value due to processing based on a result obtained by comparing the calculated operating value of electric conductivity with the measured electric conductivity of the developer.

(2). A developer replenishing method of an automatic development device of photosensitive lithographic printing plate including: developing a plurality of exposed photosensitive lithographic printing plates with a developer containing an electrolyte; and keeping a developer activity constant the method comprises:

measuring an electric conductivity of the developer at every fixed period;

integrating a setting value of replenishing amount due to aging with a last integrating value of replenishing amount due to aging at every fixed time to obtain a new integrating value of replenishing amount due to aging;

integrating a setting value of replenishing amount due to processing with a last integrating value of replenishing amount due to processing in every processing of a plate having a fixed area to obtain a new integrating value of replenishing amount due to aging; and thereafter, when a total sum of the new integrating value of replenishing amount due to aging and the new integrating value of replenishing amount due to processing exceeds a fixed minimum value of replenishing amount, (a) measuring an elapsed time from a point in time of a last replenishment till this point in time and calculating an operating value of electric conductivity from the elapsed time;

(b) changing the setting value of replenishing amount due to aging and the setting value of replenishing amount due to processing based on a result obtained by comparing the operating value of electric conductivity with the measured electric conductivity value of the developer;

(c) replenishing the developer in a developing tank with a replenisher of an amount corresponding to a total sum of the new integrating value of replenishing amount due to aging and the new integrating value of replenishing amount due to processing; and (d) initializing the new integrating value of replenishing amount due to aging and the new integrating value of replenishing amount due to processing.

(3). A developer replenishing method of an automatic development device of photosensitive lithographic printing plate including: developing a plurality of exposed photosensitive lithographic printing plates with a developer containing an electrolyte; and keeping a developer activity constant, the method comprises:

measuring an electric conductivity of the developer at every fixed period;

integrating a last setting value of replenishing amount due to aging with a last integrating value of replenishing amount due to aging at every fixed time to obtain a new integrating value of replenishing amount due to aging;

integrating a last setting value of replenishing amount due to processing with a last integrating value of replenishing amount due to processing in every processing of a plate having a fixed area to obtain a new integrating value of replenishing amount due to processing;

operating a replenishment rate due to aging which is a proportion of a replenisher due to aging in the developer in a developing tank; and thereafter, when a total sum of the new integrating value of replenishing amount due to aging and the new integrating value of replenishing amount due to processing exceeds a fixed minimum value of replenishing amount, (a) measuring an elapsed time from a point in time of a last replenishment till this point in time and calculating a first operating value of electric conductivity from the elapsed time;

(b) changing the last setting value of replenishing amount due to aging to a new setting value of replenishing amount due to aging; and the last setting value of replenishing amount due to processing to a new setting value of replenishing amount, based on a result obtained by comparing the first operating value of electric conductivity with the measured electric conductivity value of the developer;

(c) calculating a second integrating value of electric conductivity from the replenishment rate due to aging;

(d) changing the new setting value of replenishing amount due to aging and the new setting value of replenishing amount due to processing based on a result obtained by comparing the second operating value of electric conductivity with the electric conductivity value of the developer;

(e) replenishing a developer in the developing tank with a replenisher of an amount corresponding to a total sum of the new integrating value of replenishing amount due to aging and the new integrating value of replenishing amount due to processing; and (f) initializing the new integrating value of replenishing amount due to aging and the new integrating value of replenishing amount due to processing.

(4). A developer replenishing method of an automatic development device of photosensitive lithographic printing plate including: developing a plurality of exposed photosensitive lithographic printing plates with a developer containing an electrolyte; and keeping a developer activity constant, the method comprises:

measuring an electric conductivity of the developer at every fixed period;

integrating a last setting value of replenishing amount due to aging with a last integrating value of replenishing amount due to aging at every fixed time to obtain a new integrating value of replenishing amount due to aging;

integrating a last setting value of replenishing amount due to processing with a last integrating value of replenishing amount due to processing in every processing of a plate having a fixed area to obtain a new integrating value of replenishing amount due to aging;

operating a displacement rate of a replenisher which is a proportion of a replenishing amount in the developer in a developing tank;

operating a replenishment rate due to aging which is a proportion of a replenisher due to aging in the developer in the developing tank; and thereafter, when a total sum of the new integrating value of replenishing amount due to aging and the new integrating value of replenishing amount due to processing exceeds a fixed minimum value of replenishing amount, (a) measuring an elapsed time from a point in time of a last replenishment till this point in time and calculating a first operating value of electric conductivity from the elapsed time;

(b) changing the last setting value of replenishing amount due to aging to a new setting value of replenishing amount due to aging; and the last setting value of replenishing amount due to processing to a new setting value of replenishing amount due to processing, based on a result obtained by comparing the first operating value of electric conductivity with the measured electric conductivity value of the developer;

(c) calculating a second integrating value of electric conductivity from the displacement rate of replenisher and the replenishment rate due to aging;

(d) changing the new setting value of replenishing amount due to aging and the new setting value of replenishing amount due to processing based on a result obtained by comparing the second operating value of electric conductivity with the measured electric conductivity value of the developer;

(e) replenishing the developer in the developing tank with a replenisher of an amount corresponding to a total sum of the new integrating value of replenishing amount due to aging and the new integrating value of replenishing amount due to processing; and (f) initializing the new integrating value of replenishing amount due to aging and the new integrating value of replenishing amount due to processing.

(5). A developer replenishing method of an automatic development device of photosensitive lithographic printing plate including: developing a plurality of exposed photosensitive lithographic printing plates with a developer containing an electrolyte; and keeping a developer activity constant, the method comprises:

measuring an electric conductivity of the developer at every fixed period;

integrating a last setting value of replenishing amount due to aging with a last integrating value of replenishing amount due to aging at every fixed time to obtain a new integrating value of replenishing amount due to aging;

integrating a last setting value of replenishing amount due to processing with a last integrating value of replenishing amount due to processing in every processing of a plate having a fixed area to obtain a new integrating value of replenishing amount due to processing;

operating a displacement rate of a replenisher which is a proportion of a replenishing amount in the developer in a developing tank;

operating a replenishment rate due to aging which is a proportion of a replenisher due to aging in the developer in the developing tank; and thereafter, when a total sum of the new integrating value of replenishing amount due to aging and the new integrating value of replenishing amount due to processing exceeds a fixed minimum value of replenishing amount, (a) measuring an elapsed time from a point in time of a last replenishment till this point in time and calculating a first operating value of electric conductivity from the elapsed time;

(b) changing the last setting value of replenishing amount due to aging to a new setting value of replenishing amount due to aging; and the last setting value of replenishing amount due to processing to a new setting value of replenishing amount due to processing, based on a result obtained by comparing the first operating value of electric conductivity with the electric conductivity value of the developer;

(c) calculating a second integrating value of electric conductivity from the displacement rate of replenisher and the replenishment rate due to aging;

(d) changing the new setting value of replenishing amount due to aging and the new setting value of replenishing amount due to processing based on a result obtained by comparing the second operating value of electric conductivity with the electric conductivity value of the developer;

(e) when the electric conductivity value of the developer is smaller than the first integrating value of electric conductivity, replenishing a predetermined amount of replenisher, whereas when the electric conductivity value of the developer is larger than the first integrating value of electric conductivity, replenishing the developer in the developing tank with a replenisher of an amount corresponding to a total sum of the new integrating value of replenishing amount due to aging and the new integrating value of replenishing amount due to processing; and (f) initializing the new integrating value of replenishing amount due to aging and the new integrating value of replenishing amount due to processing.

(6). The developer replenishing method according to claim 2, wherein an electric conductivity value of the developer whose activity falls within a proper range is previously calculated as a target electric conductivity value; and during a time of immediately after initiating an operation of the automatic development device until the measured electric conductivity value of the developer exceeds the target electric conductivity value, an electric conductivity of the developer is measured at every fixed period, and when the measured electric conductivity value is lower than the target electric conductivity value, the developer is replenished with a development replenisher.

(7). An automatic development device of photosensitive lithographic printing plate for developing a plurality of exposed photosensitive lithographic printing plates with a developer containing an electrolyte and keeping a developer activity constant, which comprises a development processing section for developing the photosensitive lithographic printing plates with a developer;

an electric conductivity measurement unit for measuring an electric conductivity of the developer; and a developer replenishing unit for replenishing the developer with a development replenisher, wherein replenishing the developer with the development replenisher is carried out based on the developer replenishing method according to any one of (1) to (6).

In the invention, the "development replenisher" as referred to herein means a processing liquid to be replenished for the purpose of keeping the development performance constant. In general, as this replenisher, one prepared by diluting a stock solution of replenisher with a diluent (for example, water) or a stock solution of replenisher itself without dilution is useful. However, in the invention, the "development replenisher" means one prepared by diluting a stock solution of replenisher with a diluent. Also, examples of the replenishing method include a method in which a replenisher prepared by previous dilution is replenished in the developer and a method in which a stock solution of replenisher and a diluent are individually replenished directly in the developer.

Also, in the invention, as an electric conductivity sensor for measuring the electric conductivity value of the developer, known means such as an alternating current electric conductivity meter, an alternating current bridge meter, and other electric conductivity meters can be used. Also, with respect to the measuring current value or oscillation frequency, etc. of the measuring instruments, the optimum condition is different depending upon the developer composition, etc. However, from the viewpoint of devices or for the purpose of preventing the electrolysis of a water-soluble developer, it is preferable that the current value is low to some extent, and the current value is preferably from several hundreds mA to several µA. Also, the frequency is preferably from several hundreds Hz to several hundreds kHz in view of the relationship with a capacitance component in the developer.

The electric conductivity of the developer containing an electrolyte depends upon the temperature of an aqueous solution, and when the liquid temperature increases, the electric conductivity value decreases. Accordingly, it is more preferable that the electric conductivity value is measured by a measuring instrument equipped with a temperature sensor and a temperature compensatory circuit. Also, in a controlling device for controlling the replenishment, it is possible to compensate the temperature by reducing the electric conductivity value into an electric conductivity value at a preset temperature from the actually measured resistance value of liquid and liquid temperature. With respect to the position at which the sensor of the alternating current electric conductivity meter, the alternating current bridge meter or other electric conductivity meters is placed, any place is employable so far as the sensor is immersed in the developer at the time of measurement, whereby the alternating current electric conductivity value of the developer can be measured. For example, the position in a developer circulation system of the automatic development device, especially the position in a developing tank or a circulating pipe, is preferable. Also, as a detection section, known cells in which platinum, stainless steel, etc. is used as an electrode can be used.

According to the invention, in developing a plurality of exposed photosensitive lithographic printing plates with a developer containing an electrolyte, by measuring an electric conductivity value of the developer in every predetermined fixed period, replenishing a predetermined setting value of replenishing amount due to aging in every fixed time, replenishing a predetermined setting value of replenishing amount due to processing in every processing of a plate having a fixed area, calculating a replenishing amount due to aging based on the replenishing amount setting value due to aging, calculating a replenishing amount due to processing based on the replenishing amount setting value due to processing, calculating an operating value of electric conductivity from the replenishing amount due to aging and the replenishing amount due to processing and increasing or decreasing the setting value of replenishing amount due to aging and the setting value of replenishing amount due to processing based on the result obtained by comparing the calculated operating value of electric conductivity with the electric conductivity of the developer, it is possible to prevent a fluctuation of a target electric conductivity value caused due to changes of the processing condition (a proportion of the replenishing amount due to processing to the replenishing amount due to aging) and the circumferential condition (concentration of circumferential carbon dioxide gas) while employing a simple and cheap device construction. Thus, it is possible to realize the automatic development processing with high sensitivity stability.

DETAILED DESCRIPTION OF THE INVENTION

Figure 1:
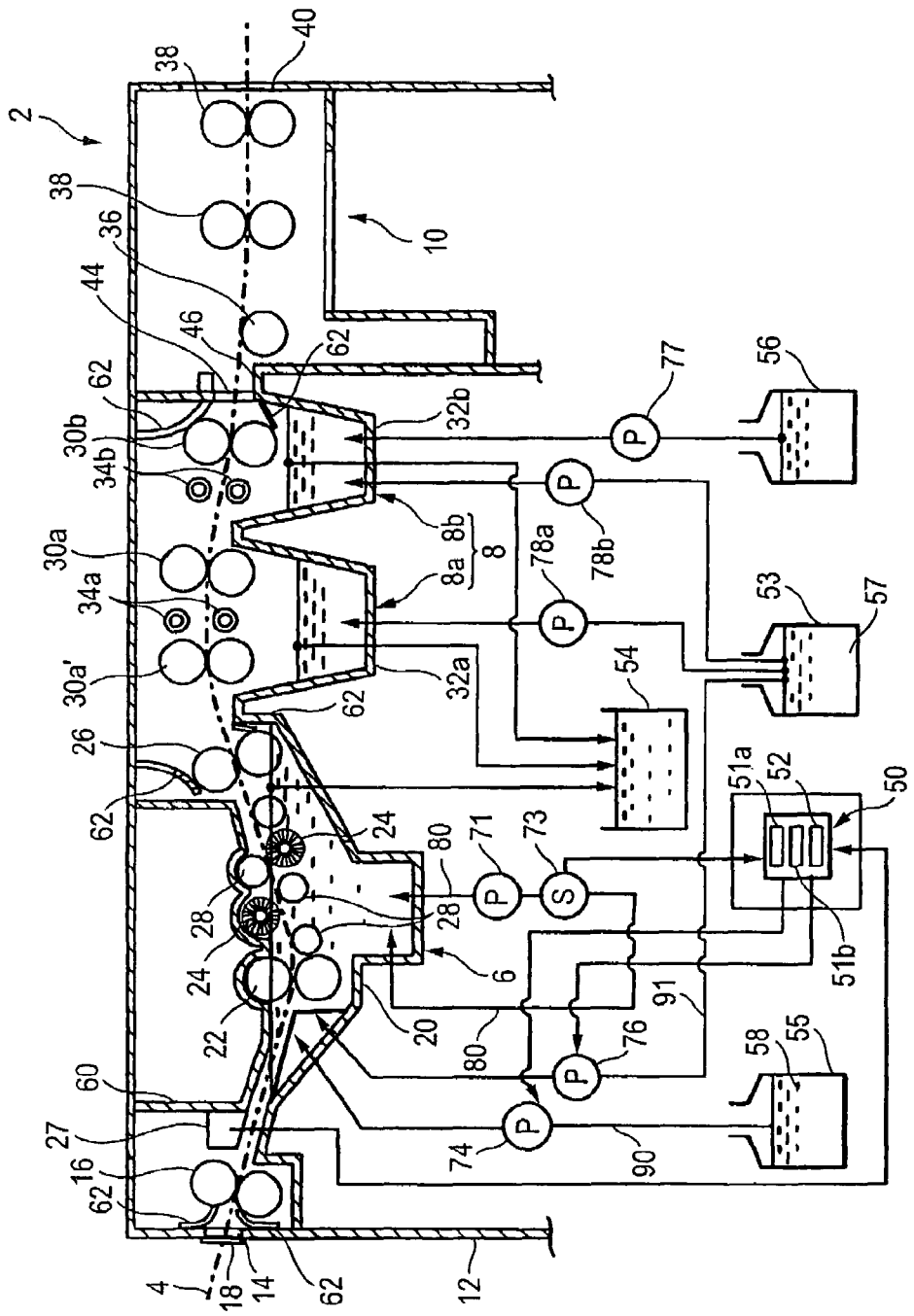
FIG. 1 is a constructive view of the first embodiment of an automatic development device for carrying out the developer replenishing method according to the invention.

Preferred embodiments of the automatic developing method of photosensitive lithographic printing plate and its automatic development device according to the invention will be described below.

First of all, an alkaline developer of the invention will be described. The alkaline developer of the invention can be used as a developer to be charged at the time of initiating the development (hereinafter referred to as "development initiating liquid") or a development replenisher. The development initiating liquid and the development replenisher will be hereinafter collectively referred to as "developer" unless otherwise indicated.

The developer of the invention is made of an alkaline aqueous solution as a basic composition and can be properly chosen among conventionally known alkaline aqueous solutions.

Examples of the alkaline aqueous solution include developers comprising an alkali silicate or a non-reducing sugar and a base. Of these, ones having a pH of from 12.5 to 14.0 are especially preferable.

The foregoing alkali silicate is one which when dissolved in water, becomes alkaline, and examples thereof include alkali metal silicates such as sodium silicate, potassium silicate, and lithium silicate and ammonium silicate.

The alkali silicate can be used singly or in combinations of two or more kinds thereof.

In the foregoing alkaline aqueous solution, the developability can be easily adjusted by a mixing ratio of silicon oxide $SiO_2$ as a component of the silicate to an alkali oxide $M_2O$ (wherein M represents an alkali metal or an ammonium group) and adjustment of the concentration.

Of the foregoing alkaline aqueous solutions, ones having a mixing ratio of the silicon oxide $SiO_2$ to the alkali oxide $M_2O$ ($SiO_2/M_2O$ molar ratio) of from 0.5 to 3.0 are preferable. When the mixing ratio falls within this range, the alkaline aqueous solution scarcely etches general-purpose aluminum plates as a support of lithographic printing plate and is good in the developability. The $SiO_2/M_2O$ (molar ratio) is more preferably from 1.0 to 2.0.

Also, from the viewpoints of good developability and processing ability and convenience of waste liquid, the concentration of the alkali silicate in the developer is preferably from 1 to 10% by weight, more preferably from 3 to 8% by weight, and most preferably from 4 to 7% by weight based on the weight of the alkaline aqueous solution.

In the developer comprising a non-reducing sugar and a base, the "non-reducing sugar" as referred to herein means a sugar not having reducing properties because it does not have a free aldehyde group or ketone group and is classified into a trehalose type oligosaccharide in which reducing groups are bonded to each other, a glycoside in which a reducing group of a sugar is bonded to a non-sugar, and a sugar alcohol which has been reduced upon hydrogenation to a sugar. In the invention, all of these sugars can be preferably used.

Examples of the trehalose type oligosaccharide include saccharose and trehalose; and examples of the glycoside include alky glycosides, phenol glycosides, and mustard oil glycosides.

Examples of the sugar alcohol include D,L-arabitol, ribitol, xylitol, D,L-sorbitol, D,L-mannitol, D,L-iditol, D,L-talitol, dulcitol, allodulcitol, and mesoinositol. Further, maltitols obtained by hydrogenation of disaccharides and reductants (for example, reducing starch syrup) obtained by hydrogenation of oligosaccharides can be preferably enumerated.

Of these, sugar alcohols and saccharose are preferable as the non-reducing sugar; and D-sorbitol, mesoinositol, saccharose, and reducing starch syrup are especially preferable in view of the matter that they have a buffering action in a proper pH region.

These non-reducing sugars may be used singly or in combinations of two or more kinds thereof. The proportion of the non-reducing sugar in the developer is preferable from 0.1 to 30% by weight, and more preferably from 1 to 20% by weight.

In the foregoing alkali silicate or non-reducing sugar, an alkaline agent as the base can be properly chosen among conventionally known compounds and combined.

Examples of the alkaline agent include inorganic alkaline agents (for example, sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, and ammonium borate), potassium citrate, tripotassium citrate, and sodium citrate.

Further, organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropylamine, diisopropanolamine, ethyleneimine, ethylenediamine, and pyridine can be preferably enumerated.

These alkaline agents can be used singly or in combinations of two or more kinds thereof.

Of these, sodium hydroxide and potassium hydroxide are preferable. This is because by adjusting the addition amount against the non-reducing sugar, it becomes possible to adjust the pH in a broad pH region. Also, trisodium phosphate, tripotassium phosphate, sodium carbonate, potassium carbonate, and the like are preferable because they have a buffering action by themselves.

The developer of the invention is characterized by containing at least one kind selected from the group consisting of carboxyalkylthio succinic anhydrides, carboxyalkylthio succinic acids, and salts thereof.

As the at least one kind selected from the group consisting of carboxyalkylthio succinic anhydrides, carboxyalkylthio succinic acids, and salts thereof, a compound represented by the following general formula (I) or (II) is enumerated. In the developer of the invention, such compounds can be used singly or in combinations of two or more kinds thereof.

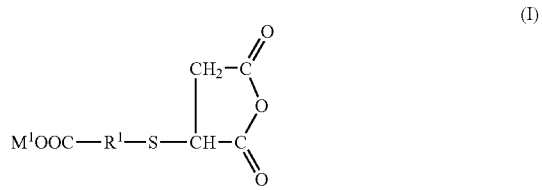

(I)

In the formula (I), $R^1$ represents an alkylene group having from 1 to 30 carbon atoms; and $M^1$ represents a hydrogen atom, a metal atom, or ammonium.

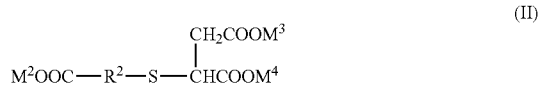

(II)

In the formula (II), $R^2$ represents an alkylene group having from 1 to 30 carbon atoms; and $M^2$, $M^3$ and $M^4$ each independently represents a hydrogen atom, a metal atom, or ammonium.

In the carboxyalkylthio succinic anhydrides or salts thereof represented by the foregoing formula (I) and the carboxyalkylthio succinic acids or salts thereof represented by the foregoing formula (II), $R^1$ and $R^2$ each represents an alkylene group having from 1 to 30 carbon atoms and may be linear or branched. Specific examples of the alkylene group include an ethylene group, a propylene group, a butylene group, a pentylene group, a hexylene group, an octylene group, a nonylene group, a decylene group, an undecylene group, a dodecylene group, a tridecylene group, a tetradecylene group, a pentadecylene group, a hexadecylene group, a heptadecylene group, an octadecylene group, a nonadecylene group, an eicosylene group, a heneicosylene group, a docosylene group, a tricosylene group, a tetracosylene group, a pentacosylene group, a hexacosylene group, an octacosylene group, a nonacosylene group, and a triacosylene group. Of these, alkylene groups having from 1 to 18 carbon atoms are preferable.

In the foregoing formulae (I) and (II), the metal atom represented by $M^1$, $M^2$, $M^3$ and $M^4$ is a metal atom corresponding to a single valence. Specific examples thereof include monovalent metal atoms such as alkali metals (for example, lithium, sodium, and potassium), calcium, magnesium, zinc, aluminum, iron, cobalt, nickel, copper, and tin. Of these, lithium, sodium, potassium, calcium, and magnesium are preferable. Here, with respect to divalent or polyvalent metal atoms, a hypothetical metal atom obtained by dividing the subject metal atom by the valence number is considered as a monovalent metal atom. For example, when the metal is a divalent metal such as calcium and magnesium, the metal is expressed as, for example, $Ca_{1/2}$ and $Mg_{1/2}$; and when the metal is a trivalent metal such as aluminum, the metal is expressed as, for example, $Al_{1/3}$. Actually, in general, in the compound represented by the general formula (I), in the case of a divalent metal atom, a structure in which one metal atom crosslinks two molecules is taken; and in the case of a trivalent metal, a structure in which one metal atom crosslinks three molecules is taken. On the other hand, in the compound represented by the general formula (II), one divalent metal atom is corresponding to two of $M^2$, $M^3$ and $M^4$. Also, the divalent metal atom may be corresponding to two of $M^2$, $M^3$ and $M^4$ in one molecule of the compound represented by the general formula (II); and a structure in which the divalent metal atom is corresponding to two of $M^2$, $M^3$ and $M^4$ of two molecules of the compound represented by the general formula (II) and crosslinks the two molecules may be taken. Further, the trivalent metal atom is corresponding to three of $M^2$, $M^3$ and $M^4$ of from one molecule to three molecules of the compound represented by the general formula (II).

In the foregoing formulae (I) and (II), the ammonium represented by $M^2$, $M^3$ and $M^4$ includes $NH_4^+$, primary ammonium, secondary ammonium, and tertiary ammonium. In the primary ammonium, secondary ammonium and tertiary ammonium, the substituent can be an aliphatic group or an aromatic group each having from 1 to 24 carbon atoms; and the aliphatic group and aromatic group may have an substituent and may be substituted with, for example, a hydroxyl group. In the secondary ammonium and tertiary ammonium, the respective two substituents and three substituents may be the same or different and may be taken together to form a ring.

Examples of an organic amine for introducing the foregoing ammonium salt include aliphatic amines such as methylamine, ethylamine, propylamine, butylamine, hexylamine, and octylamine; aromatic amines such as alkanolamines (for example, ethanolamine, diethanolamine, triethanolamine, isopropanolamine, diisopropanolamine, and triisopropanolamine) and aniline; and heterocyclic amines such as morpholine, pyridine, pyrrolidine, and piperidine. Of these, morpholine and alkanolamines are especially preferable.

The compound represented by the general formula (I) or (II) which is used in the invention can be produced by the customary manner. For example, the compound can be produced by a method disclosed in JP-A-8-337891. For example, it is possible to obtain the carboxylalkylthio succinic anhydride or carboxylalkylthio succinic anhydride salt represented by the general formula (I) by adding a mercapto carboxylic acid or a salt thereof to maleic anhydride. Also, it is possible to obtain the compound represented by the general formula (II) by hydrolyzing the thus obtained compound represented by the general formula (I) or further neutralizing with a preferable basic compound to form a salt.

The content of the at least one kind selected from the group consisting of carboxyalkylthio succinic anhydrides, carboxyalkylthio succinic acids, and salts thereof in the developer of the invention is properly from 0.001 to 10.0% by weight, preferably from 0.01 to 1.0% by weight, and more preferably from 0.05 to 0.5% by weight.

As described previously, the developer containing an alkali silicate or a non-reducing sugar and a base is used as the alkaline developer. $Li^+$, $Na^+$, $K^+$, and $NH_4^+$ have hitherto been used as its cation component. Above all, in a system containing many cations having a small ion radius, though it has high permeability into the image recording layer and excellent developability, it dissolves even an image area therein, thereby generating an image defect. Accordingly, in order to increase the alkali concentration, there is some limit. For the sake of achieving complete processing such that the image recording layer (residual film) does not remain in a non-image area without generating a defect in the image area, it was required to delicately set up the liquid property condition.

However, by using cations having a large ion radius as the foregoing cation component, it is possible to suppress the permeability of the developer into the image recording layer and to enhance an effect for suppressing the dissolution of an image area without lowering the alkali concentration, i.e., developability.

In addition to the foregoing alkali metal cations and ammonium ion, other cations can be used as the cation component.

A use embodiment of the developer of the invention is not particularly limited.

In recent years, in the plate making and printing industries, for rationalization and standardization of plate making works, automatic processors for printing plate are widely used. The developer of the invention can be used for the development processing by an automatic processor.

In general, such an automatic processor comprises a developing section and a post processing section and comprises a device for delivering a printing plate and respective processing tanks and spraying devices. The automatic processor undergoes development processing of an exposed printing plate by spraying each processing liquid drawn up by a pump from a spray nozzle while horizontally delivering it. Also, recently, a method in which a printing plate is processed by immersing and delivering it by in-liquid guide rolls, etc. in a processing liquid tank filled with a processing liquid is known. In such automatic processing, it is possible to achieve the processing while replenishing each processing liquid with a replenisher depending upon the processing amount and operation time.

In this case, by adding an aqueous solution having a higher alkaline strength than the development initiating liquid as the development replenisher in the developer, it is possible to achieve processing of a large quantity of an image forming material without exchanging the developer in the developing tank over a long period of time. In the plate making method of the invention, it is also preferred to employ this replenishing system.

For the purposes of promoting or suppressing the developability, dispersing development scum and enhancing inkphilicity of an image area of the printing plate, various surfactants and organic solvents can also be added as the need arises.

The surfactant can be chosen among nonionic, anionic, cationic and ampholytic surfactants.

Examples of the nonionic surfactant include polyethylene glycols (for example, polyethylene glycol and a polyethylene glycol polypropylene glycol block copolymer); polyethylene glycol alkyl ethers (for example, polyethylene glycol cetyl ether, polyethylene glycol stearyl ether, polyethylene glycol oleyl ether, and polyethylene glycol behenyl ether); polyethylene glycol polypropylene glycol alkyl ethers (for example, polyethylene glycol polypropylene glycol cetyl ether, and polyethylene glycol polypropylene glycol decyltetradecyl ether); polyethylene glycol alkylphenyl ethers (for example, polyethylene glycol octylphenyl ether and polyethylene glycol nonylphenyl ether); polyethylene glycol fatty acid esters (for example, ethylene glycol monostearate, ethylene glycol distearate, diethylene glycol stearate, polyethylene glycol distearate, polyethylene glycol monolaurate, polyethylene glycol monostearate, and polyethylene glycol monooleate); glyceryl fatty acid esters (for example, glyceryl monomyristate, glyceryl monostearate, glyceryl monoisostearate, glyceryl distearate, glyceryl monooleate, and glyceryl dioleate) and polyethylene. oxide adducts thereof; sorbitan fatty acid esters (for example, sorbitan monopalmitate, sorbitan monostearate, sorbitan tristearate, sorbitan monooleate, and sorbitan trioleate) and polyethylene oxide adducts thereof; sorbitol fatty acid esters (for example, sorbitol monolaurate, sorbitol tetrastearate, sorbitol hexastearate, and sorbitol tetraoleate) and polyethylene oxide adducts; and polyethylene oxide adducts of castor oil.

Examples of the anionic surfactant include fatty acid salts, abietic acid salts, hydroxyalkanesulfonic acid salts, alkanesulfonic acid salts, dialkylsulfosuccinic ester salts, α-olefin sulfonic acid salts, linear alkylbenzenesulfonic acid salts, branched alkylbenzenesulfonic acid salts, alkylnaphthalenesulfonic acid salts, alkylphenoxypolyoxyethylene propylsulfonic acid salts, polyoxyethylene alkylsulfophenyl ester salts, an N-methyl-N-oleyltaurine sodium salt, N-alkylsulfosuccinic acid monoamide disodium salts, petroleum sulfonic acid salts, sulfated tallow oil, sulfuric ester salts of fatty acid alkyl esters, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified products of a styrene/maleic anhydride copolymer, partially saponified products of an olefin/maleic anhydride copolymer, and naphthalene sulfonic acid salt formalin condensates.

Examples of the cationic surfactant include alkylamine salts, quaternary ammonium salts such as tetrabutylammonium bromide, polyoxyethylene alkylamine salts, and polyethylene polyamine derivatives.

Examples of the ampholytic surfactant include carboxybetaines, alkylaminocarboxylic acids, sulfobetaines, aminosulfuric esters, and imidazolines.

The concentration of the surfactant in the developer is preferably from 0.001 to 10% by weight, more preferably from 0.005 to 1% by weight, and most preferably from 0.01 to 0.5% by weight.

For the purpose of further enhancing the development performance, the following additives can be added in the developer.

Examples of the additives include neutral salts (for example, NaCl, KCl, and KBr) as described in JP-A-58-75152; chelating agents (for example, EDTA and NTA) as described in JP-A-58-190952; complexes (for example, [Co(NH$_3$)$_6$]Cl$_3$ and CoCl$_2$.6H$_2$O) as described in JP-A-59-121336; anionic or ampholytic surfactants (for example, sodium alkylnaphthalenesulfonates and n-tetradecyl-N,N-dihydroxyethylbetaine) as described in JP-A-50-51324; nonionic surfactants (for example, tetramethyldecynediol) as described in U.S. Pat. No. 4,374,920; cationic polymers (for example, a methyl chloride quaternary compound of p-dimethylaminomethyl polystyrene) as described in JP-A-55-95946; ampholytic high molecular electrolytes (for example, a copolymer of vinylbenzyl trimethylammonium chloride and sodium acrylate) as described in JP-A-56-142528; reducing inorganic salts (for example, sodium sulfite) as described in JP-A-57-192951; inorganic lithium compounds (for example, lithium chloride) as described in JP-A-58-59444; organometallic surfactants containing, for example, organic Si or Ti, as described in JP-A-59-75255; organoboron compounds as described in JP-A-59-84241; and quaternary ammonium salts (for example, tetraalkylammonium oxides) as described in EP 101010.

Also, as the organic solvent to be contained in the developer, benzyl alcohol is preferable. Also, it is preferred to add polyethylene glycol or a derivative thereof, or polypropylene glycol or a derivative thereof.

Further, if desired, inorganic salt based reducing agents (for example, hydroquinone, resorcin, and a sodium salt or potassium salt of sulfurous acid or hydrogensulfurous acid), organic carboxylic acids, defoaming agents, and water softeners.

The alkaline developer of the invention can be used in development processing of a variety of photosensitive lithographic printing plates.

Accordingly, the invention is applied to a plate making method of a lithographic printing plate including development with the foregoing alkaline developer after exposing the photosensitive lithographic printing plate.

As the photosensitive lithographic printing plate to which the alkaline developer of the invention can be applied, various photosensitive lithographic printing plates comprising a support having thereon an image recording layer such as a photosensitive layer and a heat-sensitive layer can be enumerated. Preferred examples of such photosensitive lithographic printing plates include a conventional positive working type, a conventional negative working type, a photopolymer type, a thermal positive working type, and a thermal negative working type. The term "conventional" refers to a lithographic printing plate precursor of the conventional type in which imagewise exposure is carried out through a transparent positive or a transparent negative.

These various image recording layers will be described below.

<Conventional Positive Working Type>

As a photosensitive resin composition of the conventional positive working type, a composition containing an o-quinonediazide compound and an alkali-soluble high molecular compound is preferable. Examples of the o-quinonediazide compound include an ester of 1,2-naphthoquinone-2-diazido-5-sulfonyl chloride and a phenol/formaldehyde resin or a cresol/formaldehyde resin; and an ester of 1,2-naphtoquinone-2-diazido-5-sulfonyl chloride and a pyrogallol acetone resin as described in U.S. Pat. No. 3,635,709. Examples of the alkali-soluble high molecular compound include a phenouformaldehyde resin, a cresol/formaldehyde resin, a phenol/cresol/formaldehyde co-condensation resin, polyhydroxystyrene, copolymers of N-(4-hydroxyphenyl) methacrylamide, and carboxy group-containing polymers as described in JP-A-7-36184. Also, various alkali-soluble high molecular compounds such as phenolic hydroxyl group-containing acrylic resins as described in JP-A-51-34711, sulfonamide group-containing acrylic resins as described in JP-A-2-866 and urethane based resins can be used. Further, it is preferred to add compounds (for example, sensitivity adjusters, print-out agents, and dyes) as described in paragraphs [0024] to [0027] of JP-A-7-92660 or surfactants for improving the coating properties as described in paragraph [0031] of ibid. in the photosensitive resin composition.

<Conventional Negative Working Type>

As a photosensitive resin composition of the conventional negative working type, ones containing a diazide resin and an alkali-soluble or swelling high molecular compound (binder) are enumerated. Examples of the diazide resin include condensates of an aromatic diazonium salt and an active carbonyl group-containing compound such as formaldehyde. Further, organic solvent-soluble diazide resin inorganic salts which are a reaction product of a condensate of a p-diazophenylamine and formaldehyde with a hexafluorophosphoric acid salt or a tetrafluoroboric acid salt are enumerated. Especially, high molecular weight diazo compounds containing 20% by mole or more of a hexamer or a polymer as described in JP-A-59-78340 are preferable. Preferred examples of the binder include copolymers containing as an essential component acrylic acid, methacrylic acid, crotonic acid, or maleic acid, such as multi-dimensional copolymers of a monomer (for example, 2-hydroxyethyl (meth)acrylate, (meth)acrylonitrile, and (meth)acrylic acid) as described in JP-A-50-118802 and multi-dimensional copolymers comprising an alkyl acrylate, (meth)acrylonitrile and an unsaturated carboxylic acid as described in JP-A-56-4144. Further, it is preferred to add compounds (for example, print-out agents, dyes, plasticizers for imparting flexibility or abrasion resistance to a coating film, and development promoters) as described in paragraphs [0014] to [0015] of JP-A-7-281425 or surfactants for improving the coating properties in the photosensitive resin composition. It is preferable that an interlayer which contains a high molecular compound having an acid group-containing constitutional component and an onium group-containing constitutional component as described in JP-A-2000-105462 is provided as a lower layer of the foregoing conventional positive working type or negative working type photosensitive layer.

<Photopolymer Type>

(Photosensitive Layer)

A photopolymerization type photosensitive composition of the photopolymer type (hereinafter referred to as "photopolymerizable composition") contains an addition polymerizable ethylenically unsaturated bond-containing compound (hereinafter simply referred to as "ethylenically unsaturated bond-containing compound"), a photopolymerization initiator and a high molecular binder as essential components and optionally contains various compounds such as a colorant, a plasticizer, and a heat polymerization inhibitor.

In the case where the photopolymerizable composition is irradiated with active rays, the ethylenically unsaturated bond-containing compound to be contained in the photopolymerizable composition is a compound containing an ethylenically unsaturated bond which can undergo addition polymerization by the action of the photopolymerization initiator to cause crosslinking and curing. The ethylenically unsaturated bond-containing compound can be arbitrarily chosen among compounds having at least one, and preferably two or more terminal ethylenically unsaturated bonds and has a chemical morphology, for example, monomers, prepolymers (namely, dimers, trimers and oligomers), mixtures thereof, and copolymers thereof. Examples of the monomer include esters of an unsaturated carboxylic acid (for example, acrylic acid, methacrylic acid, itaconic acid, crotonic acid, isocrotonic acid, and maleic acid) and an aliphatic polyhydric alcohol compound and amides of an unsaturated carboxylic acid and an aliphatic polyhydric amine compound. Also, urethane based addition polymerizable compounds are preferable.

The initiator to be contained in the photopolymerizable composition can be properly chosen and used among various photopolymerization initiators and combination systems of two or more kinds of photopolymerization initiators (photopolymerization system) depending upon the wavelength of a light source to be used. For example, initiation systems described in paragraphs [0021] to [0023] of JP-A-2001-22079 are preferable. Since the high molecular binder to be contained in the photopolymerizable composition is required to not only function as a film forming agent of the photopolymerizable composition but also make the photosensitive layer dissolve in the alkaline developer, an organic high molecular polymer which is soluble or swelling in alkaline water. Compounds described in paragraphs [0036] to [0063] of ibid. are useful as the foregoing high molecular compound. Besides, it is also preferred to add additives (for example, surfactants for improving the coating properties) as described in paragraphs [0079] to [0088] of ibid in the photopolymerizable resin composition.

Also, it is preferred to provide an oxygen shielding protective layer on the foregoing photosensitive layer for the purpose of preventing the polymerization inhibition action of oxygen. Examples of a polymer to be contained in the oxygen shielding protective layer include polyvinyl alcohol and copolymers thereof. Further, it is also preferable that an interlayer or an adhesive layer described in paragraphs [0124] to [0165] of JP-A-2001-228608 is provided as a lower layer of the photopolymer type photosensitive layer.

<Thermal Positive Working Type>

(Heat-Sensitive Layer)

The heat-sensitive layer of the thermal positive working type contains an alkali-soluble high molecular compound and a light-heat converting substance. The alkali-soluble high molecular compound includes homopolymers containing an acid group in the polymer, copolymers thereof, and mixtures thereof. Of these, ones containing an acid group such as (1) a phenolic hydroxyl group (—Ar—OH) and (2) a sulfonamide group (—SO$_2$NH—R) are preferable from the standpoint of solubility in the alkaline developer. Of these, ones containing a phenolic hydroxyl group are especially preferable because they are excellent in the image forming properties upon exposure with infrared laser, etc. Preferred examples thereof include novolak resins such as a phenol/formaldehyde resin, an m-cresol/formaldehyde resin, a p-cresol/formaldehyde resin, an m-/p-mixed cresol/formaldehyde resin, and a phenol/cresol (any of m-, p-, or m-/p-mixed cresol) mixed formaldehyde resin; and a pyrogallol/acetone resin. In more detail, high molecular compounds described in paragraphs [0023] to [0042] of JP-A-2001-305722 are preferably used. The light-heat converting substance makes it possible to convert exposure energy to heat, thereby effectively achieving release of the mutual action of the exposed area region of the photosensitive layer. Pigments or dyes having a light absorbing region in the infrared region having a wavelength of from 700 to 1,200 nm are preferable from the viewpoint of recording sensitivity. Specific examples of the dye which can be used include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium coloring matters, pyrylium salts, and metal thiolate complexes (for example, a nickel thiolate complex). Of these, cyanine dyes are preferable, and cyanine dyes represented by the general formula (I) of JP-A-2001-305722 can be enumerated. It is preferred to add the same compounds such as sensitivity adjusters, print-out agents, and dyes, or surfactants for improving the coating properties as in the foregoing conventional positive working type. In detail, compounds described in paragraphs [0053] to [0059] of JP-A-2001-305722 are preferable.

The heat-sensitive layer of the thermal positive working type may be a single layer or may be provided as a double-layered structure as described in JP-A-11-218914.

It is preferable that an undercoat layer is provided between the photosensitive layer of the thermal positive type and a support. As a component to be contained in the undercoat layer, various organic compounds described in paragraph [0068] of JP-A-2001-305722 are enumerated.

<Thermal Negative Working Type>

(Heat-Sensitive Layer)

The heat-sensitive layer of the thermal negative working type is a heat-sensitive layer of the negative working type in which an infrared laser irradiated area is cured to form an image area. As one of such heat-sensitive layers of the thermal negative working type, a polymerization type layer is preferably enumerated. The polymerization layer contains (A) an infrared absorber, (B) a radical generating agent (radical polymerization initiator), (C) a radical polymerizable compound which is cured by causing polymerization reaction with a generated radical, and (D) a binder polymer.

In the polymerization layer, the infrared absorber converts absorbed infrared light into heat, and the radical polymerization initiator such as onium salts is decomposed by the generated heat, thereby generating a radical. The radical polymerizable compound is chosen among terminal ethylenically unsaturated bond-containing compounds and causes polymerization reaction in a chain manner by a generated radical, whereby it is cured.-Examples of the infrared absorber (A) include the foregoing light-heat converting substances to be contained in the heat-sensitive layer of the thermal positive working type. Especially, those described as specific examples of cyanine coloring matters described in paragraphs [0017] to [0019] of JP-A-2001-133969 can be enumerated. Examples of the radical generator (B) include onium salts. As specific examples of the onium salt which can be preferably used, those described in paragraphs [0030] to [0033] of JP-A-2001-133969 can be enumerated. The radical polymerizable compound (C) is chosen among compounds containing at least one, and preferably two or more terminal ethylenically unsaturated bonds. As the binder polymer (D), linear organic polymers are preferably used, and the binder polymer (D) is chosen among linear organic polymers which are soluble or swelling in water or weakly alkaline water. Of these, (meth)acrylic resins containing a benzyl group or an allyl group and a carboxy group in the side chain thereof are especially preferable because they are excellent in a balance among film strength, sensitivity and developability. With respect to the radical polymerizable compound (C) and the binder polymer (D), those described in detail in paragraphs [0036] to [0060] of ibid. can be used. As other additives, it is also preferred to add additives (for example, surfactants for improving the coating properties) as described in paragraphs [0061] to [0068] of ibid.

Also, besides the polymerization type, an acid crosslinking type layer is preferably enumerated as one of the heat-sensitive layer of the thermal negative working type. The acid crosslinking layer contains (E) a compound which generates an acid by light or heat (hereinafter referred to as "acid generator") and (F) a compound which is crosslinked with the generated acid (hereinafter referred to as "crosslinking agent") and further contains (G) an alkali-soluble high molecular compound capable of reacting with the crosslinking agent in the presence of an acid. For the sake of effectively using energy of infrared laser, the infrared absorber (A) is compounded in the acid crosslinking layer. Examples of the acid generator (E) include compounds capable of generating an acid upon heat decomposition, such as photoinitiators of photopolymerization, light discoloring agents such as coloring matters, and acid generators which are used in macro-resists, etc. Examples of the crosslinking agent (F) include (i) an aromatic compound substituted with a hydroxymethyl group or an alkoxymethyl group, (ii) a compound containing an N-hydroxymethyl group, an N-alkoxymethyl group, or an N-acyloxymethyl group, and (iii) an epoxy compound. Examples of the alkali-soluble high molecular compound (G) include novolak resins and polymers containing a hydroxyaryl group in the side chain thereof.

<Backcoat Layer>

In piling photosensitive lithographic printing plates obtained by providing a variety of image recording layers, in order to prevent damaging of the image recording layer, it is possible to provide a coating layer made of an organic high molecular compound (hereinafter referred to as "backcoat layer") on the rear surface of the photosensitive lithographic printing plate as the need arises.

<Exposure>

The photosensitive lithographic plating plate is subjected to image exposure by a variety of processing methods corresponding to the image recording layer. Examples of a light source of active rays to be used for the image exposure include a mercury vapor lamp, a metal halide lamp, a xenon lamp, and a chemical lamp. Examples of laser beams include helium-neon laser (He-Ne laser), argon laser, krypton laser, helium-cadmium laser, KrF excimer laser, semiconductor laser, YAG laser, and YAG-SHG laser.

The alkaline developer of the invention is especially preferable for plate making from an infrared photosensitive lithographic printing plate. Accordingly, the plate making method of lithographic printing plate including exposing an infrared photosensitive lithographic printing plate comprising a support having thereon a photosensitive layer (hereinafter often called "heat-sensitive layer"), the photosensitive layer containing an infrared absorbing dye and an alkali-soluble resin, and subjecting it to development processing with an alkaline developer as described previously in detail is touched on herein.

The infrared photosensitive lithographic printing plate will be described below in detail. First of all, components of the heat-sensitive layer which becomes the image recording layer thereof will be described below.

[Infrared Absorbing Dye]

The infrared absorbing dye to be used in the heat-sensitive layer is not particularly limited so far as it is a dye which absorbs infrared light to generate heat, and a variety of dyes which are known as an infrared absorbing dye can be used.

As the infrared absorbing dye, commercially available dyes and known infrared absorbing dyes described in publications (for example, *Dye Handbook*, compiled by The Society of Synthetic Organic Chemistry, Japan and published in 1970) can be utilized. Specific examples thereof include dyes such as azo dyes, metal complex salt azo dyes, pyrazolone azo dyes, quinoneimine dyes, methine dyes, and cyanine dyes. In the invention, of these dyes, dyes which absorb infrared light or near infrared light are especially preferable from the standpoint of the matter that they are preferable for utilization with laser which emits infrared light or near infrared light.

Examples of the dye which absorbs infrared light or near infrared light include cyanine dyes described in JP-A-58-125246, JP-A-59-84356, JP-A-59-202829, JP-A-60-78787, and the like; methine dyes described in JP-A-58-173696, JP-A-58-181690, JP-A-58-194595, and the like; naphthoquinone dyes described in JP-A-58-112793, JP-A-58-224793, JP-A-59-48187, JP-A-59-73996, JP-A-60-59240, JP-A-60-63744, and the like; squalirium coloring matters described in JP-A-58-112792 and the like; and cyanine dyes described in British Patent No. 434,875 and the like.

Also, near infrared absorbing sensitizers described in U.S. Pat. No. 5,156,938 are preferably used as the dye. Also, substituted aryl benzo(thio)pyrylium salts described in U.S. Pat. No. 3,881,924, trimethine thiapyrylium salts described in JP-A-57-142645 (counterpart to U.S. Pat. No. 4,327,169), pyrylium based compounds described in JP-A-58-181051, JP-A-58-220143, JP-A-5941363, JP-A-59-84248, JP-A-59-84249, JP-A-59-146063, and JP-A-59-146061, cyanine dyes described in JP-A-59-216146, pentamethine thiopyrylium salts described in U.S. Pat. No. 4,283,475, pyrylium compounds described in JP-B-5-13514 and JP-B-5-19702, and the like; and commercially available dyes including Epolight III-178, Epolight III-130, and Epolight III-125, all of which are manufactured by Epolin, Inc. are especially preferable.

Infrared absorbing dyes expressed by the formulae (I) and (II) in U.S. Pat. No. 4,756,993 are especially preferable as the infrared absorbing dye to be used in the heat-sensitive layer. These coloring matters exhibit a very strong mutual action with an alkali-soluble resin and are excellent in the alkali-resistant developability in an unexposed area of the heat-sensitive layer.

The addition amount of the infrared absorbing dye of the heat-sensitive layer is suitably from 3 to 50% by weight, preferably from 5 to 40% by weight, and more preferably from 8 to 35% by weight based on the weight of the heat-sensitive layer from the viewpoints of sensitivity and durability of the layer.

Specific examples of the infrared absorbing dye will be given below, but it should not be construed that the invention is limited thereto.

Cyanine Dye A

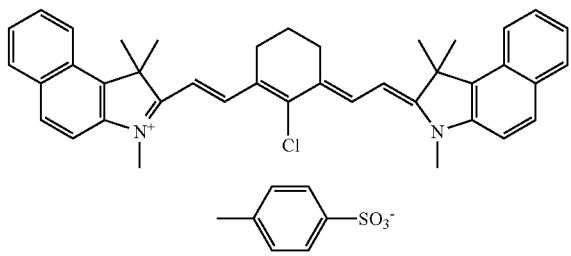

Cyanine Dye B

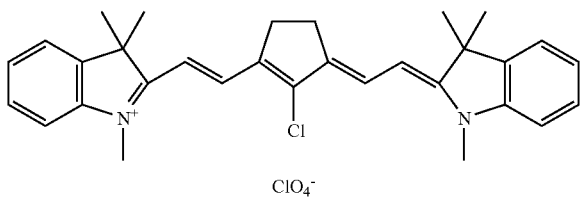

Cyanine Dye C

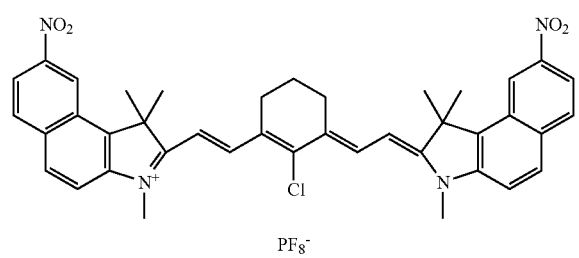

Cyanine Dye D

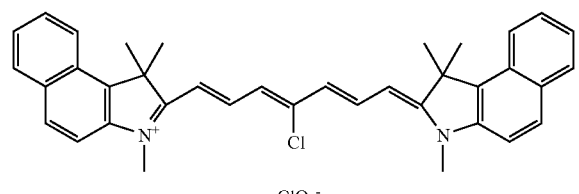

Cyanine Dye E

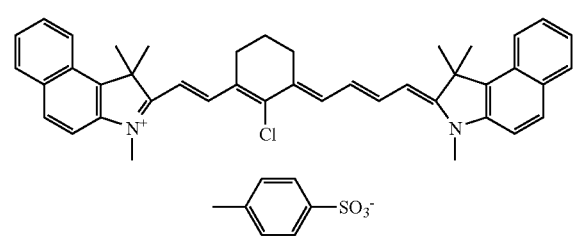

[Alkali-Soluble Resin]

The alkali-soluble resin to be used in the heat-sensitive layer includes water-insoluble and alkali-soluble resins (hereinafter often referred to as "alkali-soluble high molecular compounds"), homopolymers containing an acid group in the principal chain and/or side chain in the polymer, copolymers thereof, and mixtures thereof. Accordingly, the heat-sensitive layer of the photosensitive lithographic printing plate has such a characteristic that when it comes into contact with the alkaline developer, it is dissolved therein.

As the alkali-soluble high molecular compound to be used in the heat-sensitive layer, ones which are conventionally known can be used without particular limitations, and high molecular compounds containing any one functional group of (1) a phenolic hydroxyl group, (2) a sulfonamide group, or (3) an active imido group. Examples thereof will be given below, but it should not be construed that the invention is limited thereto.

(1) Examples of the high molecular compound containing a phenolic hydroxyl group include novolak resins such as a phenol/formaldehyde resin, an m-cresol/formaldehyde resin, a p-cresol/formaldehyde resin, an m-/p-mixed cresol/formaldehyde resin, and a phenol/cresol (any of m-, p-, or m-/p-mixed cresol) mixed formaldehyde resin; and a pyrogallol/ acetone resin. Besides, high molecular compounds containing a phenolic hydroxyl group in the side chain thereof are preferably used as the phenolic hydroxyl group-containing high molecular compound. Examples of the high molecular compound containing a phenolic hydroxyl group in the side chain thereof include high molecular compounds obtained by homopolymerizing a polymerizable monomer comprising a low molecular compound containing at least one of each of a phenolic hydroxyl group and a polymerizable unsaturated bond or copolymerizing such a polymerizable monomer with other polymerizable monomer.

Examples of the phenolic hydroxyl group-containing polymerizable monomer include acrylamides, methacrylamides, acrylic esters, methacrylic esters, and hydroxystyrenes, each containing a phenolic hydroxyl group. Specific examples thereof include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate. The phenolic hydroxyl group-containing resin may be used in combinations of two or more kinds thereof. Further, as described in U.S. Pat. No. 4,123,279, a copolymer of phenol containing an alkyl group having from 3 to 8 carbon atoms as a substituent and formaldehyde, such as a t-butylphenol/formaldehyde resin and an octylphenol/formaldehyde resin, may be used jointly.

(2) Examples of the alkali-soluble high molecular compound containing a sulfonamide group include high molecular compounds obtained by homopolymerizing a sulfonamide group-containing polymerizable monomer or copolymerizing such a polymerizable monomer with other polymerizable monomer. Examples of the sulfonamide group-containing polymerizable monomer include polymerizable monomers comprising a low molecular compound containing at least one of each of a sulfonamide group —NH—SO$_2$ in which at least one hydrogen atom is bonded on the nitrogen atom in one molecule thereof and a polymerizable unsaturated bond. Of these, low molecular compounds containing an acryloyl group, an allyl group or a vinyl group and a substituted or mono-substituted aminosulfonyl group or a substituted sulfonylimino group are preferable.

(3) As the alkali-soluble high molecular compound containing an active imido group, ones containing an active imido group in the molecule thereof are preferable. Examples of such a high molecular compound include high molecular compounds obtained by homopolymerizing a polymerizable monomer comprising a low molecular compound containing at least one of each of an active imido group and a polymerizable unsaturated bond in one molecule thereof or copolymerizing the polymerizable monomer with other polymerizable monomer.

Specifically, N-(p-toluenesulfonyl)methacrylamide and N-(p-toluenesulfonyl)acrylate can be preferably used as such a compound.

Further, high molecular compounds obtained by polymerizing two or more kinds of the foregoing phenolic hydroxyl group-containing polymerizable monomer, sulfonamide group-containing polymerizable monomer and active imido group-containing polymerizable monomer or high molecular compounds obtained by copolymerizing two or more kinds of these polymerizable monomers with other polymerizable monomer are preferably used as the alkali-soluble high molecular compound. In the case where the phenolic hydroxyl group-containing polymerizable monomer is copolymerized with the sulfonamide group-containing polymerizable monomer and/or the active imido group-containing polymerizable monomer, the compounding polymerization ratio (weight ratio) of these components preferably falls within the range of from 50/50 to 5/95, and especially preferably from 40/60 to 10/90.

In the case where the alkali-soluble high molecular compound is a copolymer of the foregoing phenolic hydroxyl group-containing polymerizable monomer, sulfonamide group-containing polymerizable monomer or active imido group-containing polymerizable monomer with other polymerizable monomer, the monomer which imparts alkali solubility is preferably contained in an amount of 10% by mole or more, and more preferably 20% by mole. When the amount of the copolymerization component is less than 10% by mole, the alkali solubility is liable to become insufficient, and an effect for enhancing the development latitude may not be sufficiently achieved.

As the monomer component to be copolymerized with the foregoing phenolic hydroxyl group-containing polymerizable monomer, sulfonamide group-containing polymerizable monomer or active imido group-containing polymerizable monomer, compounds listed in the following (m1) to (m12) can be enumerated. However, it should not be construed that the invention is limited thereto.

(m1) Acrylic esters or methacrylic esters containing an aliphatic hydroxyl group, such as 2-hydroxyethyl acrylate and 2-hydroxyethyl methacrylate.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butyrate, and vinyl benzoate.

(m7) Styrenes such as styrene, α-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-Vinylpyrrolidone, acrylonitrile, methacrylonitrile, etc.

(m11) Unsaturated imides such as maleimide, N-acryloylacrylamide, N-acetylmethacrylamide, N-propionylmethacrylamide, and N-(p-chlorobenzoyl)methacrylamide.

(m12) Unsaturated carboxylic acids such as acrylic acid, methacrylic acid, maleic anhydride, and itaconic acid.

Ones containing a phenolic hydroxyl group are preferable as the alkali-soluble high molecular compound from the standpoint of the matter that it is excellent in the image forming properties by exposure with infrared laser, etc. Preferred examples thereof include novolak resins such as a phenol/formaldehyde resin, an m-cresol/formaldehyde resin, a p-cresol/formaldehyde resin, an m-/p-mixed cresol/formaldehyde resin, and a phenol/cresol (any of m-, p-, or m-/p-mixed cresol) mixed formaldehyde resin; and a pyrogallol/acetone resin.

Also, examples of the alkali-soluble high molecular compound containing a phenolic hydroxyl group include polycondensates of a phenol containing an alkyl group having from 3 to 8 carbon atoms as a substituent and formaldehyde, such as a t-butylphenol/formaldehyde resin and an octylphenol/formaldehyde resin, as described in U.S. Pat. No. 4,123,279.

As the method of copolymerizing the alkali-soluble high molecular compound, a graft copolymerization method, a block copolymerization method, and a random copolymerization method, all of which are conventionally known, can be employed.

In the invention, in the case where the alkali-soluble high molecular compound is a homopolymer or copolymer of the foregoing phenolic hydroxyl group-containing polymerizable monomer, sulfonamide group-containing polymerizable monomer or active imido group-containing polymerizable monomer, ones having a weight average molecular weight of 2,000 or more and a number average molecular weight of 500 or more are preferable; and ones having a weight average molecular weight of from 5,000 to 300,000, a number average molecular weight of from 800 to 250,000, and a degree of dispersion (weight average molecular weight/number average molecular weight) of from 1.1 to 10 are more preferable.

Also, in the invention, in the case where the alkali-soluble high molecular compound is a resin such as a phenol/formaldehyde resin and a cresol/formaldehyde resin, ones having a weight average molecular weight of from 500 to 20,000 and a number average molecular weight of from 200 to 10,000 are preferable.

These alkali-soluble high molecular compounds may be used singly or in combinations of two or more kinds thereof. The alkali-soluble high molecular compound is used in the addition amount of from 30 to 99% by weight, preferably from 40 to 95% by weight, and especially preferably from 50 to 90% by weight in the whole of solids in the foregoing heat-sensitive layer from the standpoint of both the sensitivity and the durability of the heat-sensitive layer.

Also, the heat-sensitive layer may contain an alkali-soluble high molecular compound containing a carboxyl group (hereinafter often referred to as "component (B1)").

Any alkali-soluble high molecular compounds containing a carboxyl group may be used as the high molecular compound as the component (B1), but high molecular compounds (b-1) and (b1-2) as defined below are preferable.

(b1-1) Alkali-soluble high molecular compound containing a polymerizable monomer unit represented by the following general formula (i) (hereinafter often referred to as "high molecular compound (b1-1)"):

In the formula, Xm represents a single bond or a divalent connecting group; Y represents hydrogen or a carboxyl group; and Z represents hydrogen, an alkyl group, or a carboxyl group.

Examples of a monomer constituting the polymerizable monomer unit represented by the general formula (i) include polymerizable monomers containing at least one of each of a carboxyl group and a polymerizable unsaturated group in the molecule thereof.

Specific examples of such a polymerizable monomer include α,β-unsaturated carboxylic acids such as acrylic acid, methacrylic acid, maleic acid, maleic anhydride, itaconic acid, and itaconic anhydride.

As a monomer to be copolymerized with the foregoing carboxyl group-containing polymerizable monomer, ones listed in the following (1) to (11) are enumerated, but it should not be construed that the invention is limited thereto.

(1) Aliphatic hydroxyl group-containing acrylic esters or methacrylic esters such as 2-hydroxyethyl acrylate and 2-hydroxyethyl methacrylate.

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, and chloromethylstyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-Vinylpyrrolidone, N-vinylcarbazole, 4-vinylpyridine, acrylonitrile, methacrylonitrile, etc.

(11) Unsaturated imides such as maleimide, N-acryloylacrylamide, N-acetylmethacrylamide, N-propionylmethacrylamide, and N-(p-chlorobenzoyl)methacrylamide.

Also, a monomer represented by the following general formula (ii) is preferably used.

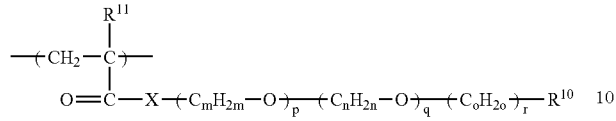

In the formula, X represents O, S, or N—$R^{12}$; $R^{10}$ to $R^{12}$ each independently represents a hydrogen atom or an alkyl group; m, n, and o each independently represents an integer of from 2 to 5; $C_mH_{2m}$, $C_nH_{2n}$, and $C_oH_{2o}$ may be each of a linear or branched structure; p, q, and r each independently represents an integer of from 0 to 3,000; and (p+q+r)≧2.

The alkyl group represented by $R^{10}$ to $R^{12}$ is preferably one having from 1 to 12 carbon atoms, and specific examples thereof include a methyl group, an ethyl group, an n-propyl group, and an isopropyl group. p, q, and r each preferably represents an integer of from 0 to 500, and more preferably an integer of from 0 to 100.

Examples of monomers corresponding to the repeating unit represented by the foregoing general formula (ii) will be given below, but it should not be construed that the invention is limited thereto.

(1)

$$CH_2=C(CH_3)-C(=O)-O-(CH_2CH_2O)_4-H$$

(2)

$$CH_2=C(CH_3)-C(=O)-O-(CH_2CH_2O)_8-H$$

(3)

$$CH_2=C(CH_3)-C(=O)-O-(CH_2CH_2O)_m-H$$

(4)

$$CH_2=CH-C(=O)-O-(CH_2CH_2O)_4-H$$

(Average molecular weight of alkylene oxide: 1,000)

(5)

$$CH_2=C(CH_3)-C(=O)-O-(C_3H_6O)_m-H$$

(6)

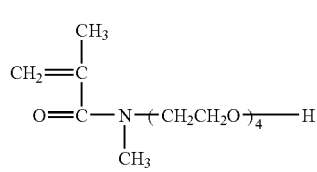

(Average molecular weight of alkylene oxide: 1,000)

(7)

$$CH_2=C(CH_3)-C(=O)-O-(CH_2CH_2O)_4-(C_3H_6O)_8-(CH_2CH_2O)_4-H$$

(8)

$$CH_2=C(CH_3)-C(=O)-O-(C_3H_6O)_2-(CH_2CH_2O)_{10}-(C_3H_6O)_3-H$$

(9)

$$CH_2=C(CH_3)-C(=O)-O-(CH_2CH_2O)_6-H$$

(10)

$$CH_2=C(CH_3)-C(=O)-O-(CH_2CH_2O)_m-H$$

(Average molecular weight of alkylene oxide: 500)

(11)

$$CH_2=C(CH_3)-C(=O)-O-(CH_2CH_2O)_m-H$$

(Average molecular weight of alkylene oxide: 2,000)

(12)

$$CH_2=CH-C(=O)-O-(CH_2CH_2O)_6-H$$

(13)

$$CH_2=CH-C(=O)-O-(C_3H_5O)_m-H$$

(Average molecular weight of alkylene oxide: 1,500)

(14)

$$CH_2=C(CH_3)-C(=O)-S-(CH_2CH_2O)_4-H$$

The repeating unit represented by the foregoing general formula (ii) can be produced by reacting a commercially available hydroxypoly(oxyalkylene) material (for example, trade names including Pluronic (manufactured by Asahi Denka Co., Ltd.), Adeka Polyether (manufactured by Asahi Denka Co., Ltd.), Carbowax (manufactured by Glycol Products Co.), Toriton (manufactured by Rohm and Haas Co.), and P.E.G (manufactured by Daiichi Kogyo Seiyaku Co., Ltd.) with acrylic acid, methacrylic acid, acryl chloride, methacryl chloride, acrylic anhydride, etc. by a known method.

Separately, poly(oxyalkylene) diacrylates produced by known methods can also be used.

Examples of commercially available monomers include hydroxyl group-terminated polyalkylene glycol mono(meth) acrylates (for example, Blemmer PE-90, Blemmer PE-200, Blemmer PE-350, Blemmer AE-90, Blemmer AE-200, Blemmer AE-400, Blemmer PP-1000, Blemmer PP-500, Blemmer PP-800, Blemmer AP-150, Blemmer AP-400, Blemmer AP-550, Blemmer AP-800, Blemmer 50PEP-300, Blemmer 70PEP-350B, Blemmer AEP Series, Blemmer 55PET-400, Blemmer 30PET-800, Blemmer 55PET-800, Blemmer AET Series, Blemmer 30PPT-800, Blemmer 50PPT-800, Blemmer 70PPT-800, Blemmer APT Series, Blemmer 10PPB-500B, and Blemmer 10APB-500B, all of which are manufactured by NOF Corporation); alkyl-terminated polyalkylene glycol mono(meth)acrylates (for example, Blemmer PME-100, Blemmer PME-200, Blemmer PME-400, Blemmer PME-1000, Blemmer PME-4000, Blemmer AME-400, Blemmer 50POEP-800B, Blemmer 50AOEP-800B, Blemmer PLE-200, Blemmer ALE-200, Blemmer ALE-800, Blemmer PSE-400, Blemmer PSE-1300, Blemmer ASEP Series, Blemmer PKEP Series, Blemmer AKEP Series, Blemmer ANE-300, Blemmer ANE-1300, Blemmer PNEP Series, Blemmer PNPE Series, Blemmer 43ANEP-500, and Blemmer 70ANEP-550, all of which are manufactured by NOF Corporation); and Light-Ester MC, Light-Ester 130MA, Light-Ester 041MA, Light-Acrylate BO-A, Light-Acrylate EC-A, Light-Acrylate MTG-A, Light-Acrylate 130A, Light-Acrylate DPM-A, Light-Acrylate P-200A, Light-Acrylate NP-4EA, and Light-Acrylate NP-8EA, all of which are manufactured by Kyoeisha Chemical Co., Ltd.

In the high molecular compound (b1-1), the minimum constitutional unit containing at least one of each of a carboxyl group and a polymerizable unsaturated group in the molecule thereof is not necessarily limited to one kind, but ones obtaining by copolymerizing two or more kinds of minimum constitutional units containing the same acid group or two or more kinds of minimum constitutional units containing a different acid group from each other can be used.

As the copolymerization method, a graft copolymerization method, a block copolymerization method, and a random copolymerization method, all of which are conventionally known, can be employed.

(b1-2) Alkali-soluble high molecular compound containing a carboxyl group and comprising as a basic skeleton a reaction product of a carboxyl group-containing diol compound represented by the following general formula (iii), (iv) or (v) and a diisocyanate compound represented by the following general formula (viii) (hereinafter often referred to as "high molecular compound (b1-2)):

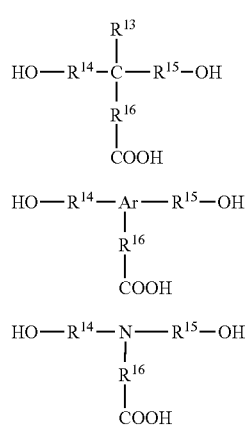

In the formula, $R^{13}$ represents a hydrogen atom or an alkyl, alkenyl, aralkyl, aryl, alkoxy or aryloxy group which may have a substituent (for example, alkyl, aryl, alkoxy, ester, urethane, amide, ureido and halogeno groups are preferable); and preferably a hydrogen atom, an alkyl group having from 1 to 8 carbon atoms, an alkenyl group having from 2 to 8 carbon atoms, or an aryl group having from 6 to 15 carbon atoms.

$R^{14}$, $R^{15}$, and $R^{16}$ may be the same or different and each represents a single bond or a divalent aliphatic or aromatic hydrocarbon which may have a substituent (for example, alkyl, alkenyl, aralkyl, aryl, alkoxy and halogeno groups are preferable); preferably an alkylene group having from 1 to 20 carbon atoms or an arylene group having from 6 to 15 carbon atoms; and more preferably an alkylene group having from 1 to 8 carbon atoms.

Also, if desired, $R^{14}$, $R^{15}$, and $R^{16}$ may each contain other functional group which is not reactive with an isocyanate group, such as an ester group, a urethane group, an amide group, an ureido group, and a carbon-carbon unsaturated bond. Incidentally, two or three of $R^{13}$;, $R^{14}$, $R^{15}$, and $R^{16}$ may be taken together to form a ring.

Ar represents an optionally substituted trivalent aromatic hydrocarbon group, and preferably an aromatic group having from 6 to 15 carbon atoms.

$$OCN-R^{18}-NC0 \quad (viii)$$

In the formula, $R^{18}$ represents a divalent aliphatic or aromatic hydrocarbon which may have a substituent (for example, alkyl, alkenyl, aralkyl, aryl, alkoxy and halogeno groups are preferable). If desired, $R^{18}$ may contain other functional group which is not reactive with an isocyanate group, such as an ester group, a urethane group, an amide group, an ureido group, and a carbon-carbon unsaturated bond.

Specific examples of the carboxyl group-containing diol compound represented by the general formula (iii), (iv) or (v) include those described below.

That is, examples include 3,5-dihydroxybenzoic acid, 2,2-bis(hydroxymethyl)propionic acid, 2,2-bis(2-hydroxyethyl) propionic acid, 2,2-bis(3-hydroxypropyl)propionic acid, bis (hydroxymethyl)acetic acid, bis(4-hydroxyphenyl)acetic acid, 4,4-bis(4-hydroxyphenyl)pentanoic acid, tartaric acid, and N,N-bis(2-hydroxyethyl)-3-carboxypropionamide.

The carboxyl group-containing alkali-soluble high molecular compound (b1-2) is preferably a reaction product comprising a combination of diols represented by the following general formula (vi) or (vii).

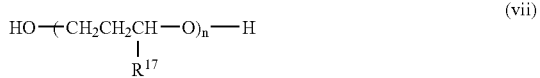

In the formulae, $R^{17}$s each represents a hydrogen atom or an alkyl group having from 1 to 8 carbon atoms; and n represents an integer of 2 or more. Examples of the alkyl group having from 1 to 8 carbon atoms represented by $R^{17}$ include a methyl group, an ethyl group, an isopropyl group, an n-butyl group, and an isobutyl group.

Specific examples of the diol represented by the foregoing general formula (vi) or (vii) will be given below, but it should not be construed that the invention is limited thereto.

Specific Examples of (vi)
HO—(—CH$_2$CH$_2$O—)$_3$—H
HO—(—CH$_2$CH$_2$O—)$_4$—H
HO—(—CH$_2$CH$_2$O—)$_5$—H
HO—(—CH$_2$CH$_2$O—)$_6$—H
HO—(—CH$_2$CH$_2$O—)$_7$—H
HO—(—CH$_2$CH$_2$O—)$_8$—H
HO—(—CH$_2$CH$_2$O—)$_{10}$—H
HO—(—CH$_2$CH$_2$O—)$_{12}$—H
Polyethylene glycol (average molecular weight: 1,000)
Polyethylene glycol (average molecular weight: 2,000)
Polyethylene glycol (average molecular weight: 4,000)
HO—(—CH$_2$CH(CH$_3$O)—)$_3$—H
HO—(—CH$_2$CH(CH$_3$O)—)$_4$—H
HO—(—CH$_2$CH(CH$_3$O)—)$_6$—H
Polypropylene glycol (average molecular weight: 1,000)
Polypropylene glycol (average molecular weight: 2,000)
Polypropylene glycol (average molecular weight: 4,000)
Specific Examples of (vii)
HO—(—CH$_2$CH$_2$CH$_2$O—)$_3$—H
HO—(—CH$_2$CH$_2$CH$_2$O—)$_4$—H
HO—(—CH$_2$CH$_2$CH$_2$O—)$_8$—H
HO—(—CH$_2$CH$_2$CH(CH$_3$)O—)$_{12}$—H Specific examples of the diisocyanate compound represented by the general formula (viii) include those described below.

That is, examples include aromatic diisocyanate compounds (for example, 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthalene diisocyanate, and 3,3'-dimethylbiphenyl-4,4'-diisocyanate); aliphatic diisocyanate compounds (for example, hexamethylene diisocyanate, trimethylhexamethylene diisocyanate, lysine diisocyanate, and dimeric acid diisocyanate); and diisocyanate compounds as reaction products of a diol and a diisocyanate (for example, an adduct of one mole of 1,3-butylene glycol and two moles of tolylene diisocyanate).

The molar ratio of the diisocyanate to the diol compound, which are used in the synthesis of the high molecular compound (b1-2), is preferably from 0.8/1 to 1.2/1. In the case where an isocyanate group remains in the polymer terminal end, by treating with an alcohol or an amine, it is possible to synthesize the high molecular compound (b1-2) in the state where the isocyanate group does not ultimately remain.

The foregoing high molecular compounds (b1-1) and (b1-2) may be used singly or in combinations of two or more kinds thereof as the component (B1).

The content of the repeating unit containing the carboxyl group to be contained in the component (B1) is in the range of 2 % by mole or more, preferably from 2 to 70 % by moles, and more preferably from 5 to 60 % by mole based on the total amount of the respective monomers of the component (B1).

The weight average molecular weight of the component (B1) is preferably from 3,000 to 300,000, and more preferably from 6,000 to 100,000.

Further, the addition amount of the component (B1) is in the range of from 0.005 to 80 % by weight, preferably from 0.01 to 50 % by weight, and more preferably from 1 to 20 % by weight based on the weight of the whole of solids of the heat-sensitive layer.

[Additives]

In forming the foregoing heat-sensitive layer, in addition to the foregoing components, various additives can be added as the need arises so far as the effects of the invention are not hindered.

—Dissolution Inhibiting Compound—

In the photosensitive lithographic printing plate, for the purpose of enhancing that inhibition (dissolution inhibition), it is possible to contain a variety of inhibitors in the heat-sensitive layer.

The inhibitor is not particularly limited, and examples thereof include quaternary ammonium salts and polyethylene glycol based compounds.

The quaternary ammonium salt is not particularly limited, and examples thereof include tetraalkylammonium salts, trialkylarylammonium salts, dialkyldiarylammonium salts, alkyltriarylammonium salts, tetraarylammonium salts, cyclic ammonium salts, and dicyclic ammonium salts.

Specific examples include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyltrimethylammonium bromide, and N-methylpyridinium bromide. Of these, quaternary ammonium salts described in Japanese Patent Application Nos. 2001-226297, 2001-370059 and 2001-398047.

The addition amount of the quaternary ammonium salt is preferably from 1 to 50% by weight, and more preferably from 1 to 30% by weight based on the amount of the whole of solids of the image recording layer from the standpoint of the matter that not only a sufficient dissolution inhibiting effect is revealed, but also the film forming properties of the binder are not adversely affected.

The polyethylene glycol based compound is not particularly limited, but the following structure is enumerated.

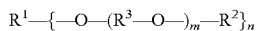

$$R^1\!-\!\{\!-\!O\!-\!(R^3\!-\!O\!-\!)_m\!-\!R^2\}_n$$

In the formula, $R^1$ represents a polyhydric alcohol residue or a polyhydric phenol residue; $R^2$ represents a hydrogen atom or an optionally substituted alkyl group, alkenyl group, alkynyl group, alkyloyl group, aryl group or aryloyl group having from 1 to 25 carbon atoms; $R^3$ represents an optionally substituted alkylene group; m is 10 or more in average; and n represents an integer of from 1 to 4.

Examples of the polyethylene based compound having the foregoing structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene sorbitol esters, polypropylene glycol sorbitol esters, polyethylene glycol fatty acid esters, polypropylene glycol fatty acid esters, polyethylene glycolated ethylenediamines, polypropylene glycolated ethylenediamines, polyethylene glycolated diethylenetriamines, and polypropylene glycolated diethylenetriamines.

Specific examples thereof include polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonylic ester, polyethylene glycol cetylic ester, polyethylene glycol stearoyl ester, polyethylene glycol distearoyl ester, polyethylene glycol behenic ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauric ester, polypropylene glycol dilauric ester, polypropylene glycol nonylic ester, polyethylene glycol glycerin ether, polypropylene glycol glycerin ester, polyethylene glycol sorbitol ether, polypropylene glycol sorbitol ether, polyethylene glycolated ethylenediamine, polypropylene glycolated ethylenediamine, polyethylene glycolated diethylenetriamine, polypropylene glycolated diethylenetriamine, and polyethylene glycolated pentamethylenehexamine.

The addition amount of the polyethylene glycol based compound is preferably from 0.1 to 50% by weight, and more preferably from 1 to 30% by weight based on the amount of the whole of solids of the image recording layer from the standpoints of sufficient dissolution inhibiting effect and image forming properties.

Also, in the case where a measure for the foregoing improvement of inhibition (dissolution inhibition) is taken, a lowering of the sensitivity is generated. In this case, it is effective to add a lactone compound. It is considered that when the developer permeates into an exposed area, this lactone compound reacts with the developer to newly generate a carboxylic acid compound which contributes to the dissolution of the exposed area, thereby enhancing the sensitivity.

The lactone compound is not particularly limited, and examples thereof include compounds represented by the following general formulae (L-I) and (L-II).

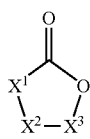

General Formula (L-I)

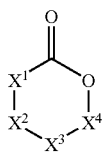

General Formula (L-II)

In the general formulae (L-I) and (L-II), $X^1$, $X^2$, $X^3$ and $X^4$, which may be the same or different, each represents a ring-constituting atom or atomic group and may each independently have a substituent. Each of at least one of $X^1$, $X^2$ and $X^3$ in the general formula (L-I) and at least one of $X^1$, $X^2$, $X^3$ and $X^4$ in the general formula (L-II) has an electron withdrawing substituent or a substituent substituted with an electron withdrawing group.

The ring-constituting atom or atomic group represented by $X^1$, $X^2$, $X^3$ and $X^4$ is a non-metallic atom containing two single bonds for forming a ring or an atomic group containing the subject non-metallic atom.

The non-metallic atom or non-metallic atomic group is an atom or an atomic group selected among a methylene group, a sulfinyl group, a carbonyl group, a thiocarbonyl group, a sulfonyl group, a sulfur atom, an oxygen atom, and a selenium atom; and more preferably an atomic group selected among a methylene group, a carbonyl group, and a sulfonyl group.

Each of at least one of $X^1$, $X^2$ and $X^3$ in the general formula (L-I) and at least one of $X^1$, $X^2$, $X^3$ and $X^4$ in the general formula (L-II) has an electron withdrawing substituent. In this specification, the electron withdrawing substituent refers to a group having a positive Hammett's substituent constant up. With respect to the Hammett's substituent constant, *Journal of Medicinal Chemistry*, 1973, Vol. 16, No. 11, 1207-1216 can be made hereof by reference. Examples of the electron withdrawing group having a positive Hammett's substituent constant σp include halogen atoms (for example, a fluorine atom (σp value: 0.06), a chlorine atom (σp value: 0.23), a bromine atom (σp value: 0.23), and an iodine atom (σp value: 0.18)), trihaloalkyl groups (for example, tribromomethyl (σp value: 0.29), trichloromethyl (σp value: 0.33), and trifluoromethyl (σp value: 0.54)), a cyano group (σp value: 0.66), a nitro group (σp value: 0.78), aliphatic, aryl or heterocyclic sulfonyl groups (for example, methanesulfonyl (σp value: 0.72)), aliphatic, aryl or heterocyclic acyl groups (for example, acetyl (σp value: 0.50) and benzoyl (σp value: 0.43)), alkynyl groups (for example, C≡CH (σp value: 0.23)), aliphatic, aryl or heterocyclic oxycarbonyl groups (for example, methoxycarbonyl (σp value: 0.45) and phenoxycarbonyl (σp value: 0.44)), a carbamoyl group (σp value: 0.36), a sulfamoyl group (σp value: 0.57), a sulfoxide group, a heterocyclic group, an oxo group, and a phosphoryl group.

The electron withdrawing group is preferably a group selected among an amide group, an azo group, a fluoroalkyl group having from 1 to 5 carbon atoms, a nitrile group, an alkoxycarbonyl group having from 1 to 5 carbon atoms, an acyl group having from 1 to 5 carbon atoms, an alkylsulfonyl group having from 1 to 9 carbon atoms, an arylsulfonyl group having from 6 to 9 carbon atoms, an alkylsulfinyl group having from 1 to 9 carbon atoms, an arylsulfinyl group having from 6 to 9 carbon atoms, an arylcarbonyl group having from 6 to 9 carbon atoms, a thiocarbonyl group, a fluorine-containing alkyl group having from 1 to 9 carbon atoms, a fluorine-containing aryl group having from 6 to 9 carbon atoms, a fluorine-containing allyl group having from 3 to 9 carbon atoms, an oxo group, and a halogen element.

The electron withdrawing group is more preferably a group selected among a nitro group, a fluoroalkyl group having from 1 to 5 carbon atoms, a nitrile group, an alkoxycarbonyl group having from 1 to 5 carbon atoms, an acyl group having from 1 to 5 carbon atoms, an arylsulfonyl group having from 6 to 9 carbon atoms, an arylcarbonyl group having from 6 to 9 carbon atoms, an oxo group, and a halogen element.

Specific examples of the compounds represented by the general formulae (L-I) and (L-II) will be given below, but it should not be construed that the invention is limited thereto.
(LI-1)
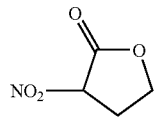
(LI-2)
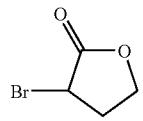
(LI-3)
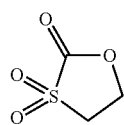
(LI-4)
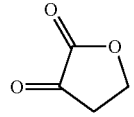
(LI-5)
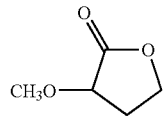
(LI-6)
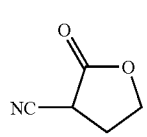
(LI-7)
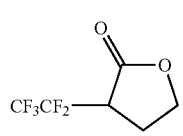
(LI-8)
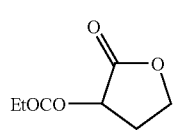
(LI-9)
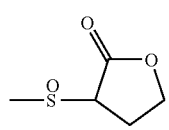
(LI-10)
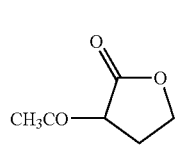
-continued
(LI-11)
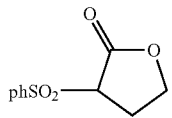
(LI-12)
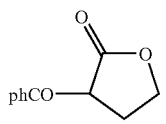
(LI-13)
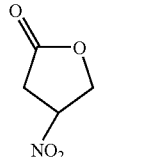
(LI-14)
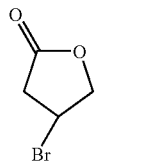
(LI-15)
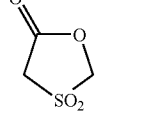
(LI-16)
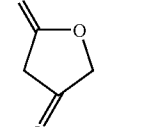
(LI-17)
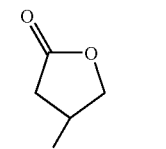
(LI-18)
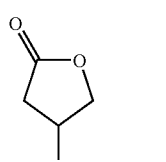
(LI-19)
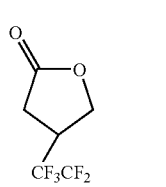

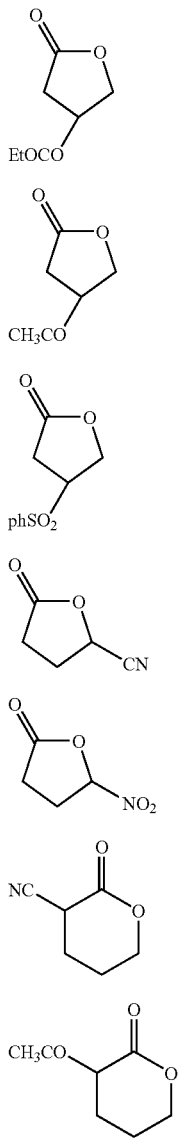

In order to reveal sufficient effects and good image forming properties, the addition amount of the compound represented by the general formula (L-I) or (L-II) is preferably from 0.1 to 50% by weight, and more preferably from 1 to 30% by weight in terms of solids based on the amount of the whole of solids of the image recording layer. Incidentally, since this compound reacts with the developer, it is desired to bring the compound into selective contact with the developer.

These lactone compounds can be used singly or jointly. Also, two or more kinds of the compounds of the general formula (L-I) or two or more kinds of the compounds of the general formula (L-II) may be used jointly in an arbitrary ratio within the foregoing range with respect to the total addition amount.

Also, for the purpose of enhancing the dissolution inhibition properties of the image area in the developer, it is preferred to use the compound together with a substance which is heat decomposable and which substantially lowers the solubility of the alkali-soluble high molecular compound in the non-decomposed state, such as onium salts, o-quinediaz- ide compounds, aromatic sulfone compounds, and aromatic sulfonic ester compounds. Examples of the onium salt include diazonium salts, ammonium salts, phosphonium salts, iodonium salts, sulfonium salts, selenonium salts, and arsonium salts.

Preferred examples of the onium salt which is used in the invention include diazonium salts described in S. I. Schlensinger, *Photogr. Sci. Eng.*, 18, 387 (1974), T. S. Bal, et al., *Polymer*, 21, 423 (1980), and JP-A-5-158230; ammonium salts described in U.S. Pat. Nos. 4,069,055 and 4,069,056 and JP-A-3-140140; phosphonium salts described in D. C. Necker, et al., *Macromolecules*, 17, 2468 (1984), C. S. Wen, et al., *Teh. Proc. Conf. Rad. Curing ASIA*, p. 478. Tokyo, Oct. (1988), and U.S. Pat. Nos. 4,069,055 and 4,069,056; iodonium salts described in J. V. Crivello, et al., *Macromolecules*, 10(6), 1307 (1977), *Chem. & Eng. News*, November 28, p. 31 (1988), European Patent No. 104,143, U.S. patent application Ser. Nos. 339,049 and 410,201, JP-A-2-150848, and JP-A-2-296514; sulfonium salts described in J. V. Crivello, et al., *Polymer J.*, 17, 73 (1985), J. V. Crivello, et al., *J. Org. Chem.*, 43, 3055 (1978), W. R. Watt et al., *J. Polymer Sci., Polymer Chem. Ed.*, 22, 1789 (1984), J. V. Crivello, et al., *Polymer Bull.*, 14, 279 (1985), J. V. Crivello, et al., *Macromolecules*, 14(5), 1141 (198 1), J. V. Crivello, et al., *J. Polymer Sci., Polymer Chem. Ed.*, 17, 2877 (1979), European Patent Nos. 370,693, 233,567, 297,443 and 297,442, U.S. Pat. Nos. 4,933,377 and 3,902,114, U.S. patent application Ser. Nos. 410,201 and 339,049, U.S. Pat. Nos. 4,760,013, 4,734,444 and 2,833,827, and German Patent Nos. 2,904,626, 3,604, 580 and 3,604,581; selenonium salts described in J. V. Crivello, et al., *Macromolecules*, 10(6), 1307 (1977) and J. V. Crivello, et al., *J. Polymer Sci., Polymer Chem. Ed.*, 17, 1047 (1979); and arsonium salts described in C. S. Wen, et al., *Teh Proc. Conf. Rad. Curing ASIA*, p. 478, Tokyo, Oct. (1988).

Of the onium salts, diazonium salts are especially preferable. Also, as the preferred diazonium salt, those described in JP-A-5-158230 are enumerated.

Examples of counter ions against the onium salts include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Of these, hexafluorophosphoric acid and alkyl aromatic sulfonic acids such as triisopropylnaphthalenesulfonic acid and 2,5-dimethylbenzenesulfonic acid are preferable.

As the preferred quinonediazides, o-quinonediazide compounds can be enumerated. The o-quinonediazide compound. which is used in the invention is a compound containing at least one o-quinonediazide group, whose alkali solubility is increased upon heat decomposition, and compounds having a varied structure can be used. That is, the o-quinonediazide assists the solubility of the photographic system by both an effect that the dissolution inhibition of the binder is lost upon heat decomposition and an effect that the o-quinonediazide itself is converted into an alkali-soluble substance. As the o-quinonediazide compound to be used in the invention, compounds described on pages 339 to 352 of J. Kosar, *Light-Sensitive Systems* (John Wiley & Sons, Inc.) can be used. Especially, sulfonic esters or sulfonic amides of o-quinonediazide resulting from reaction with various aromatic polyhydroxy compounds or aromatic amino compounds are preferable. Also, an ester of benzoquinone-(1,2)-diazidosulfonic chloride or naphthoquinone-(1,2)-diazido-5-sulfonic chloride and a pyrogallol/acetone resin as described in JP-B-43-28403 and an ester of benzoquinone-(1,2)-diazidosulfonic chloride or naphthoquinone-(1,2)-diazido-5-sulfonic chloride and a phenol/formaldehyde resin as described in U.S. Pat. Nos. 3,046,120 and 3,188,210 can be preferably used.

Further, an ester of benzoquinone-(1,2)-diazidosulfonic chloride and a phenol-formaldehyde resin or a cresol/formaldehyde resin and an ester of or naphthoquinone-(1,2)-diazido-5-sulfonic chloride and a pyrogallol/acetone resin are similarly preferably used. Other useful o-quinonediazide compounds are reported and known in many patents. Examples thereof include those described in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patent Nos. 1,227,602, 1,251,345, 1,267,005, 1,329,888 and 1,330,932, and German Patent No. 854,890.

The addition amount of the o-quinonediazide compound is preferably in the range of from 1 to 50% by weight, more preferably from 5 to 30% by weight, and especially preferably from 10 to 30% by weight based on the whole of solids of the image recording layer. Such a compound can be used singly or may be used in admixture of several kinds thereof. Also, this compound may contain an alkali-soluble resin at a part of which is esterified, as described in JP-A-11-288089.

Also, for the purposes of reinforcing the dissolution inhibition of the surface of the image recoding layer and reinforcing the resistance to scratches on the surface, it is preferred to use jointly a polymer comprising as a polymerization component a (meth)acrylate monomer containing two or three perfluoroalkyl groups having from 3 to 20 carbon atoms in the molecule thereof as described in JP-A-2000-187318. With respect to the addition amount, its proportion in the layer material is preferably from 0.1 to 10% by weight, and more preferably from 0.5 to 5% by weight.

—Development Promoter—

Also, for the purpose of further enhancing the sensitivity, it is possible to use jointly an acid anhydride, a phenol, or an organic acid.

As the acid anhydride, cyclic acid anhydrides are preferable. Specific examples thereof include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride, and pyromellitic anhydride as described in U.S. Pat. No. 4,115,128. As non-cyclic acid anhydrides, acetic anhydride and so on can be enumerated.

Examples of the phenol include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4''-trihydroxytriphenylmethane, and 4,4',3'',4''-tetrahydroxy-3,5,3',5'-tetramethyltriphenylmethane.

Further, examples of the organic acid include sulfonic acids, sulfinic acids, alkylsulfuric acids, phosphonic acids, phosphoric esters, and carboxylic acids as described in JP-A-60-88942 and JP-A-2-96755. Specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the foregoing acid anhydride, phenol or organic acid in the image recording layer is preferably from 0.05 to 20% by weight, more preferably from 0.1 to 15% by weight, and especially preferably from 0.1 to 10% by weight.

—Surfactant—

For the sake of improving the coating properties and broadening the processing stability against the development condition, it is possible to add a nonionic surfactant described in JP-A-62-251740 and JP-A-3-208514; an ampholytic surfactant described in JP-A-59-121044 and JP-A-4-13149; a siloxane based compound described in EP950517; or a fluorine-containing monomer copolymer described in JP-A-62-170950, JP-A-11-288093, and Japanese Patent Application No. 2001-247351 in the heat-sensitive layer.

Specific examples of the nonionic surfactant include sorbitan tristearate, sorbitan monopalmitate, sorbitan trioleate, stearic acid monoglyceride, and polyoxyethylene nonylphenyl ether. Examples of the ampholytic surfactant include an alkyl di(aminoethyl)glycine, an alkyl polyaminoethyl glycine hydrochloride, a 2-alkyl-N-carboxyethyl-N-hydroxyethyl imidazolium betaine, and an N-tetradecyl-N,N-betaine type (for example, a trade name "Amogen K", manufactured by Daiichi Kogyo Seiyaku Co., Ltd.).

As the siloxane based compound, block copolymers of dimethylsiloxane and a polyalkylene oxide are preferable. Specific examples thereof include polyalkylene oxide-modified silicones such as DBE-224, DBE-621, DBE-712, DBP-732 and DBP-534, all of which are manufactured by Chisso Corporation; and Tego Glide 100, manufactured by Tego, Germany. The proportion of the foregoing nonionic surfactant or ampholytic surfactant in the image recording layer is preferably from 0.01 to 15% by weight, more preferably from 0.1 to 5% by weight, and more preferably from 0.05 to 0.5% by weight.

—Print-Out Agent/Colorant—

A print-out agent for obtaining a visible image immediately after heating due to exposure and a dye or a pigment as an image colorant can be added in the printing plate material.

As the print-out agent, combinations of a compound which releases an acid by heating due to exposure (light acid releasing agent) with an organic dye capable of forming a salt can be enumerated as a representative example. Specific examples thereof include combinations of an o-naphthoqunonediazido-4-sulfonic acid halogenide with a salt forming organic dye described in JP-A-50-36209 and JP-A-53-8128; and combinations of a trihalomethyl compound with a salt forming organic dye described in JP-A-53-36223, JP-A-54-74728, JP-A-60-3626, JP-A-61-143748, JP-A-61-151644, and JP-A-63-58440. Examples of such a trihalomethyl compound include oxazole based compounds and triazine based compounds. All of these compounds are excellent in the stability due to aging and give clear print-out images.

As the colorant of image, other dyes than the foregoing salt forming organic dyes can be used. As preferred dyes including the salt forming organic dyes, oil-soluble dyes and basic dyes can be enumerated. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (all of which are manufactured by Orient Chemical Industries, Ltd.), Victoria Pure Blue, Crystal Violet Lactone, Crystal Violet (CI42555), Methyl Violet (CI42535), Ethyl Violet, Rhodamine B (CI145170B), Malachite Green (CI42000), and Methylene Blue (CI52015). Also, dyes described in JP-A-62-293247 are especially preferable.

Such a dye can be added in a proportion of from 0.01 to 10% by weight, and preferably from 0.1 to 3% by weight based on the whole of solids of the image recording layer in the printing plate material.

—Plasticizer—

If desired, in order to impart flexibility of the coating film, a plasticizer is added in the printing plate material. Examples thereof include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers or polymers of acrylic acid or methacrylic acid.

—Waxing Agent—

For the purpose of imparting resistance against scratches, it is possible to add a compound which lowers a coefficient of static friction in the image recording layer of the photosensitive lithographic printing plate. Specifically, compounds containing an ester of a long chain alkylcarboxylic acid as used in U.S. Pat. No. 6,117,913 and Japanese Patent Application Nos. 2001-261627, 2002-032904 and 2002-165584 can be enumerated. With respect to the addition amount of such a compound, its proportion in the material which forms the layer is preferably from 0.1 to 10% by weight, and more preferably from 0.5 to 5% by weight.

The photosensitive lithographic printing plate can be usually produced by dissolving a composition of the photosensitive layer (heat-sensitive layer) of the plate material containing the foregoing respective components in a solvent and coating the solution on a suitable support.

[Coating Solvent]

Examples of the solvent which can be used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, N-methylpyrrolidone, tetramethylurea, dimethyl sulfoxide, sulfolane, γ-butyrolactone, toluene, and water. However, it should not be construed that the invention is limited thereto. These solvents are used singly or in admixture.

In choosing the coating solvent, with respect to a photosensitive lithographic printing plate having a two-layer structure of an upper recording layer and a lower recording layer, when the upper recording layer and the lower recording layer are provided adjacent to each other, in order to prevent compatibilization at the interface between the both layers, it is preferred to choose a coating solvent for the upper recording layer, which does not substantially dissolve the lower recording layer therein. The concentration of the foregoing components (the whole of solids including the additives) in the solvent is preferably from 1 to 50% by weight. In using an acid anhydride, it is preferable that the amount of water in the coating liquid is not more than 0.5%.

[Coating Amount]

Also, the coating amount (solids content) of the foregoing heat-sensitive composition varies depending upon the application and is suitably from 0.3 to 3.0 g/m$^2$, preferably from 0.5 to 2.5 g/m$^2$, and more preferably from 0.8 to 1.6 g/m$^2$ from the viewpoints of film characteristics and printing resistance.

[Laminated Structure]

In the photosensitive lithographic printing plate to which the invention is applied, an image recording layer containing the foregoing components is provided on a support. The image recording layer may be a laminated construction having at least two layers (for the sake of convenience, the case comprising two layers of an upper layer and a lower layer will be hereinafter described).

In that case, as an alkali-soluble resin which constructs the upper layer and the lower layer, the alkali-soluble resin as described previously can be applied. It is preferable that the upper layer has lower solubility in alkalis than the lower layer.

Also, with respect to an infrared absorbing dye, the infrared absorbing dye may be different in the respective layers. Also, an infrared absorbing dye comprising a plurality of compounds may be used in each layer. In all of the cases, the infrared absorbing dye can be added in a proportion of from 0.01 to 50% by weight, preferably from 0.1 to 50% by weight, and especially preferably from 0.1 to 30% by weight based on the whole of solids in the layer to which it is added. In the case where the infrared absorbing dye is added to a plurality of layers, it is preferable that the total sum of the addition amounts falls within the foregoing range.

Since the foregoing substance which is heat decomposable and which substantially lowers the solubility of the alkali-soluble high molecular compound in the non-decomposed state may possibly be partially decomposed due to aging, in the case where the image recording layer is of a laminated construction, though it is effective to contain such a substance in the lower layer, the substance may be contained in any one of the layers or the both layers. The content of the substance is described previously. In the case where the substance is added in a plurality of layers, it is preferable that the total sum of the addition amounts falls within the foregoing range.

Also, in the case of the laminated construction, though it is effective to contain a lactone compound in the lower layer, the lactone compound may be contained in any one of the layers or the both layers.

[Support]

As a hydrophilic support which is used in the photosensitive lithographic printing plate, dimensionally stable plate-like materials having necessary strength and durability can be employed. Examples thereof include papers, papers laminated with a plastic (for example, polyethylene, polypropylene, and polystyrene), metal plates (for example, aluminum, zinc, and copper), plastic films (for example, cellulose diacetate, cellulose triacetate, cellulose propionate, cellulose butyrate, cellulose acetobutyrate, cellulose nitrate, polyethylene terephthalate, polyethylene, polystyrene, polypropylene, polycarbonates, and polyvinyl acetal), and papers or plastic films laminated or vapor deposited with the foregoing metal.

A polyester film or an aluminum plate is preferable as the support. Of these, an aluminum plate which is dimensionally stable and comparatively cheap is especially preferable. As the aluminum plate, a pure aluminum plate, alloy plates containing aluminum as the principal component and containing a trace amount of foreign elements, and plastic films laminated or vapor deposited with aluminum are preferable. Examples of the foreign elements which are contained in the aluminum alloy include silicon, iron, manganese, copper, magnesium, chromium, zinc, bismuth, nickel, and titanium. The content of the foreign elements in the alloy is at most 10% by weight.

Although pure aluminum is especially preferable as the aluminum, since it is difficult to produce completely pure aluminum in view of the smelting technologies, ones containing a slight amount of foreign elements are employable. Such an aluminum plate is not specified with respect to its composition, aluminum plates made of raw materials which have hitherto been publicly known and used can be properly utilized. The thickness of the aluminum plate to be used in the invention is from approximately 0.1 mm to 0.6 mm, preferably from 0.15 mm to 0.4 mm, and especially preferably from 0.2 mm to 0.3 mm.

Prior to roughing the aluminum plate, for the purpose of removing a rolling oil on the surface, the aluminum plate is subjected to a degreasing treatment with, for example, a surfactant, an organic solvent, or an alkaline aqueous solution, if desired. The roughing treatment of the surface of the aluminum plate is carried out by carious methods, and examples thereof include a method of mechanically roughing the surface, a method of electrochemically dissolving and roughing the surface, and a method of chemically selectively dissolving the surface. As the mechanical method, known methods such as a ball polishing method, a brush polishing method, a blast polishing method, and a buff polishing method can be employed. Examples of the electrochemically roughing method include a method of roughing the surface in a hydrochloric acid or nitric acid electrolytic solution using an alternating current or a direct current. Also, a method comprising a combination of the both methods as disclosed in JP-A-54-63902 can be utilized.

If desired, the thus roughed aluminum plate is subjected to an alkali etching treatment or a neutralization treatment and then optionally subjected to an anodic oxidation treatment for the purpose of enhancing the water retention properties or abrasion resistance of the surface. As an electrolyte to be used in the anodic oxidation treatment of the aluminum plate, a variety of electrolytes which form a porous oxide film can be used. In general, sulfuric acid, phosphoric acid, oxalic acid, chromic acid, or a mixed acid thereof is used. The concentration of such an electrolyte is properly determined depending upon the type of the electrolyte.

The treatment condition of the anodic oxidation varies depending upon the electrolyte and therefore, cannot be unequivocally specified. However, in general, it is suitable that the concentration of the electrolyte is from 1 to 80% by weight of the solution, the liquid temperature is from 5 to 70° C., the current density is from 5 to 60 A/dm$^2$, the voltage is from 1 to 100 V, and the electrolysis time is in the range of from 10 seconds to 5 minutes. The amount of the anodically oxidized film is preferably 1.0 g/m$^2$ or more in view of the printing resistance. After the anodic oxidation treatment, the aluminum surface is subjected to a hydrophilization treatment, if desired. As the hydrophilization treatment, a method of using an alkali metal silicate (for example, a sodium silicate aqueous solution) as disclosed in U.S. Pat. Nos. 2,714,066, 3,181,461, 3,280,734 and 3,902,734 is employable. According to this method, the support is subjected to an immersion treatment or electrolytic treatment with a sodium silicate aqueous solution. Besides, a treatment method of using potassium fluorozirconate as disclosed in JP-B-36-22063 and a treatment method of using polyvinylphosphonic acid as disclosed in U.S. Pat. Nos. 3,276,868, 4,153,461 and 4,689,272 are employable.

Though the photosensitive lithographic printing plate is one comprising a support having thereon at least the foregoing image recording layer, an undercoat layer can be provided between the support and the image recording layer as the need arises.

A variety of organic compounds are used as a component of the undercoat layer. Examples thereof include carboxymethyl cellulose, dextrin, gum arabic, amino group-containing phosphonic acid (for example, 2-aminoethylphosphonic acid), organic phosphonic acids (for example, optionally substituted phenylsulfonic acids, naphthylphosphonic acids, alkylphosphonic acids, glycerophosphonic acids, methylenediphosphonic acids and ethylenediphosphonic acids), organic phosphoric acids (for example, optionally substituted phenylphosphoric acids, naphthylphosphoric acids, alkylphosphoric acids, and glycerophosphoric acids), organic phosphinic acids (for example, optionally substituted phenylphosphinic acids, naphthylphosphinic acids, alkylphosphinic acids, and glycerophosphinic acids), amino acids (for example, glycine and β-alanine), and hydrochlorides of a hydroxyl group-containing amine (for example, a hydrochloride of triethanolamine). These organic compounds may be used in admixture of two or more kinds thereof.

Further, an undercoat layer containing at least one kind of compounds selected from the group consisting of organic high molecular compounds having a structural unit represented by the following formula is also preferable.

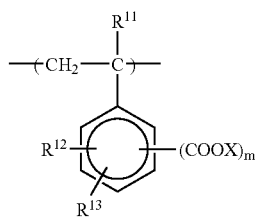

In the formula, $R^{11}$ represents a hydrogen atom, a halogen atom, or an alkyl group; $R^{12}$ and $R^{13}$ each independently represents a hydrogen atom, a hydroxyl group, a halogen atom, an alkyl group, a substituted alkyl group, an aryl group, a substituted aryl group, $—OR^{14}$, $—COOR^{15}$, $—CONHR^{16}$, $—COR^{17}$, or $—CN$, or $R^{12}$ and $R^{13}$ may be taken together to form a ring; $R^{14}$ to $R^{17}$ each independently represents an alkyl group or an aryl group; X represents a hydrogen atom, a metal atom, or $NR^{18}R^{19}R^{20}R^{21}$; $R^{18}$ to $R^{21}$ each independently represents a hydrogen atom, an alkyl group, a substituted alkyl group, an aryl group, or a substituted aryl group, or $R^{18}$ and $R^{19}$ may be taken together to form a ring; and m represents an integer of from 1 to 3.

This undercoat layer can be provided by the following methods. That is, there are enumerated a method in which a solution of the foregoing organic compound dissolved in water or an organic solvent (for example, methanol, ethanol, and methyl ethyl ketone) or a mixed solvent thereof is coated on an aluminum plate and then dried to provide an undercoat layer; and a method in which an aluminum plate is immersed in a solution of the foregoing organic compound dissolved in water or an organic solvent (for example, methanol, ethanol, and methyl ethyl ketone) or a mixed solvent thereof to adsorb the foregoing compound and then washed with water, etc., followed by drying to provide an undercoat layer. In the former method, a solution of the foregoing organic compound in a concentration of from 0.005 to 10% by weight can be coated by various methods. Also, in the latter method, the concentration of the solution is from 0.01 to 20% by weight, and preferably from 0.05 to 5% by weight; the immersion temperature is from 20 to 90° C., and preferably from 25 to 50° C.; and the immersion time is from 0.1 seconds to 20 minutes, and preferably from 2 seconds to one minute. The solution to be used herein can be adjusted at a pH in the range of from 1 to 12 with a basic substance (for example, ammonia, triethylamine, and potassium hydroxide) or an acidic substance (for example, hydrochloric acid and phosphoric acid).

In order to a sufficient printing performance, the coating amount of the undercoat layer is suitably from 2 to 200 mg/m$^2$, and preferably from 5 to 100 mg/m$^2$.

The thus formed photosensitive lithographic printing plate is imagewise exposed and then subjected to development processing with the alkaline developer as described previously in detail.

Examples of a light source of the active rays to be used for the image exposure include a mercury vapor lamp, a metal halide lamp, a xenon lamp, a chemical lamp, and a carbon arc lamp. Examples of radiations include electron beams, X rays, ion beams, and far infrared light. Also, a g-line, an i-line, deep-UV light, and high-density energy beams (laser beams) are useful. Examples of the laser beams include helium-neon laser, argon laser, krypton laser, helium-cadmium laser, and KrF excimer laser. In the invention, light sources having an emitting wavelength in the region of from near infrared light to infrared light are preferable, and solid laser and semiconductor laser are especially preferable.

In the case where an unnecessary image area is present in the lithographic printing plated obtained by image exposure, development, water washing and/or rinse and/or gumming, erasing of that unnecessary image area is performed. For the erasing, for example, a method in which an erasing liquid as described in JP-B-2-13293 is coated on the unnecessary image area, allowed to stand as it is for a prescribed period of time, and then washed with water is preferable. A method described in JP-A-59-174842, in which the unnecessary image area is irradiated with active rays having been introduced by optical fibers and then developed, can be utilized.

The thus obtained lithographic printing plate can be provided for the printing step after coating with a desensitized gum, if desired. In the case where it is intended to prepare a lithographic printing plate having a higher printing resistant force, a burning treatment is carried out. In the case where the lithographic printing plate is subjected to a burning treatment, it is preferred to treat the lithographic printing plate with a surface conditioning liquid as described in JP-B-61-2518, JP-B-55-28062, JP-A-1-31859, and JP-A-61-159655.

Examples of this method include a method of coating the surface conditioning liquid on the lithographic printing plate using a sponge or absorbent cotton infiltrated with a surface conditioning liquid, a method of coating the surface conditioning liquid on the lithographic printing plate upon immersion in a vat filled with the surface conditioning liquid, and a method of coating the surface conditioning liquid on the lithographic printing plate using an automatic coater. Also, after coating, by making the coating amount uniform using a squeegee or a squeegee roll, better results are given.

In general, the coating amount of the surface conditioning liquid is suitably from 0.03 to 0.8 g/m$^2$ (on a dry weight basis). If desired, after drying, the lithographic printing plate having a surface conditioning liquid coated thereon is heated at a high temperature using a burning processor (for example, a burning processor BP-1300, sold from Fuji Photo Film Co., Ltd.), etc. In this case, the heating temperature and time vary depending upon the types of the components which form the image, but it is preferable that the heating is carried out at a temperature in the range of from 180 to 300° C. for a time in the range of from 1 to 20 minutes.

The burning treated lithographic printing plate can be properly subjected to conventional treatments such as water washing and gumming as the need arises. In the case where a surface conditioning liquid containing a water-soluble high molecular compound, etc., is used, a so-called desensitization treatment such as gumming can be omitted. The thus treated and obtained lithographic printing plate is charged in an offset printing machine and used for printing multiple sheets.

The invention will be described below with reference to the illustrated embodiments. FIG. 1 is a constructive view of the first embodiment of an automatic development device for carrying out the developer replenishing method according to the invention. As illustrated in FIG. 1, this automatic development device 2 is provided with a developing section 6 for developing a photosensitive lithographic printing plate (hereinafter referred to as "PS plate") 4, a post-processing section 8 for washing out a developer adhered on the developed PS plate 4 and coating a gum liquid, and a drying section 10 for drying the PS plate after coating with the gum liquid.

Also, in the case of processing the PS plate which requires heating before the development processing, a pre-heating section not illustrated in FIG. 1 can be provided. The pre-heating section is placed in the upstream side in the delivery direction of the developing section 6 and has a function to keep a specified surface temperature of the PS plate for a specified period of time while delivering the PS plate. The PS plate inserted in the pre-heating section is automatically delivered into a next step while being heated. Moreover, it is possible to provide a pre-water washing section not illustrated in FIG. 1. The pre-water washing section is placed in the upstream side in the delivery direction of the developing section 6 and in the downstream side in the delivery direction of the pre-heating section and has a function to wash the surface of the PS plate with washing water and cool it while delivering the PS plate. The PS plate inserted in the pre-water washing section is automatically delivered into the developing section 6 as a next step.

An insertion port 14 is formed in a side plate 12 of the automatic development device 2, and the PS plate 4 inserted from the insertion port 14 is delivered into the developing section 6 by delivery rolls 16. The insertion port 14 is provided with a rubber blade 18, and when the PS plate 4 is not inserted, the insertion port 14 is closed by the rubber blade 18.

In a developing tan 20 of the developing section 6, delivery rolls 22, brush rolls 24, and squeeze rolls 26 are provided in this order from the upstream side in the delivery direction, and backup rolls 28 are provided in proper places therebetween. The PS plate 4 is immersed in the developer and subjected to development processing while being delivered by the delivery rolls 22.

The post-processing section 8 continued to the developing section 6 is constructed of a water washing section 8a and a finisher section 8b. The water washing section 8a is provided with rolls 30a', 30a, each of which delivers the PS plate 4, a water washing tank 32a, and spray members 34a for spraying a washing liquid in the water washing tank 32a onto the PS plate 4. Further, the water washing section 8a is provided with a washing water feed pump 78a for feeding washing water into the water washing tank 32a. The finisher section 8b is provided with rolls 30b, each of which delivers the PS plate 4, a finisher tank 32b, and spray members 34b for spraying a finisher liquid in the finisher tank 32b. Further, the finisher section 8b is provided with a gum liquid feed pump 77 for feeding a gum liquid into the finisher tank 32b and a gum liquid dilute liquid feed pump 78b for feeding a gum liquid dilute liquid. The developed PS plate 4 is washed with water by spraying the washing water from the spray members 34a while being delivered by the delivery rolls 30a. Further, the PS plate 4 is coated by spraying the finisher liquid from the spraying members 34b while being delivered by the delivery rolls 30b.

At this time, the water washing tank 32a is replenished with a dilute liquid 57 in a replenishing dilute liquid storage tank 53 by the washing water feed pump 78a; and the finisher tank 32b is replenished with a gum liquid in a gum liquid tank 56 by the pump 77 and replenished with the dilute liquid 57 in the replenishing dilute liquid storage tank 53 by the replenishing liquid dilute liquid feed pump 78b. Here, the replenishing proportion of the gum liquid to the dilute liquid is, for example, 1/1. Following these replenishments, the washing water overflowed from the water washing tank 32a and the gum waste liquid overflowed from the finisher tank 32b are recovered in a waste liquid tank 54 in the same manner as in the development waste liquid.

Also, it is effective to provide the water washing section 8a with a water washing brush roll not illustrated in FIG. 1. This water washing rush roll is placed on the upper surface or upper and lower surfaces of the PS plate 4 between the spray members 34a and the PS plate 4, and rubs and water washes the surface of the delivered PS plate 4 while rotating.

On the other hand, a structure in which the water washing section 8a works as the first finisher section 8a and the finisher section 8b works as the second finisher section 8b is effective, too. The first finisher section 8a and the second finisher section 8b are provided with delivery rolls 30a, 30b for delivering the PS plate 4 and spray members 34a, 34b for spraying gum liquids in the finisher tanks 32a, 32b onto the PS plate 4. The developed PS plate 4 is coated by spraying the gum liquids from the spray members 34a, 34b while being delivered by the delivery rolls 30a, 30b. Incidentally, at this time, though the gum liquid in the finisher tank 32b of the second finisher section 8b located in the downstream side is overflowed and fed in the finisher tank 32a of the first finisher section 8a located in the upstream side, the gum liquid may be similarly fed by a pump, etc. instead of such a construction. In this case, the washing water feed pump 78a is not used.

At this time, the second finisher tank 32b is replenished with the gum liquid in the gum liquid tank 56 by the pump 77 and replenished with the dilute liquid 57 in the replenishing dilute liquid storage tank 53 by a replenishing liquid dilute liquid feed pump 78. Here, the replenishing proportion of the gum liquid to the dilute liquid is, for example, 1/1. Following this replenishment, the gum waste liquid overflowed from the first finisher tank 32a is recovered in the waste liquid tank 54 in the same manner as in the development waste liquid.

The drying section 10 continued to the finisher section 8 is provided with a guide roll 36 and a pair of tandem rolls 38 in this order from the upstream side in the delivery direction. Also, the drying section 10 is provided with a non-illustrated drying unit such as a warm air feed unit and a heat generating unit. The drying section 10 is provided with a discharge port 40, and the PS plate 4 which has been dried by the drying unit is discharged from the discharge port 40. Also, a shutter 44 is provided in a passage 46 between the drying section 10 and the finisher section 8, and when the PS plate 4 does not pass through the passage 46, the passage 46 is closed by the shutter 44.

A developing tank 20 is provided with a box-like shielding lid 60 integrated with the tank wall. The bottom wall of the shielding lid 60. is continuously curved in an arc form such that it does not come into contact with the upper peripheral surface of each of the delivery roll 22, the brush roll 24 and the backup roll 28, whereby it does not interfere with the rolls, etc. Since the shielding lid 60 is formed in the box-like shape, an airtight space is formed in the upper portion of the developing tank 20, whereby the air amount in the developing section 6 is made small as far as possible. Also, by providing the shielding lid 60, the contact area between the developer and air is made small as far as possible.

The automatic development device 2 having the foregoing construction is provided with rubber blades 62 in proper places, and a portion extending from the developing section 6 to the finisher section 8b is constructed substantially airtight against the outer circumference, whereby external air does not flow thereinto. Also, a portion extending from the developing section 6 to the water washing section 8a is constructed substantially airtight by the rubber blades 62, whereby the air in the water washing section 8a does not flow into the developing section 6. Accordingly, though when the PS plate 4 passes through the developing section 6, the air slightly flows thereinto, the development section 6 is substantially airtight and is of a sealing type construction such that air does not substantially flow thereinto.

Next, the developing section 6 will be described below in detail. The developing tank 20 is connected with a circulating conduit 80 for the developer. The circulating conduit 80 is provided with a circulating pump 71 for the developer, an electric conductivity sensor 73, and a filter (not illustrated). The circulating pump 71 for the developer sucks the developer in the developing tank 20 into circulating conduit 80 from a suction hole provided in the bottom of the developing tank 20, circulates the developer in the circulating conduit 80, and then again discharges it into the developing tank 20. The foregoing filter filters the developer flowing in the circulating conduit 80. The foregoing electric conductivity sensor 73 as a unit for measuring the electric conductivity measures the electric conductivity of the developer flowing in the circulating conduit 80.

Also, the developing section 6 is provided with replenishing conduits 90, 91, a replenishing stock liquid storage tank 55 connected to the replenishing conduit 90, a replenishing stock liquid feed pump 74 included in the replenishing conduit 90, a replenishing dilute liquid storage tank 53 connected to the replenishing conduit 91, and a replenishing dilute liquid feed pump 76 included in the replenishing conduit 91, each of which constructs the replenishing device, and they function as units for replenishing the developer. Also, the development waste liquid overflowed from the developing tank 20 is recovered in the waste liquid tank 54.

Specifically, a pair of the replenishing conduits 90, 91 of a development replenisher obtained by diluting a development replenisher stock liquid 58 with a replenishing dilute liquid 57 are provided in the vicinity of the foregoing developing tank 20. In the replenishing conduit 90 of the development replenisher stock liquid 58, its other end (the lower end in FIG. 1) is connected to the replenishing stock liquid storage tank 55, and the replenishing stock liquid feed pump 74 is provided in the conduit. The replenishing stock liquid feed pump 74 feeds the development replenisher stock liquid 58 into the developing tank 20 from the replenishing stock liquid storage tank 55. In the replenishing conduit 91 of the replenishing dilute liquid 57, its other end (the lower end in FIG. 1) is connected to the replenishing dilute liquid storage tank 53, and the replenishing dilute liquid feed pump 76 is provided in the conduit. The replenishing dilute liquid feed pump 76 feeds the replenishing dilute liquid (water) 57 into the developing tank 20 from the replenishing dilute liquid storage tank 53. That is, the dilute liquid replenishing device is constructed of the replenishing conduit 91, the replenishing dilute liquid feed pump 76, and the replenishing dilute liquid storage tank 53.

The foregoing replenishing stock liquid feed pump 74 and replenishing dilute liquid feed pump 76 are controlled by a control device (control unit) 50 provided with a control ROM 51a or a control RAM 51b as condition storing means based on signals from the electric conductivity sensor 73 and a time measuring section 52. Also, the control device 50 actuates the delivery rolls 22, the brush rolls 24, the squeeze rolls 26, and the like at proper timing based on a signal from a plate detecting sensor 27, to deliver the PS plate.

Further, in the control device 50, the time measuring section 52 measures an elapsed time from a point in time of the last integration of replenishment due to aging, an elapsed time from a point in time of the last measurement of electric conductivity, and an elapsed time from the last replenishment, the area of the plate is calculated based on a signal from the plate detecting sensor 27, and the electric conductivity of the developer is measured by the electric conductivity sensor 73. If necessary, the control device 50 feeds a development replenisher (the development replenisher stock liquid 58 and the replenishing dilute liquid 57) into the developing tank 20 from the replenishing stock liquid storage tank 55 and the replenishing dilute liquid storage tank 53 at predetermined replenishing amount and replenisher diluting rate while utilizing these values.

Next, the control by the control device 50 will be described below. FIGS. 2 to 12 are each an example of a flow chart exhibiting the control system by the control device 50. Schematically, in the basic control system of the invention shown in FIG. 2, the replenishing amount due to aging and the replenishing amount due to processing necessary for keeping the developer activity are operated based on a predetermined provisional setting value of replenishing amount due to aging and a predetermined provisional setting value of replenishing amount due to processing; and by comparing an operating value of electric conductivity determined by these values with an electric conductivity value of the developer measured in a predetermined fixed time interval, the foregoing setting value of replenishing amount due to aging and setting value of replenishing amount due to processing are increased or decreased for revision, thereby replenishing the necessary replenishing amount due to aging and replenishing amount due to processing. In this way, even when the processing conditions such as the type of plate, the size of plate, and the processing frequency and the circumferential conditions such as the concentration of circumferential carbon dioxide gas and the humidity are changed, it is possible to carry out the replenishment based on proper replenishing amount due to aging and replenishing amount due to processing.

Figure 2:
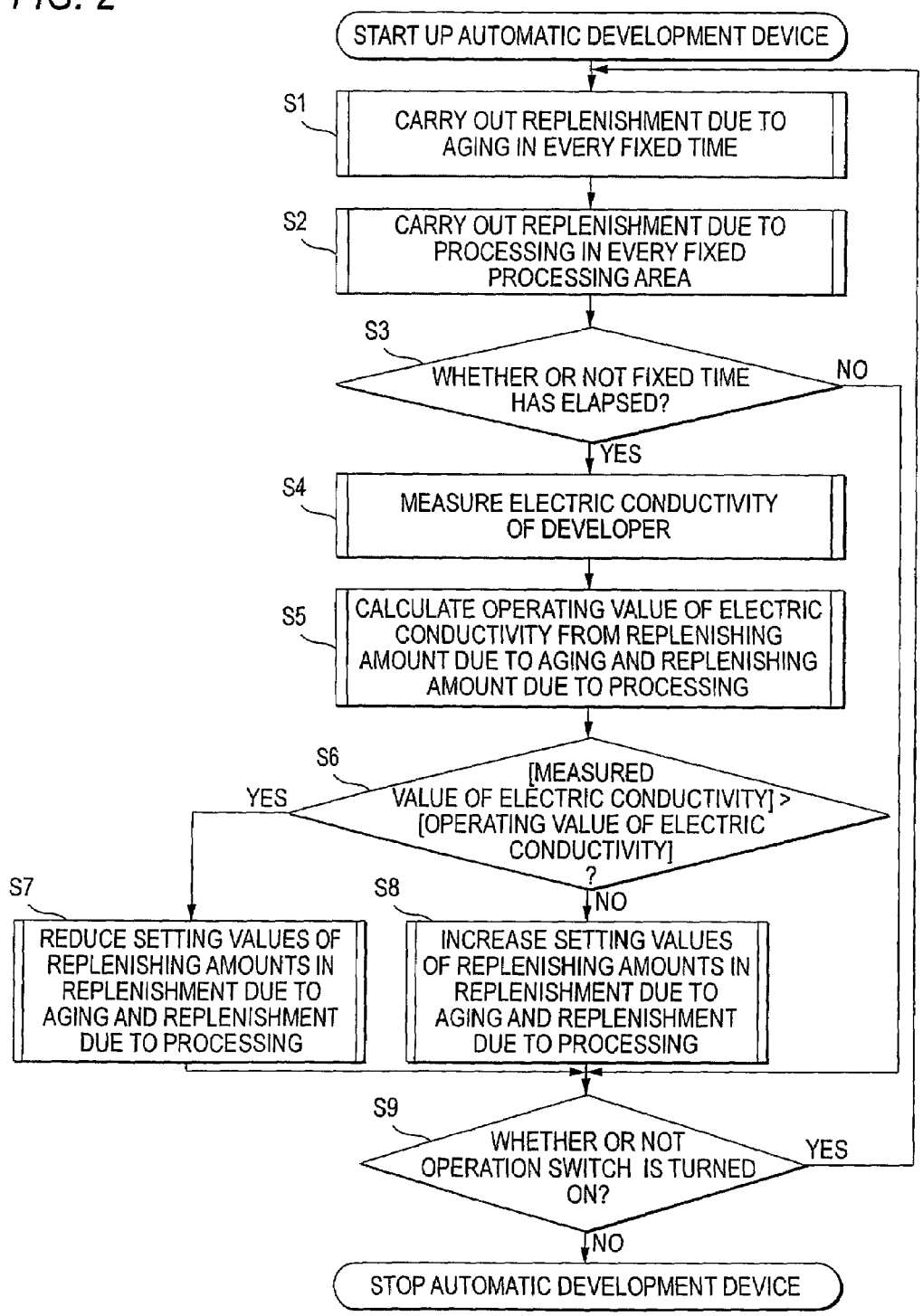
FIG. 2 is a flow chart exhibiting the basic control contents by a control device in the developer replenishing method according to the invention.

First of all, the control processing of FIG. 2 will be described below.

In step 1 (hereinafter abbreviated as "S1"), if every predetermined fixed time has elapsed, the amount of a replenisher due to aging calculated from the setting value of replenishing amount due to aging and the elapsed time is replenished. Next, in S2, if the plate is processed in every predetermined fixed area, the amount of a replenisher due to processing calculated from the setting value of replenishing amount due to processing and the processing area is replenished. In S3, whether the elapsed time from the start-up time or a point of time of the last measurement of electric conductivity of the developer has reached a predetermined fixed time is judged, and when the elapsed time has reached, the control goes to S4, whereas when the elapsed time has not reached, the control goes to S9.

In S4, the electric conductivity of the developer is measured. Next, in S5, a calculating value of. electric conductivity is calculated from the replenished replenishing amount due to aging and replenishing amount due to processing. In S6, the calculating value of electric conductivity is compared with the foregoing measured value of electric conductivity, and when the measured value of electric conductivity is larger, the control goes to S7, whereas when the measured value of electric conductivity is smaller, the control goes to S8.

In S7, both the setting value of replenishment due to processing and the setting value of replenishment due to aging are reduced by predetermined amounts. On the other hand, in S8, both the setting value of replenishment due to processing and the setting value of replenishment due to aging are conversely increased by predetermined amounts.

In S9, the state of an operation switch of the automatic processor is examined, and when the operation switch is turned on, the control returns to S1, whereas when the operation switch is turned off, the processing is ended by stopping of the device.

Figure 3:
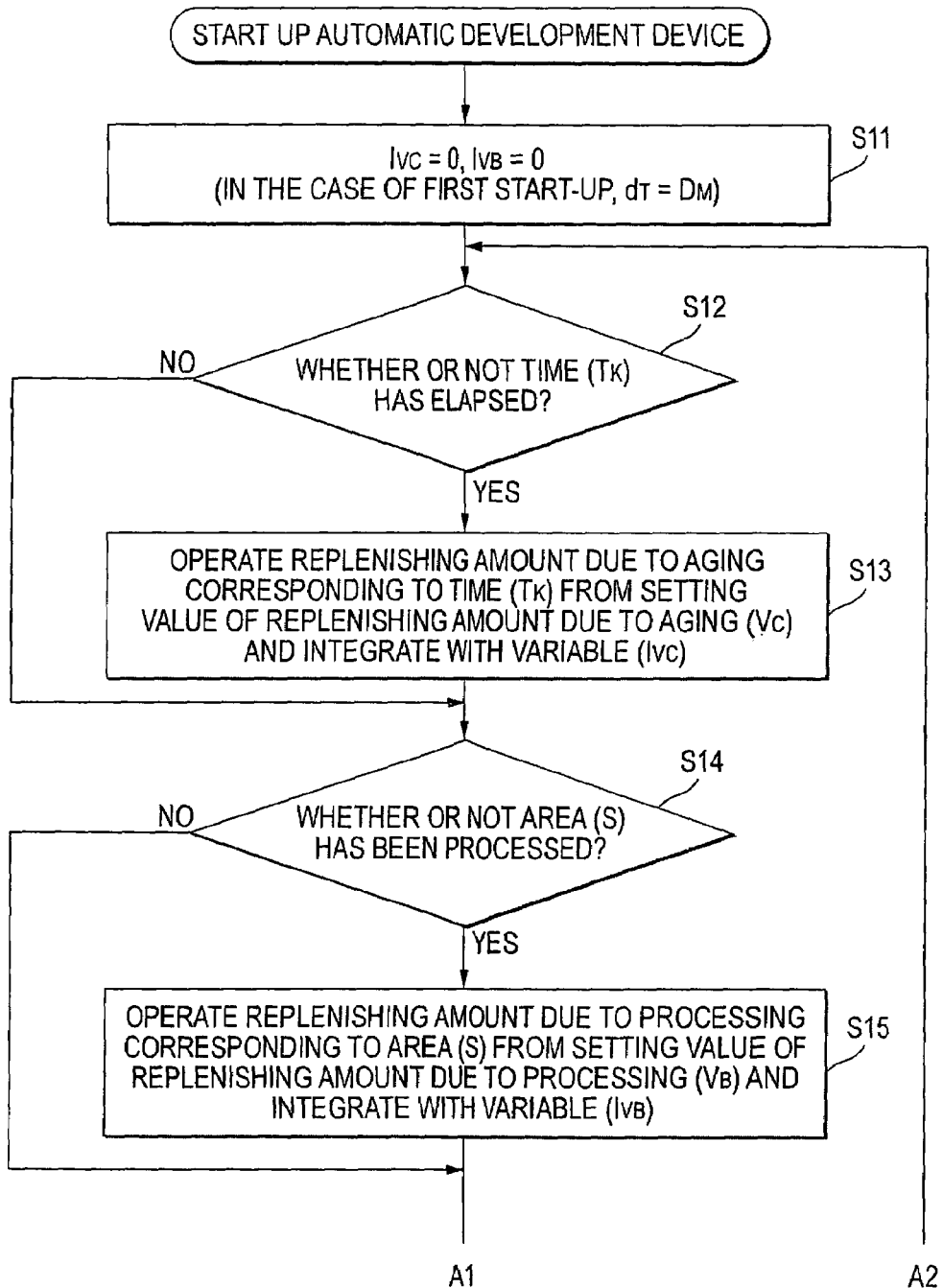
FIG. 3 is a flow chart 1 exhibiting the first control contents by a control device in the developer replenishing method according to the invention.
Figure 4:
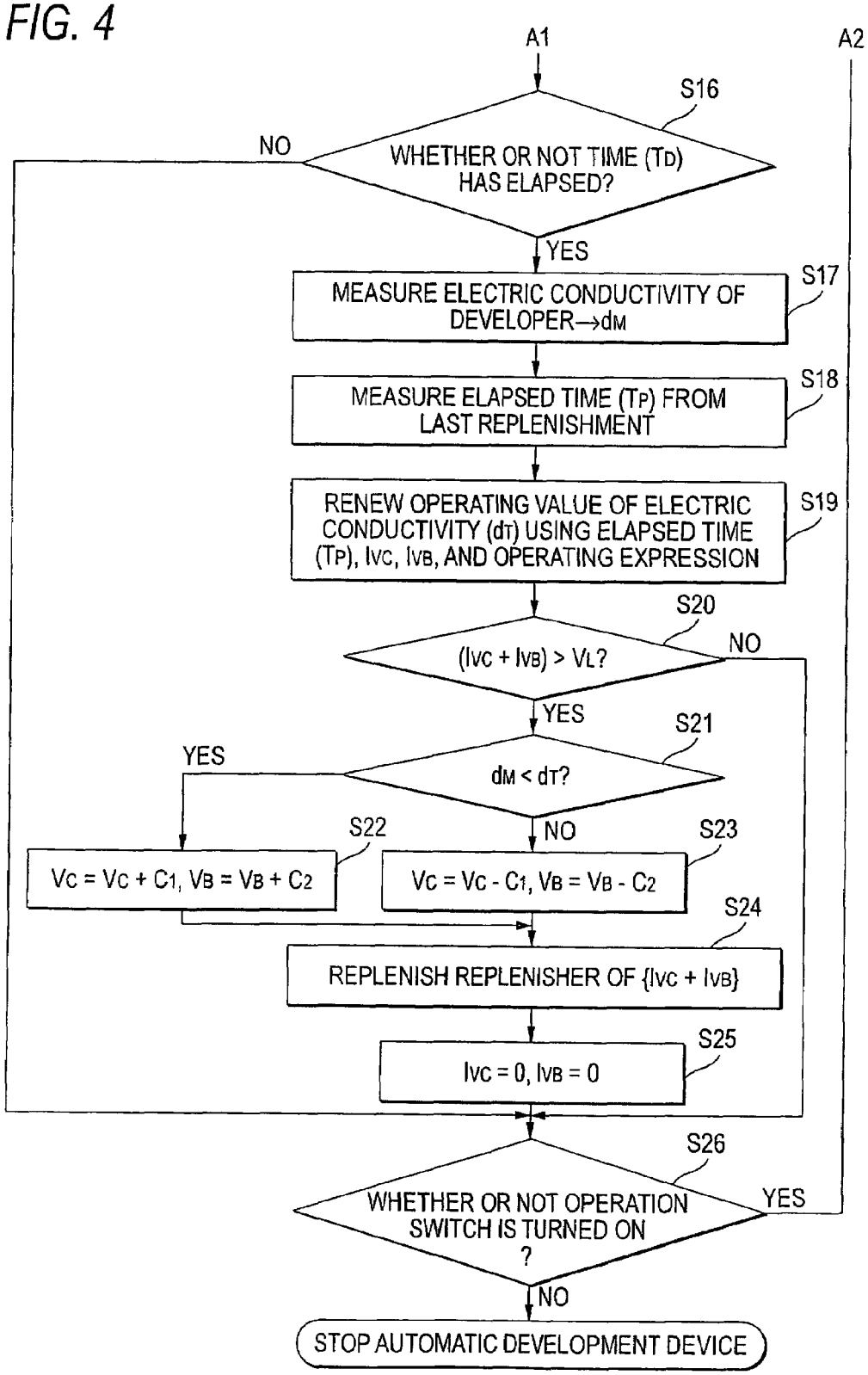
FIG. 4 is a flow chart 2 exhibiting the first control contents by a control device in the developer replenishing method according to the invention.

Next, the first control processing which specifically shows the foregoing basic control processing will be described below with reference to FIGS. 3 and 4.

In S11, an integrating value of replenishment due to aging ($I_{VC}$) and an integrating value of replenishment due to processing ($I_{VB}$), both of which are a variable to be used during the control, are initialized, i.e., 0 is substituted. Also, in the case of the first start-up, $d_T$ is substituted with an electric conductivity value ($D_M$) at which an empirically predetermined sensitivity of the developer becomes proper.

In S12, whether the elapsed time from the start-up time or a point of time of the last integration of replenishing amount due to aging has reached a predetermined time ($T_K$) is judged, and when the elapsed time has reached, the control goes to S13, whereas when the elapsed time has not reached, the control goes to S14. In S13, the replenishing amount due to aging which becomes necessary at the elapsed time ($T_K$) is operated from a setting value of replenishing amount due to aging ($V_C$) and integrated with $I_{VC}$. For example, the operation is carried out according to the following expression.

$$I_{VC} + V_C \times T_K \rightarrow I_{VC} \qquad (1)$$

In S14, whether the processing area of the start-up time or from the last integration of replenishing amount due to processing has reached a predetermined processing area (S) is judged, and when the processing has been performed, the control goes to S15, whereas when the processing has not been performed, the control goes to S16. In S15, the replenishing amount due to processing which becomes necessary in a processing area (S) is operated from a setting value of replenishing amount due to processing ($V_B$) and integrated with $I_{VB}$. For example, the operation is carried out according to the following expression.

$$I_{VB} + V_B \times S \rightarrow I_{VB} \qquad (2)$$

Next, in S16, whether the elapsed time from the start-up time or a point in time of the last measurement of electric conductivity of the developer has reached a predetermined time ($T_D$) is judged, and when the elapsed time has reached, the control goes to S17, whereas when the elapsed time has not reached, the control goes to S26.

In S17, an electric conductivity of the developer is measured, and its value is substituted for a variable ($d_M$). In next S18, an elapse time ($T_P$) from a point in time of the last replenishment is measured. Further, in next S19, an operating value of electric conductivity ($d_T$) is renewed using an elapsed time ($T_P$), $I_{VC}$, $I_{VB}$, and a prescribed operating expression. At this time, for example, the following expression (3) can be employed as the operating expression to be used.

$$d_T = [V_T \times d_{T_0} + V_C \times T_P \times D_C + (I_{VC} + I_{VB} - V_C \times T_P) \times D_B] \div (V_T + I_{VC} + I_{VB}) \qquad (3)$$

In the expression, $d_{T_0}$ represents $d_T$ before the renewal; $V_T$ represents the amount of the developer in the developing tank; and $D_C$ and $D_B$ each represents an empirically predetermined constant.

In next S20, the integrating amount of replenishing amounts ($I_{VC} + I_{VB}$) is compared with a predetermined replenishing amount per one time ($V_L$), and when ($I_{VC} + I_{VB}$) is larger, the control goes to S21, whereas when ($I_{VC}+I_{VB}$) is not larger, the control goes to S26. In S21, $d_M$ is compared with $d_T$, and when $d_M$ is smaller, the control goes to S22, whereas when $d_M$ is not smaller, the control goes to S23.

In S22, a predetermined constant ($C_1$) is added to the setting value of replenishing amount due to aging ($V_C$), and a predetermined constant ($C_2$) is added to the setting value of replenishing amount due to processing ($V_B$). In S23, $C_1$ is reduced from $V_C$, and $C_2$ is reduced from $V_B$.

In next S24, the developer is replenished with a replenisher in an amount of ($I_{VC}+I_{VB}$); and in next S25, $I_{VC}$ and $I_{VB}$ are initialized. That is, 0 is respectively substituted therein.

In S26, the state of an operation switch of the automatic processor is examined, and when the operation switch is turned on, the control returns to S12, whereas when the operation switch is turned off, the processing is ended by stopping of the device.

Figure 5:
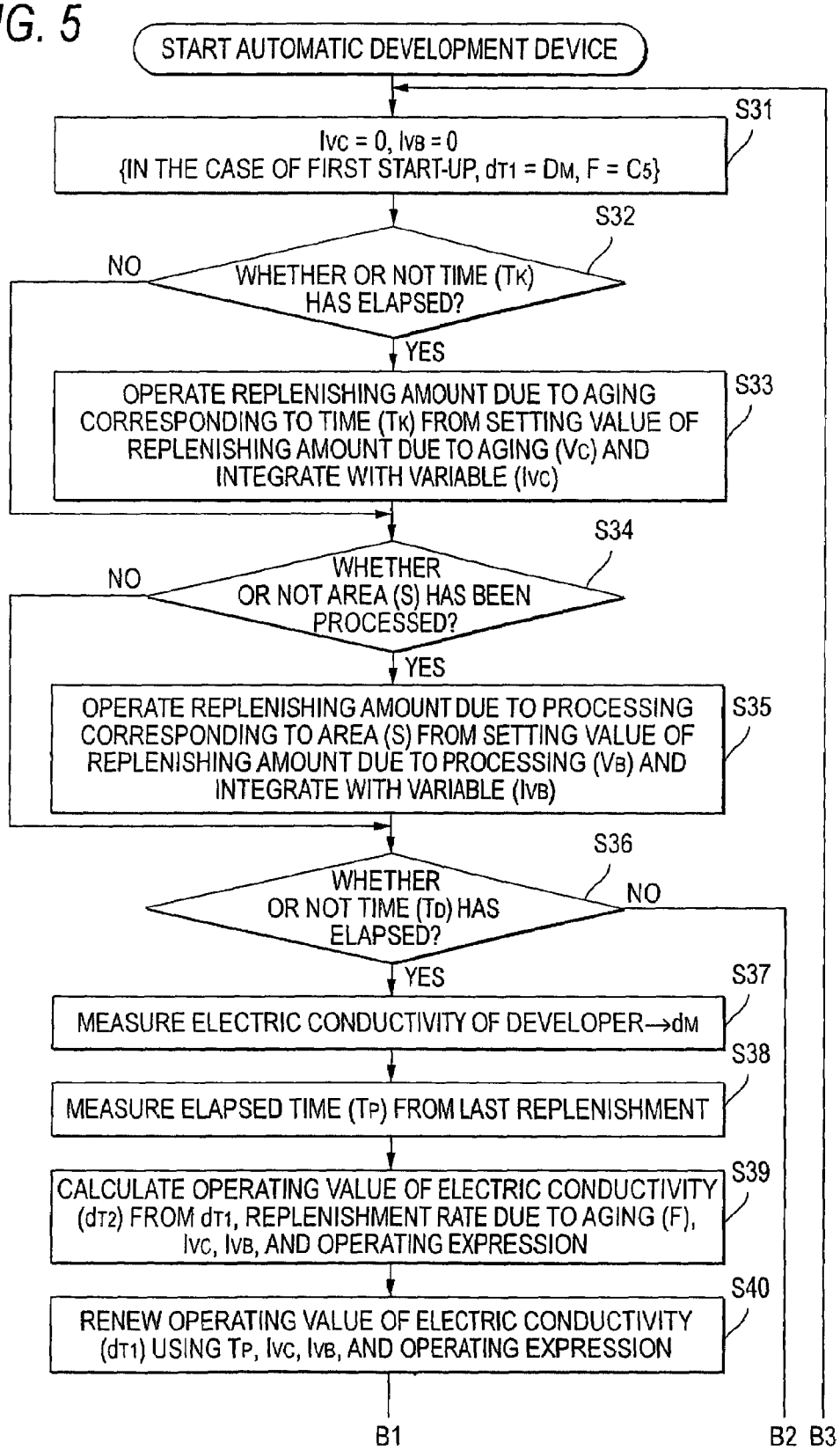
FIG. 5 is a flow chart 1 exhibiting the second control contents by a control device in the developer replenishing method according to the invention.
Figure 6:
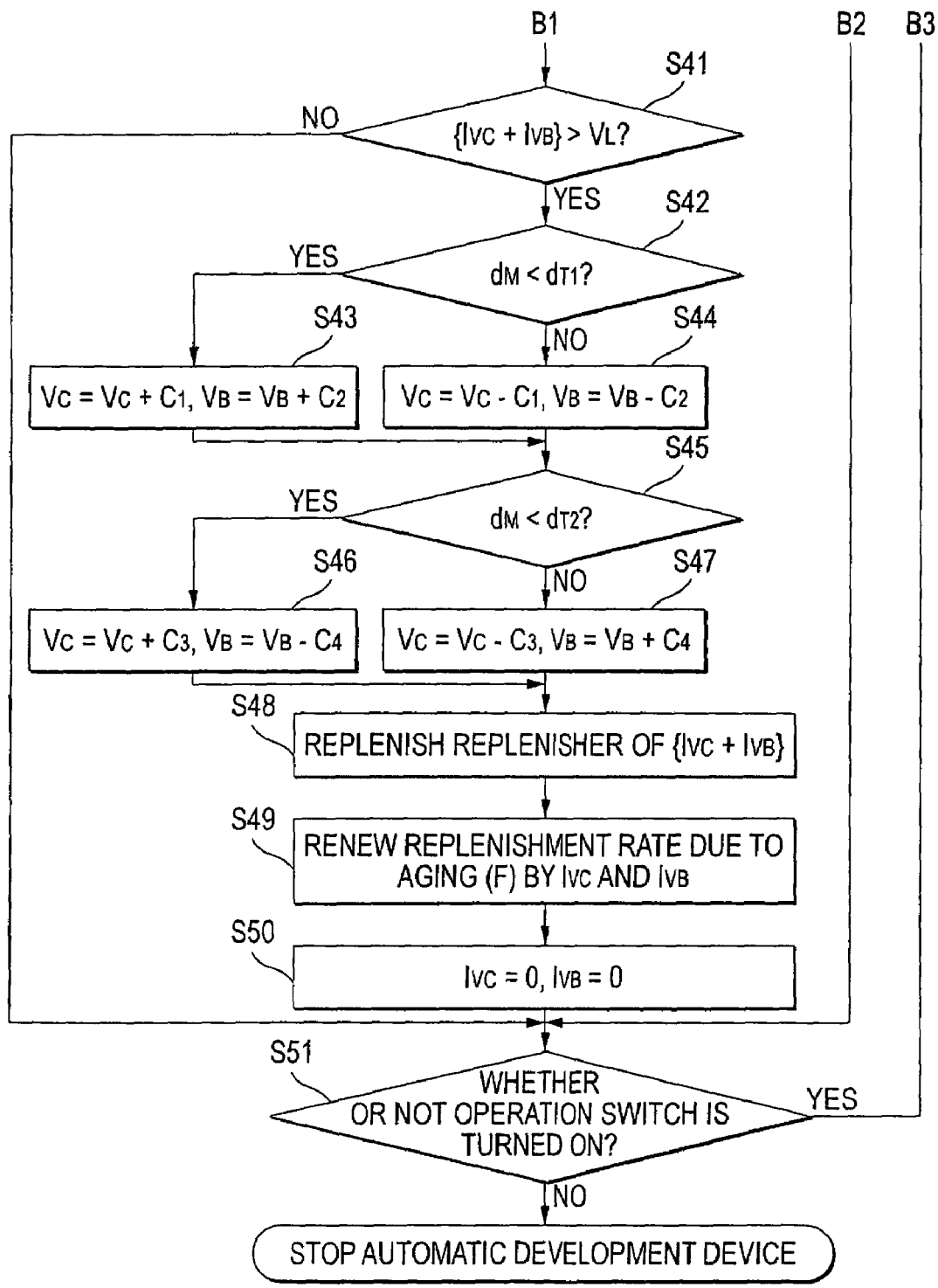
FIG. 6 is a flow chart 2 exhibiting the second control contents by a control device in the developer replenishing method according to the invention.

Next, the second control processing will be described below with reference to FIGS. 5 and 6.

In S31, an integrating value of replenishment due to aging ($I_{VC}$) and an integrating value of replenishment due to processing ($I_{VB}$), both of which are a variable to be used during the control, are initialized, i.e., 0 is substituted. Also, in the case of the first start-up, $d_{T1}$ is substituted with an electric conductivity value ($D_M$) at which an empirically predetermined sensitivity of the developer becomes proper.

In S32, whether the elapsed time from the start-up time or a point of time of the last integration of replenishing amount due to aging has reached a predetermined time ($T_K$) is judged, and when the elapsed time has reached, the control goes to S33, whereas when the elapsed time has not reached, the control goes to S34. In S33, the replenishing amount due to aging which becomes necessary at the elapsed time ($T_K$) is operated from a setting value of replenishing amount due to aging ($V_C$) and integrated with $I_{VC}$. For example, the operation is carried out according to the following expression.

$$I_{VC}+V_C \times T_K \to I_{VC} \quad (4)$$

In S34, whether the processing area of the start-up time or from the last integration of replenishing amount due to processing has reached a predetermined processing area (S) is judged, and when the processing has been performed, the control goes to S35, whereas when the processing has not been performed, the control goes to S36. In S35, the replenishing amount due to processing which becomes necessary in a processing area (S) is operated from a setting value of replenishing amount due to processing ($V_B$) and integrated with $I_{VB}$. For example, the operation is carried out according to the following expression.

$$I_{VB}+V_B \times S \to I_{VB} \quad (5)$$

Next, in S36, whether the elapsed time from the start-up time or a point in time of the last measurement of electric conductivity of the developer has reached a predetermined time ($T_D$) is judged, and when the elapsed time has reached, the control goes to S37, whereas when the elapsed time has not reached, the control goes to S51.

In S37, an electric conductivity of the developer is measured, and its value is substituted for a variable ($d_M$). In next S38, an elapse time ($T_P$) from a point in time of the last replenishment is measured.

In next S39, an operating value 2 of electric conductivity ($d_{T2}$) is calculated from $d_{T1}$, F, $I_{VC}$, $I_{VB}$, and a prescribed operating expression. At this time, for example, the following expression is suitable as the operating expression.

$$d_{T2}=[V_T \times d_{T1}+(I_{VC}+I_{VB}) \times F \times D_C+(I_{VC}+I_{VB}) \times (1-F) \times D_B] \div (V_T+I_{VC}+I_{VB}) \quad (6)$$

Further, in next S40, an operating value 1 of electric conductivity ($d_{T1}$) is renewed using $V_C$, $T_P$, $I_{VC}$, $I_{VB}$, and a prescribed operating expression. At this time, for example, the following expression is suitable as the operating expression.

$$d_{T1}=[V_T \times d_{T1o}+V_C \times T_P \times D_C+(I_{VC}+I_{VB}-V_C \times T_P) \times D_B] \div (V_T+I_{VC}+I_{VB}) \quad (7)$$

In the expression, $d_{T1o}$ represents $d_{T1}$ before the renewal; $V_T$ represents the amount of the developer in the developing tank; and $D_C$ and $D_B$ each represents an empirically predetermined constant.

In next S41, the integrating amount of replenishing amounts ($I_{VC}+I_{VB}$) is compared with a predetermined replenishing amount per one time ($V_L$), and when ($I_{VC}+I_{VB}$) is larger, the control goes to S42, whereas when ($I_{VC}+I_{VB}$) is not larger, the control goes to S51.

In S42, the electric conductivity of the developer ($d_M$) is compared with the operating value 1 of electric conductivity ($d_{T1}$), and when $d_M$ is smaller, the control goes to S43, whereas when $d_M$ is not smaller, the control goes to S44.

In S43, a predetermined constant ($C_1$) is added to the setting value of replenishing amount due to aging ($V_C$), and in S44, $C_1$ is reduced from $V_C$. On the other hand, in S43, a predetermined constant ($C_2$) is added to the setting value of replenishing amount due to processing ($V_B$), and in S44, $C_2$ is reduced from $V_B$.

In next S45, the electric conductivity of the developer ($d_M$) is compared with an operating value 2 of electric conductivity ($d_{T2}$), and when $d_M$ is smaller, the control goes to S46, whereas when $d_M$ is not smaller, the control goes to S47.

In S46, a predetermined constant ($C_3$) is added to $V_C$, and in S47, $C_3$ is reduced from $V_C$. On the other hand, in S46, a predetermined constant ($C_4$) is reduced from $V_B$, and in S47, $C_4$ is added to $V_B$.

In next S48, the developer is replenished with a replenisher in an amount of ($I_{VC}+I_{VB}$). Further, in next S49, the value of F is renewed by the ($I_{VC}+I_{VB}$) value. For example, the renewal of the F value is suitably carried out according to the following expression.

$$(V_L \times F+I_{VC}) \div (V_L+I_{VC}+I_{VB}) \to F \quad (8)$$

Also, in next S50, $I_{VC}$ and $I_{VB}$ are initialized. That is, 0 is respectively substituted therein.

In S51, the state of an operation switch of the automatic processor is examined, and when the operation switch is turned on, the control returns to S32, whereas when the operation switch is turned off, the processing is ended by stopping of the device.

Next, the third control processing will be described below with reference to FIGS. 7 and 8.

In S61, an integrating value of replenishment due to aging ($I_{VC}$) and an integrating value of replenishment due to processing ($I_{VB}$), both of which are a variable to be used during the control, are initialized, i.e., 0 is substituted. Also, whether this automatic development device is first started up is judged, and in the case of the first start-up, a displacement rate of a replenisher (X) and a replenishment rate due to aging (F) are initialized, i.e., 0 is substituted for X, and $C_5$ is substituted for F.

In S62, whether the elapsed time from the start-up time or a point of time of the last integration of replenishing amount due to aging has reached a predetermined time ($T_K$) is judged, and when the elapsed time has reached, the control goes to S63, whereas when the elapsed time has not reached, the control goes to S64. In S63, the replenishing amount due to aging which becomes necessary at the elapsed time ($T_K$) is operated from a setting value of replenishing amount due to aging ($V_C$) and integrated with $I_{VC}$. For example, the operation is carried out according to the following expression.

$$I_{VC}+V_C \times T_K \to I_{VC} \quad (9)$$

In S64, whether the processing area of the start-up time or from the last integration of replenishing amount due to processing has reached a predetermined processing area (S) is judged, and when the processing has been performed, the control goes to S65, whereas when the processing has not been performed, the control goes to S66. In S65, the replenishing amount due to processing which becomes necessary in a processing area (S) is operated from a setting value of replenishing amount due to processing ($V_B$) and integrated with $I_{VB}$. For example, the operation is carried out according to the following expression.

$$I_{VB}+V_B \times S \to I_{VB} \quad (10)$$

Next, in S66, whether the elapsed time from the start-up time or from a point in time of the last measurement of electric conductivity of the developer has reached a predetermined time ($T_D$) is judged, and when the elapsed time has reached, the control goes to S67, whereas when the elapsed time has not reached, the control goes to S82.

In S67, an electric conductivity of the developer is measured, and its value is substituted for a variable ($d_M$). In next S68, an elapse time ($T_P$) from a point in time of the last replenishment is measured. Further, in next S69, an operating value 1 of electric conductivity ($d_{T1}$) is calculated from the displacement rate of replenisher (X), the replenishment rate due to aging (F), and a prescribed operating expression. At this time, for example, the following expression is suitable as the operating expression.

$$d_{T1}=(1-X) \times D_M+X \times [(1-F) \times D_B+F \times D_C] \quad (11)$$

In next S70, an operating value 2 of electric conductivity ($d_{T2}$) is calculated from $d_{T1}$, $T_P$, ($I_{VC}+I_{VB}$), and a prescribed operating expression. At this time, for example, the following expression is suitable as the operating expression.

$$d_{T2}=[V_T \times d_{T1}+V_C \times T_P \times D_C+(I_{VC}+I_{VB}-V_C \times T_P) \times D_B] \div (V_T+I_{VC}+I_{VB}) \quad (12)$$

In the expression, $V_T$ represents a volume of the developing tank of the automatic development device.

Further, in next S71, an operating value 3 of electric conductivity ($d_{T3}$) is calculated from $d_{T1}$, ($I_{VC}+I_{VB}$), F, and a prescribed operating expression. At this time, for example, the following expression is suitable as the operating expression.

$$d_{T3}=[V_T \times d_{T1}+(I_{VC}+I_{VB}) \times F \times D_C+(I_{VC}+I_{VB}) \times (1-F) \times D_B] \div (V_T+I_{VC}+I_{VB}) \quad (13)$$

In next S72, the integrating amount of replenishing amounts ($I_{VC}+I_{VB}$) is compared with a predetermined replenishing amount per one time ($V_L$), and when ($I_{VC}+I_{VB}$) is larger, the control goes to S73, whereas when ($I_{VC}+I_{VB}$) is not larger, the control goes to S82.

In S73, the electric conductivity of the developer ($d_M$) is compared with the operating value 2 of electric conductivity ($d_{T2}$), and when $d_M$ is smaller, the control goes to S74, whereas when $d_M$ is not smaller, the control goes to S75.

In S74, a predetermined constant ($C_1$) is added to the setting value of replenishing amount due to aging ($V_C$), and in S75, $C_1$ is reduced from $V_C$. On the other hand, in S74, a predetermined constant ($C_2$) is added to the setting value of replenishing amount due to processing ($V_B$), and in S75, $C_2$ is reduced from $V_B$.

In next S76, the electric conductivity of the developer ($d_M$) is compared with an operating value 3 of electric conductivity ($d_{T3}$), and when $d_M$ is smaller, the control goes to S77, whereas when $d_M$ is not smaller, the control goes to S78.

In S77, a predetermined constant ($C_3$) is added to $V_C$, and in S78, $C_3$ is reduced from $V_C$. On the other hand, in S77, a predetermined constant ($C_4$) is reduced from $V_B$, and in S78, $C_4$ is added to $V_B$.

In next S79, the developer is replenished with a replenisher in an amount of ($I_{VC}+I_{VB}$). Further, in next S80, the values of X and F are renewed by the ($I_{VC}+I_{VB}$) value. For example, the renewal of the values is suitably carried out according to the following expressions.

$$(V_T \times X+I_{VC}+I_{VB}) \div (V_T+I_{VC}+I_{VB}) \to X \quad (14)$$

$$(V_T \times X \times F+I_{VC}) \div (V_T \times X+I_{VC}+I_{VB}) \to F \quad (15)$$

Also, in next S81, $I_{VC}$ and $I_{VB}$ are initialized. That is, 0 is respectively substituted therein.

In S82, the state of an operation switch of the automatic processor is examined, and when the operation switch is turned on, the control returns to S62, whereas when the operation switch is turned off, the processing is ended by stopping of the device.

Next, the fourth control processing will be described below with reference to FIGS. 9, 10 and 11. This fourth control processing is one in which control processing exclusive for the start-up time of the automatic development device is added to the third control processing shown in FIGS. 7 and 8.

In S91, an integrating value of replenishment due to aging ($I_{VC}$) and an integrating value of replenishment due to processing ($I_{VB}$), both of which are a variable to be used during the control, are initialized, i.e., 0 is substituted. Also, whether this automatic development device is first started up, and in the case of the first start-up, a displacement rate of a replenisher (X) and a replenishment rate due to aging (F) are initialized, i.e., 0 is substituted for X, and $C_5$ is substituted for F. Here, the replenishment rate due to aging as used herein means a proportion of a replenisher due to aging in the replenisher which was replenished to the developing tank.

Next, in S92, whether the elapsed time from the start-up time or from a point of time of the last integration of replenishing amount due to aging has reached a predetermined time ($T_D$) is judged, and when the elapsed time has reached, the control goes to S93, whereas when the elapsed time has not reached, the control goes to S94.

In S93, an electric conductivity of the developer is measured, and its value is substituted for a variable ($d_M$). Further, in next S94, an operating value 1 of electric conductivity ($d_{T1}$) is calculated from the displacement rate of replenisher (X), the replenishment rate due to aging (F), and a prescribed operating expression. At this time, for example, the following expression is suitable as the operating expression.

$$d_{T1}=(1-X) \times D_M+X \times [(1-F) \times D_B+F \times D_C] \quad (16)$$

In the expression, $D_M$, $D_B$, and $D_C$ each represents an empirically predetermined constant.

In next S95, $d_M$ is compared with $d_{T1}$, and when $d_M$ is smaller, the control goes to S96, whereas when $d_M$ is not smaller, the control goes to S102.

In S96, the developer is replenished with a replenisher in an amount of $V_L$. Further, in next S97, the values of X and F are renewed by the value of $V_L$. For example, the renewal of the values is suitably carried out according to the following expressions.

$$(V_T \times X+V_L) \div (V_T+V_L) \to X \quad (17)$$

$$(V_T \times X \times F+V_L) \div (V_T \times X+V_L) \to F \quad (18)$$

In S98, the state of an operation switch of the automatic processor is examined, and when the operation switch is turned on, the control returns to S92, whereas when the operation switch is turned off, the processing is ended by stopping of the device.

When the process goes to S102, it becomes first possible to subject the photosensitive material to development processing. Accordingly, for example, at this time, it is displayed that the processing is possible.

Figure 7:
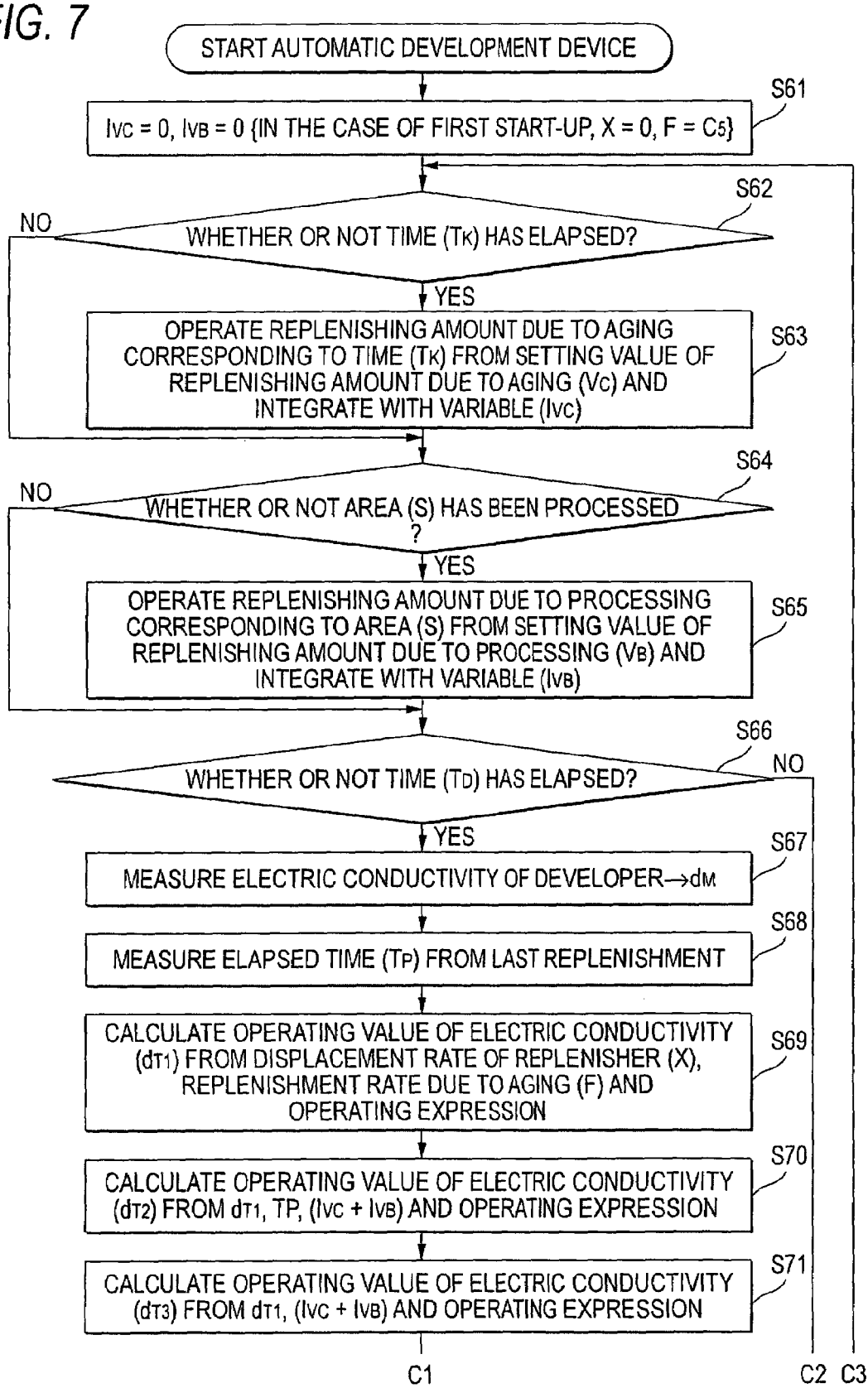
FIG. 7 is a flow chart 1 exhibiting the third control contents by a control device in the developer replenishing method according to the invention.
Figure 8:
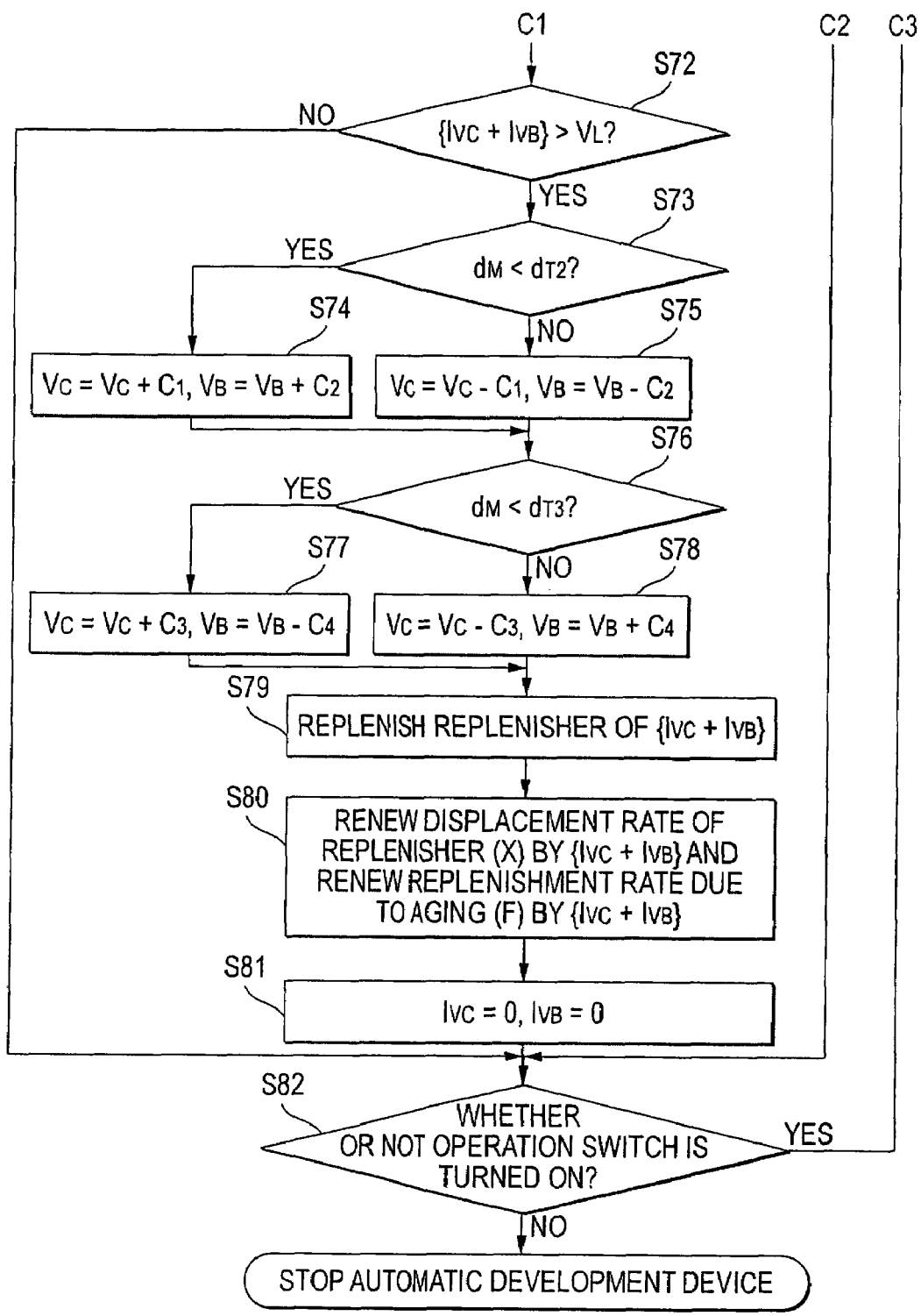
FIG. 8 is a flow chart 2 exhibiting the third control contents by a control device in the developer replenishing method according to the invention.

Steps of S102 to S128 are identical with S62 to S81 in the control processing shown in FIGS. 7 and 8, and therefore, the explanation therefor is omitted herein.

In S129, the state of an operation switch of the automatic processor is examined, and when the operation switch is turned on, the control returns to S102, whereas when the operation switch is turned off, the processing is ended by stopping of the device.

Figure 11:
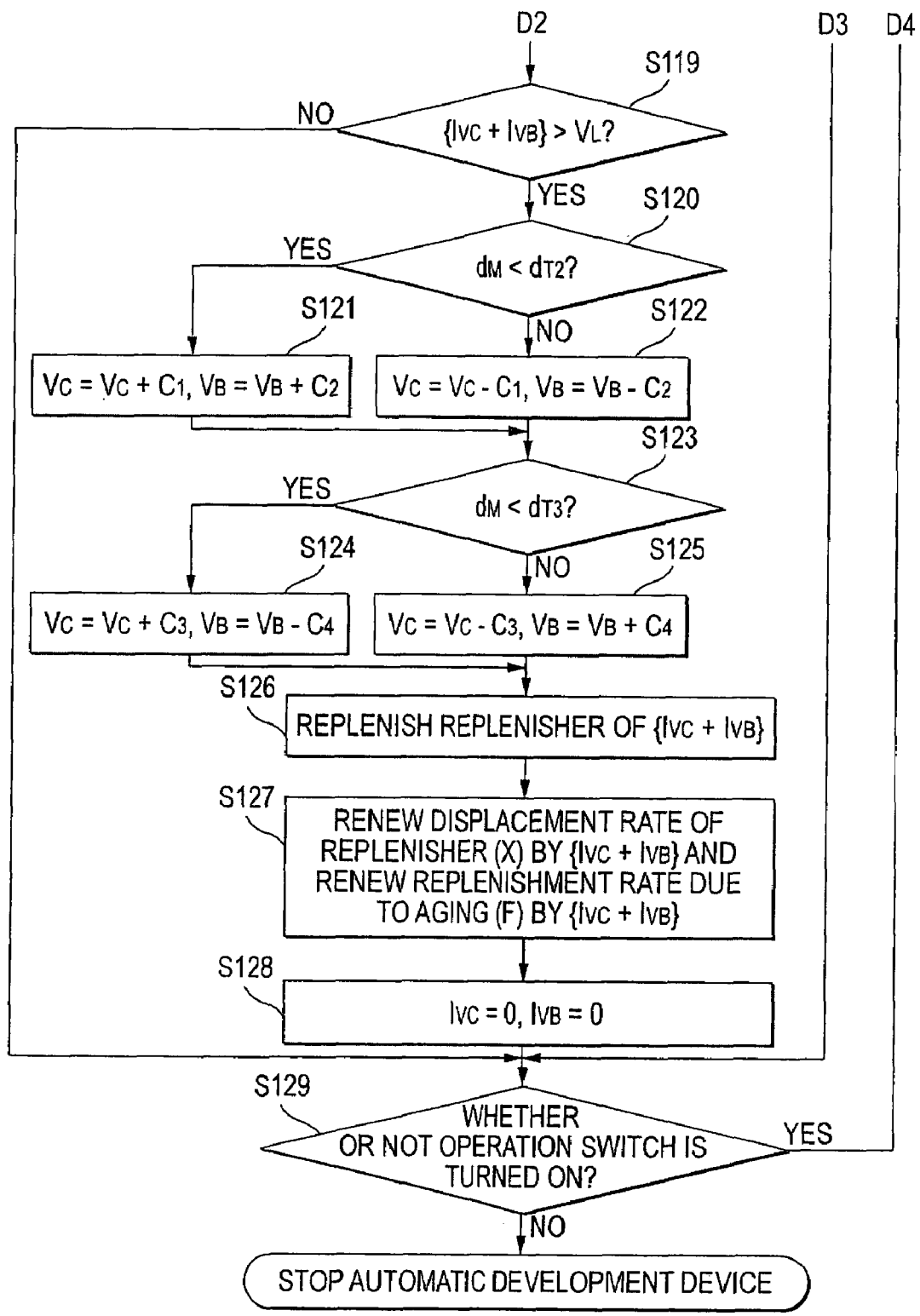
FIG. 11 is a flow chart 3 exhibiting the fourth control contents by a control device in the developer replenishing method according to the invention.
Figure 12:
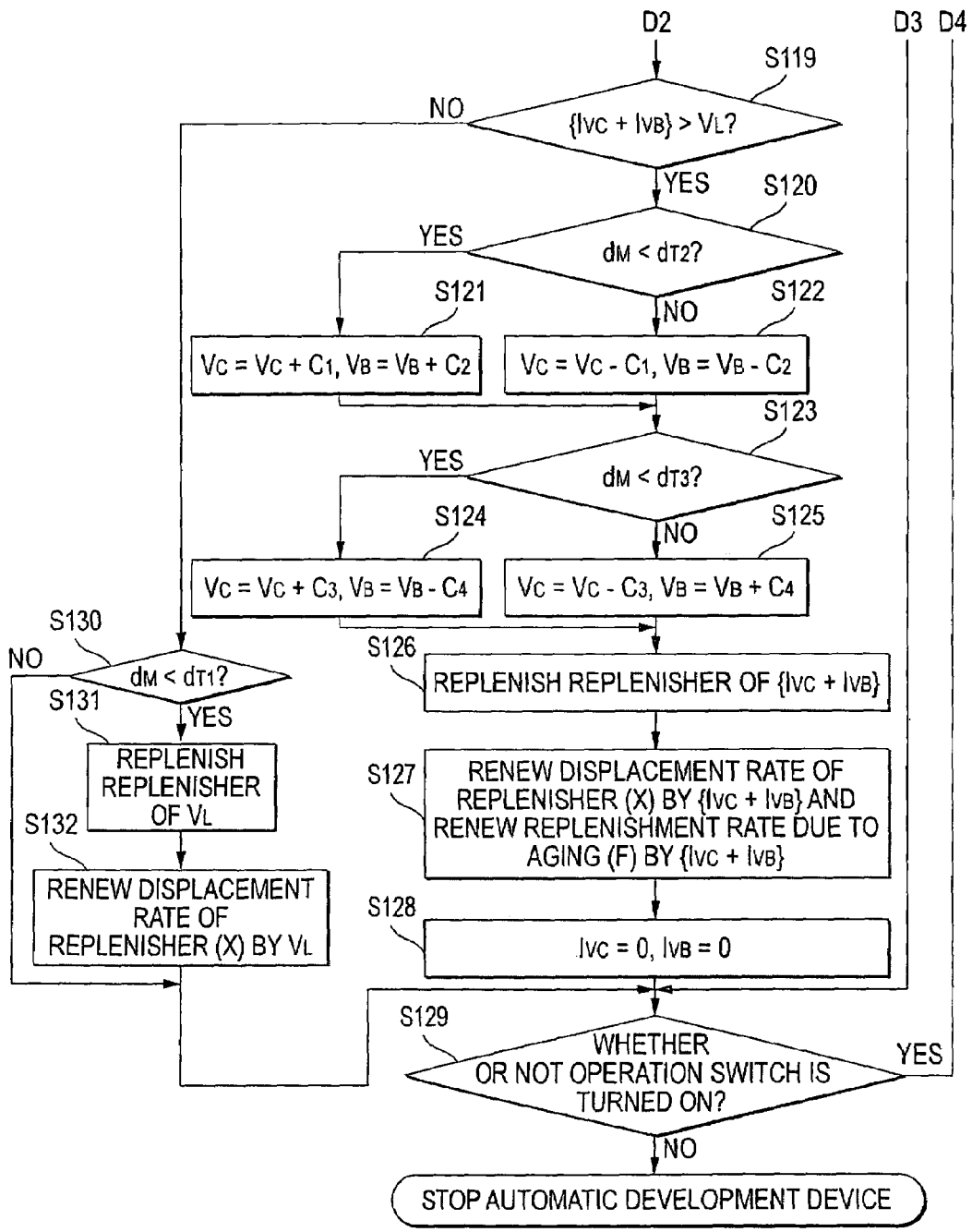
FIG. 12 is a flow chart exhibiting the fifth control contents by a control device in the developer replenishing method according to the invention.

Further, the fifth control processing by the control device 50 will be described below with reference to FIGS. 9, 10 and 12. This control processing is the same as the foregoing fourth control processing shown in FIGS. 9 to 11, except that the processing contents shown in FIG. 11 are replaced by those shown in FIG. 12, in which a replenishing action based on the operating value of electric conductivity is further added to the fourth control processing shown in FIGS. 9 to 11.

Figure 9:
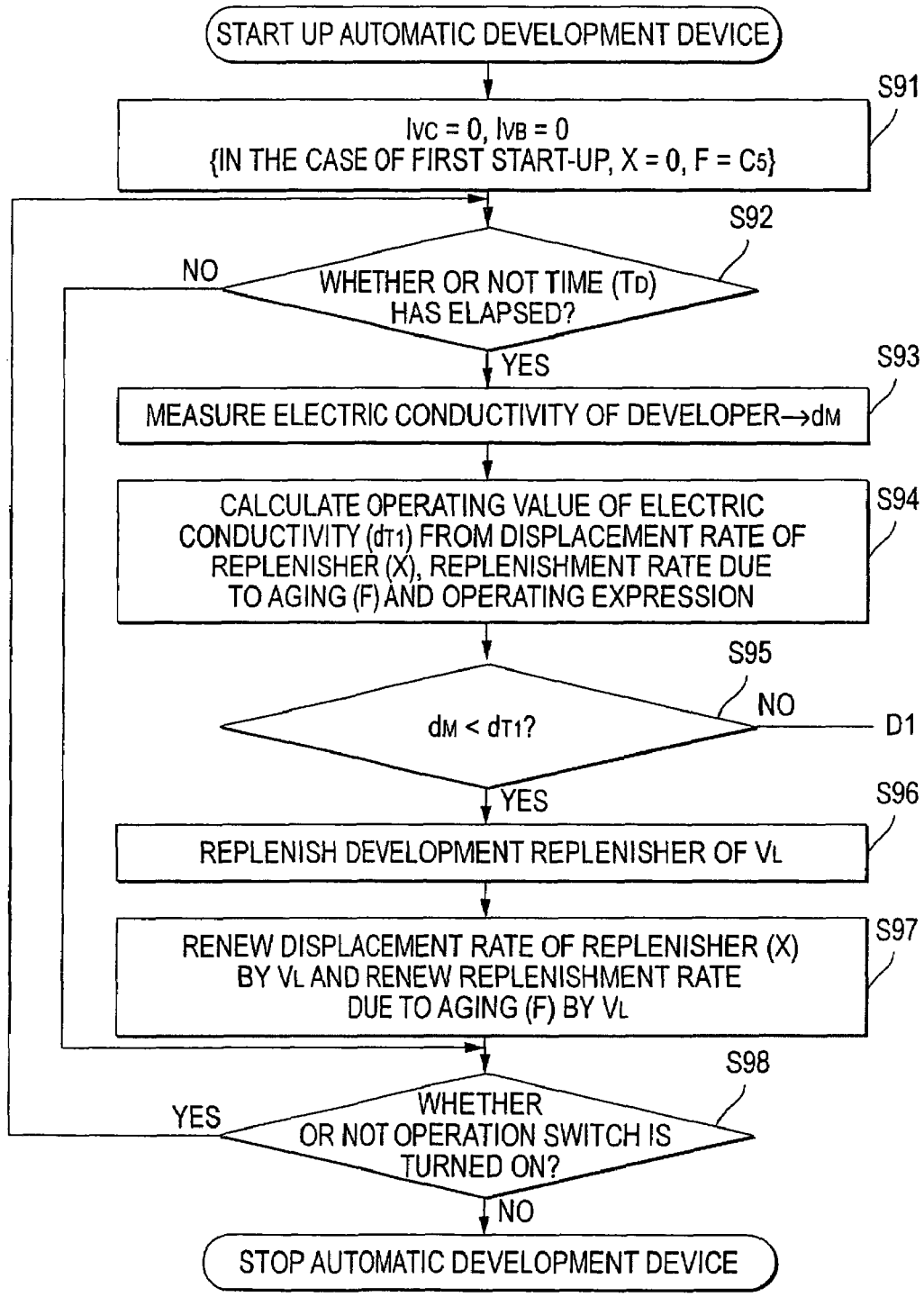
FIG. 9 is a flow chart 1 exhibiting the fourth control contents by a control device in the developer replenishing method according to the invention.
Figure 10:
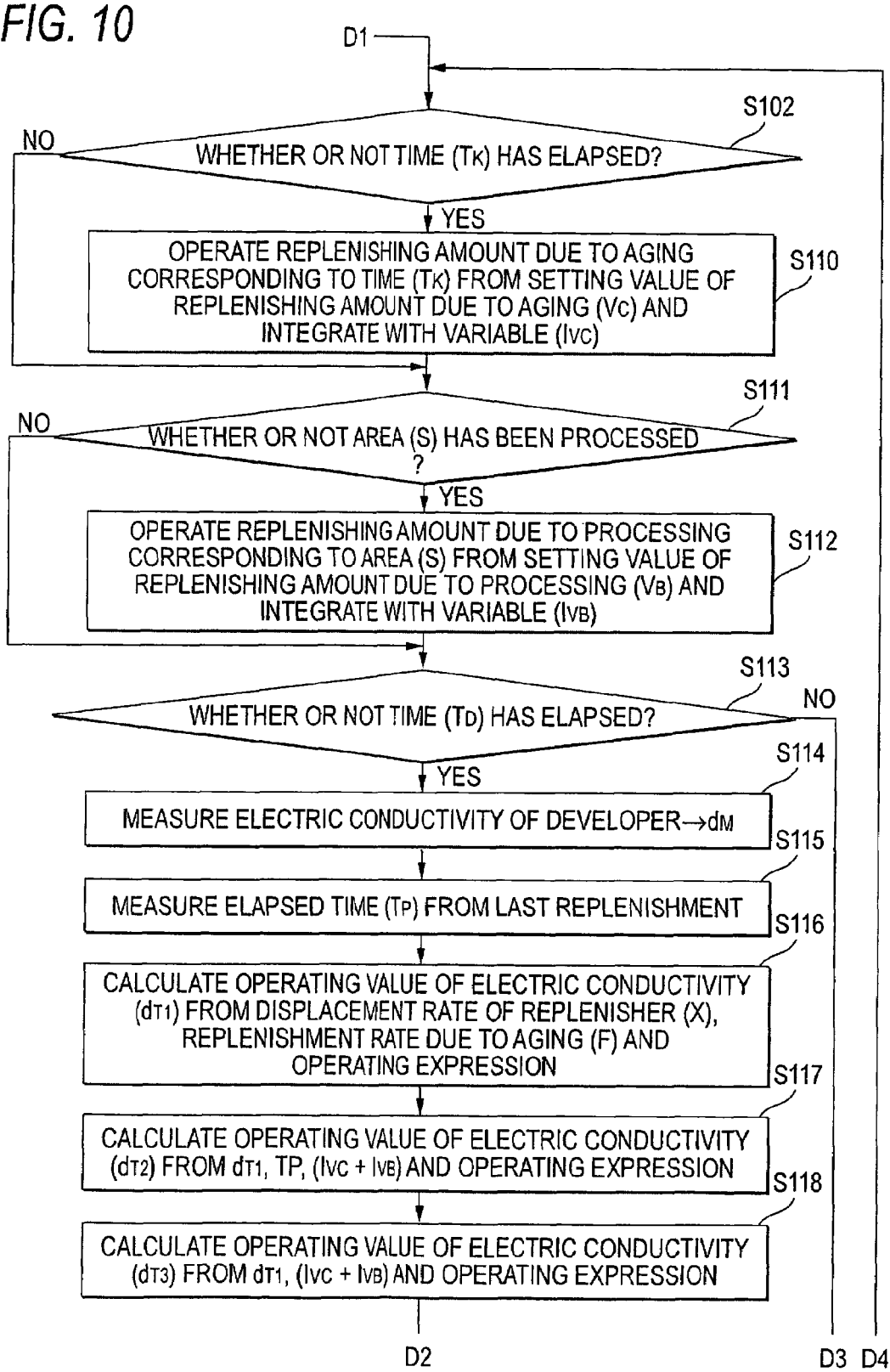
FIG. 10 is a flow chart 2 exhibiting the fourth control contents by a control device in the developer replenishing method according to the invention.

This control processing will be described below, but S91 to S118 shown in FIGS. 9 and 10 are the same as those described previously, and therefore, the explanation therefor is omitted.

Here, the control processing of FIG. 12 will be described in order.

In S119, the integrating amount of replenishing amounts ($I_{VC}+I_{VB}$) is compared with a predetermined replenishing amount per one time ($V_L$), and when ($I_{VC}+I_{VB}$) is larger, the control goes to S130, whereas when ($I_{VC}+I_{VB}$) is not larger, the control goes to S120.

In next S130, $d_M$ is compared with $d_{T1}$, and when $d_M$ is smaller, the control goes to S131, whereas when $d_M$ is not smaller, the control goes to S129.

In S131, the developer is replenished with a replenisher in an amount of $V_L$. Further, in next S132, the value of X is renewed by the value of $V_L$. For example, the renewal of the value is suitably carried out according to the following expression.

$$(V_T \times X + V_L) \div (V_T + V_L) \to X \quad (19)$$

On the other hand, in S120, the electric conductivity of the developer ($d_M$) is compared with the operating value 2 of electric conductivity ($d_{T2}$), and when $d_M$ is smaller, the control goes to S121, whereas when $d_M$ is not smaller, the control goes to S122.

The control contents of the subsequent S121 to S128 are the same as those described previously, and therefore, the explanation therefor is omitted.

In S129, the state of an operation switch of the automatic processor is examined, and when the operation switch is turned on, the control returns to S119, whereas when the operation switch is turned off, the processing is ended by stopping of the device.

According to the foregoing control of the automatic development device, by utilizing the value of electric conductivity of the developer, the replenishing amount due to aging and the replenishing amount due to processing are automatically revised. Accordingly, even when the processing conditions and circumferential conditions are changed, that is, the type, size and processing frequency of the photosensitive material, the concentration of circumferential carbon dioxide gas and the wind velocity of circumferential air are changed, it is possible to always set up proper replenishing amount due to aging and replenishing amount due to processing and to carry out development processing at a stable and fixed sensitivity. Therefore, it is possible to control a fluctuation of the sensitivity of a developer against the changes of the development processing condition in the minimum level while employing a simple and cheap construction in the developing section of the automatic development device.

Figure 13:
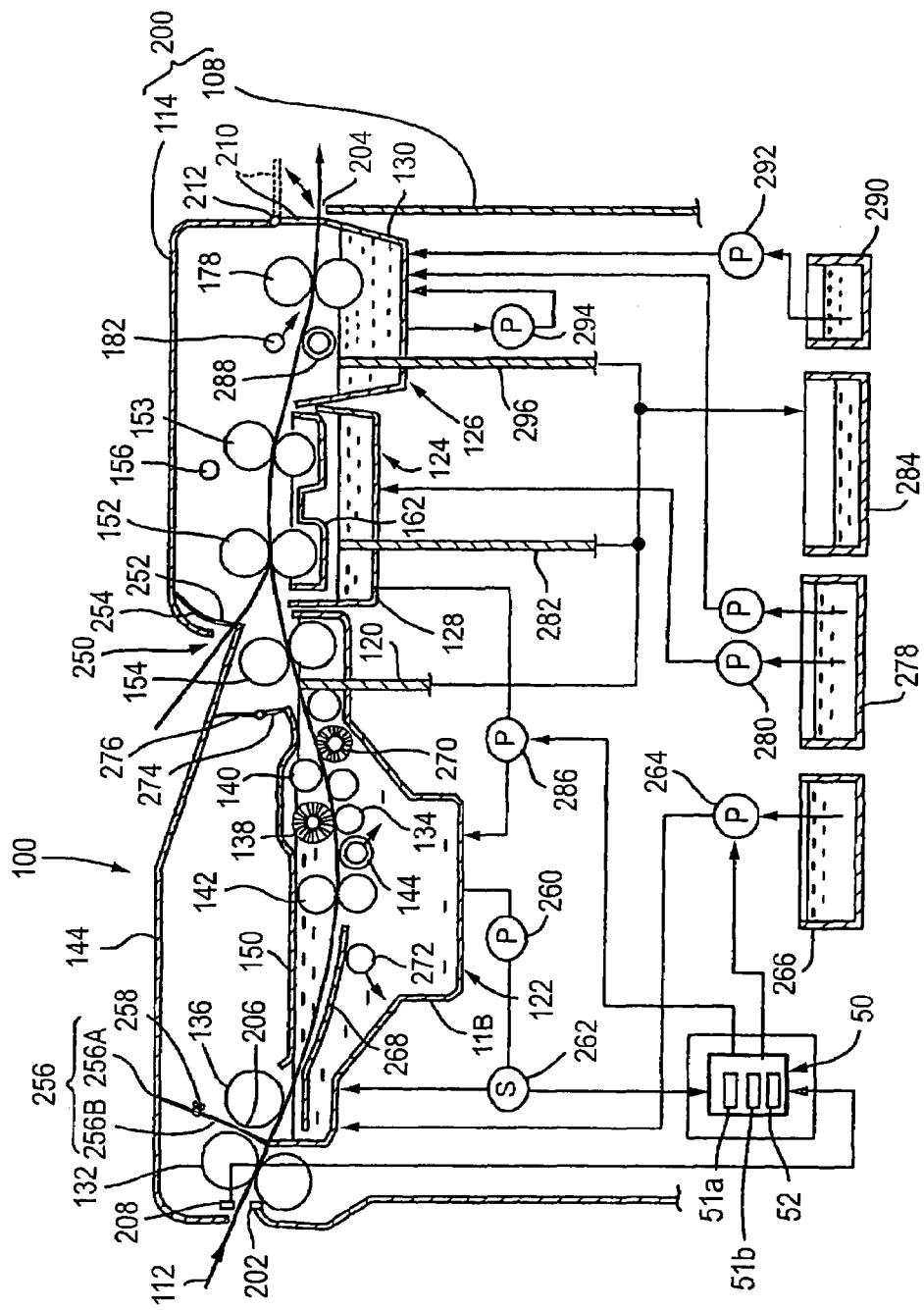
FIG. 13 is a constructive view of the second embodiment of an automatic development device for carrying out the developer replenishing method according to the invention.

Next, the second embodiment of the invention will be described below. FIG. 13 is a constructive view of an automatic development device according to the second embodiment of the invention. As illustrated in FIG. 13, in an automatic development device 100, an internal processing section is covered by an outside panel 114. A developing section 122 provided with a developing tank 118 for developing a PS plate 112 and an overflow pipe 120 for recovering a developer overflowed from the developing tank 118; a water washing section 124 for water washing the developer adhered to the PS plate 112; and a finisher section 126 for coating a gum liquid on the PS plate 112 after water washing to desensitize it are provided inside the outside panel 114. Incidentally, a water washing tank 128 is provided in the water washing section 124, and a gum liquid tank 130 is provided in the finisher section 126.

The outside panel 114 is provided with a slit-form insertion port 202 and a discharge port 204, respectively. An insertion port (sub-insertion port) 250 for reentry from which the PS plate 112 is inserted between the developing section 122 and the water washing section 124 is provided on the top face of the outside panel 114. This sub-insertion port 250 functions as an insertion port of the PS plate 112 for carrying out the processing exclusive of the development processing.

This sub-insertion port 250 is provided with a blade 252. In the blade 252, its tip portion is brought into contact with the outside panel 114 functioning as a guiding support face of the sub-insertion port 250, and its base portion is fixed to the back side of the outside panel 114 via a bracket 254. Thus, the sub-insertion port 250 is in the closed state by the blade 252.

In a drying section (not illustrated), while delivering the PS plate 112 sent out from the finisher section 126 by a number of non-illustrated rolls, warm air is blown onto the both surfaces of this PS plate 112 to dry the PS plate 112.

A pair of delivery rolls 132 are provided in the insertion side of the PS plate 112 into the developing tank 118 of the developing section 122, and the PS plate 112 is inserted between the pair of delivery rolls 132 from the insertion port 202.

A rubber blade 206 is installed in the vicinity of the downstream side of the delivery rolls 132. In the blade 206, its tip portion is brought into contact with the side wall of the developing tank 118 of the developing section 122, and its base portion is installed in the outside panel 114 via the bracket 256. The bracket 256 is constructed of a fixing portion 256A and a slide portion 256B installed in the fixing portion by a butterfly screw 258, and the blade 206 is fixed to the slide portion 256B. Thus, the blade 206 is constructed in such a manner that by loosing the butterfly screw 258 to slide the slide portion 256B against the fixing portion 256A, the tip portion of the blade 206 can be separated from the side wall of the developing tank 118.

Also, a plate detecting sensor 208 capable of detecting the presence or absence of the PS plate 112 and measuring the plate area, etc. of the delivered plate is installed in the vicinity of this insertion port 202.

The developing tank 118 is formed in an approximately reverse mountain shape in which the upper portion is opened, and the center portion of the bottom is protruded downward.

In this developing tank 118, a pump 260 is provided; and the developer in the developing tank 118 is sucked out by this pump 260 and sprayed from spray pipes 144, 272 as described later. In this way, the developer stored in the developing tank 118 is circulated. The developer passes through an electric conductivity sensor 262 which measures the electric conductivity of the developer during this circulation. Also, a replenishing stock liquid is fed into the developing tank 118 from a development replenisher stock liquid tank 266 via a replenishing stock liquid feed pump 264. Further, as described later, dilute water is fed into the developing tank 118 from the water washing tank 128 via a pump 286.

The foregoing 264 and pump 286 are controlled by a control device 50 provided with a control ROM 51a or a control RAM 51b as condition storing means based on signals from the electric conductivity sensor 262 and a time measuring section 52. Incidentally, besides, the action and effect of the control device 50 are the same as in the first embodiment, and therefore, the explanation therefor is omitted.

The developing tank 118 is provided with a guide plate 268 in the upstream side and a number of guide rolls 134 and a rotatory brush roll 270 in the downstream side. These guide rolls 134 and rotatory brush roll 270 are hung in a rotatable manner between a pair of side plates of the developing tank 118.

A guide roll 136 having a comparatively large diameter is provided above the foregoing guide plate 268; a rotatory brush roll 138 and a guide roll 140 are provided above the guide roll 134; and the rotatory brush roll 270 is provided under the guide roll 140. Also, a pair of squeeze rolls 142 provided with a function to squeeze the surface of the PS plate 112 are provided in the center portion in the developing tank 118.

The foregoing overflow pipe 120 is provided in the most downstream side of the developing tank 118, and when the liquid level of the developer exceeds a prescribed level, the developer is guided into a waste liquid tank 284 and disposed.

A liquid level lid 150 is aligned on the surface of the developer in the developing tank 118. In this liquid level lid 150, a portion corresponding to the rotatory brush roll 138 and the guide roll 140 adjacent thereto is protruded in an approximately arc shape. For the purpose of making the contact between the developer surface and air small as far as possible, the liquid level lid 150 is brought into intimate contact with the developer level, and the both ends of the liquid level lid 150 in the delivery direction of the PS plate 112 are installed by a slidable structure against a non-illustrated side plate such that it can go up and down corresponding to the increase or decrease of the developer.

The tip of a blade 274 is brought into contact with the end of the downstream side in the delivery direction of this liquid level lid 150. This blade 274 is fixed to the outside panel 114 via a bracket 276. By this blade 274, the liquid level of the developer exposing from the end of the downstream side in the delivery direction of the liquid level lid 150 is partitioned from the upper portion of the liquid level lid 150; and by the blade 206 in the vicinity of the foregoing insertion port 202 (in the state of contacting with the side wall of the developing tank 118), the upper portion of the liquid level lid 150 is completely isolated from the outside air, whereby evaporation of the developer can be suppressed.

In the most downstream side in the delivery direction of the developing tank 118, a pair of rolls 154 which sandwich and deliver the PS plate 112 and squeeze the developer from the surface of the PS plate 112 are aligned.

On the other hand, the automatic development device 100 is provided with the water washing tank 128 of the water washing section 124 in the downstream side of the developing section 122. Two pairs of delivery rolls 152, 153 are provided in the upper portion of the water washing tank 128.

The washing water after washing out the developer from the PS plate 112 sent out from the developing tank 118 is stored in the water washing tank 128. A spray pipe 156 is provided in the upstream side of the delivery rolls 153 and in the upper side than the delivery passage, and the outer periphery of this spray pipe 156 is provided with a plurality of discharge holes connecting to the inside. Washing water sucked up from a water washing tank 278 by a pump 280 is dropped onto the upper-side roll of the delivery rolls 153 from the spray pipe 156. By rotation of the delivery rolls 153, the washing water is rapidly spread on the surface of the PS plate 112, whereby the surface of the PS plate 112 is washed with the washing water.

Also, the lower portions of the lower-side rolls of the delivery rolls 152, 153 are accommodated in a pan 162. The washing water is stored in the pan 162 and sucked up by the lower-side rolls, thereby washing the rear surface of the PS plate 112 and preventing the upper-side delivery rolls 152, 153 from drying.

Also, the washing water diffused in the widthwise direction on the surface of the PS plate 112 drops in the lower pan 162 from the both ends in the widthwise direction of the PS plate 112, and the rear surface of the PS plate 112 is treated by the washing water sucked up from this pan 162. The washing water overflowed from the pan 162 is guided into the water washing tank 128. The water washing tank 128 is provided with an overflow pipe 282, and when the liquid level exceeds a prescribed liquid level, the washing water is disposed into the waste liquid tank 284.

Also, this water washing tank 128 is connected to the developing tank 118 via the pump 286. By driving the pump 286, the washing water in the water washing tank 128 is guided into the developing tank 118 and can be utilized as a dilute liquid in feeding a replenishing stock liquid into the developing tank 118.

A pair of delivery rolls 178 are provided in the upper portion of the gum liquid tank 130 of the finisher section 126. The PS plate 112 sent out by the delivery rolls 153 is guided into the delivery rolls 178.

Also, in the upstream side of the delivery rolls 178, spray pipes 182, 288 are provided in the upper and lower directions of the delivery passage. A gum liquid sucked up from a gum liquid tank 290 by a pump 292 is discharged from the spray pipes 182, 183 and fed onto the front surface and rear surface of the PS plate 112.

The delivery rolls 178 sandwich and deliver the PS plate 112 and squeeze the gum liquid fed by the spray pipe 182 for the purpose of desensitizing the surface of the PS plate 112. The gum liquid squeezed from the surface of the PS plate 112 is recovered in the gum liquid tank 130. Also, the gum liquid tank 130 is provided with an overflow pipe 296, and when the gum liquid exceeds a prescribed liquid level, the gum liquid is guided into the waste liquid tank 284 and disposed.

Also, the lower portion of the lower-side delivery roll 178 is immersed in the gum liquid stored in the gum liquid tank 130, and the lower-side delivery roll 178 sucks up the gum liquid from the gum liquid tank 130, whereby the rear surface side of the PS plate 112 is subjected to coating processing. In this way, the delivery roll 178 carries the gum liquid to desensitize the rear surface of the PS plate 112 and prevent the upper-side delivery roll 178 from dying, whereby the components of the processing liquid do not deposit on the surfaces of the delivery rolls 178.

The PS plate 112 after completion of the processing in the finisher section 126 passes through the discharge port 204 of a casing 200 and is sent out into a drying section (not illustrated).

Here, the discharge port 204 is provided with a lid 210 as a partition. This lid 210 is fixed to an axis 212. The axis 212 is made rotatable by non-illustrated drive means (for example, solenoid). The rotation of this axis 212 is achieved based on the detection of the PS plate 112 by the foregoing plate detection sensor 208 provided in the vicinity of the insertion port 202. That is, the lid 210 is kept approximately horizontal (in the opened state of the discharge port 204) during a time of detecting the PS plate 112 by the plate detection sensor 208 and a period after the PS plate 112 has not been detected (the rear end has been detected) till elapsing a prescribed time, and besides, it is kept vertical (in the closed state of the discharge port 204).

The action of this embodiment will be described below. First of all, the processing tanks such as the developing tank 118, the water washing tank 128, and the gum liquid tank 130 are covered by the casing 200 such as the outside panel 114 as an upper lid and the body 108. Also, in the state that the development processing of the PS plate 112 is not carried out by the automatic development device 100, the insertion port 202 is closed because the blade 206 comes into contact with the side wall of the developing tank 118. On the other hand, in the discharge port 204, since the PS plate 112 is not detected by the plate detection sensor 208, the lid 210 is laid in the vertical state, and the discharge port 204 is closed. Further, the sub-insertion port 250 is also closed by the blade 252, and the upper portion of the liquid level lid 150 of the developing section 122 is closed by the blades 206, 122. For this reason, the developer in the developing tank 118, the washing water in the water washing section 124, and the gum liquid in the finisher section 126 are not exposed to the outside air and are substantially free from fatigue by carbon dioxide gas. For this reason, since a lowering of the development performance caused due to degradation due to aging can be suppressed, for example, it is possible to markedly drop the replenishing amount of the replenishing stock liquid in the developing section 122. In particular, since the surface of the developer of the developing tank 118 is covered by the liquid level lid 150, an effect for preventing the contact between the developer and the outside air is large.

Incidentally, for the sake of making the contact between the developer and the outside air small as far as possible, it is preferable that the time when the lid 210 is open is short. Accordingly, a structure in which the lid 210 is open only at a time when the PS plate 112 passes and it is closed in other time is preferable.

The control by the control device 50 is identical with the contents of the flow charts of the replenishing method of the development replenisher in FIGS. 2 to 12, and therefore, the explanation therefor is omitted herein.

EXAMPLES

Next, with respect to the cases where the replenishing method of a development replenisher in the foregoing embodiments and the replenishing method of a development replenisher according to the related art, a width of fluctuation of the sensitivity of the developer was experimentally determined. Methods of preparing developers A, B, C and D, replenishers A, B, C and D and photosensitive materials A, B, C and D used in Examples 1 to 5 and Comparative Examples 1 to 10 will be described below.

[Developer A]

A developer DP-7, manufactured by Fuji Photo Film Co., Ltd. was diluted to a ratio of 1/9 and used.

[Developer B]

A developer DT-2, manufactured by Fuji Photo Film Co., Ltd. was diluted to a ratio of 1/9 and used.

[Developer C]

The following components were dissolved in water and adjusted so as to have a pH described below using KOH to prepare a developer.

| | |
|---|---|
| Surfactant (as described below): | 5% by weight |
| 2,4,7,9-Tetramethyl-5-decyne-4,7-diol: | 0.1% by weight |
| Tetrasodium ethylenediaminetetraacetate: | 0.2% by weight |
| Potassium carbonate: | 0.2% by weight |
| pH [at 25° C.]: | 12.0 |

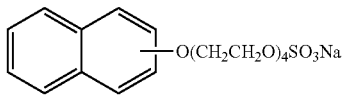

[Developer D]

The following components were dissolved in water and adjusted so as to have a pH described below using KOH to prepare a developer.

| | |
|---|---|
| Compound (Y) represented by the general formula (I): | 5.0 g |
| Tetrasodium ethylenediaminetetraacetate: | 0.1 g |
| Additive 1 (P): | 1.0 g |
| Additive 2 (Q): | 1.0 g |
| pH [at 25° C.]: | 12.0 |

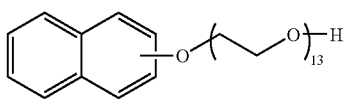

Y

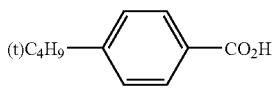

P

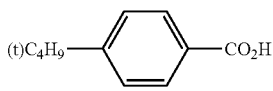

Q

[Replenisher A]

A development replenisher DP-RW, manufactured by Fuji Photo Film Co., Ltd. was used.

[Replenisher B]

A development replenisher DT-2R, manufactured by Fuji Photo Film Co., Ltd. was used.

[Replenisher C]

The following components were dissolved in water and adjusted so as to have a pH described below using KOH to prepare a developer.

| | |
|---|---|
| Surfactant (as described below): | 5% by weight |
| 2,4,7,9-Tetramethyl-5-decyne-4,7-diol: | 0.1% by weight |
| Tetrasodium ethylenediaminetetraacetate: | 0.2% by weight |

| | |
|---|---|
| Potassium carbonate: | 0.2% by weight |
| pH [at 25° C.]: | 13.0 |

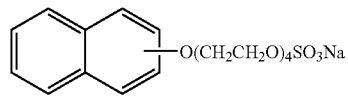

[Developer D]

The following components were dissolved in water and adjusted so as to have a pH described below using KOH to prepare a developer.

| | |
|---|---|
| Compound (Y) represented by the general formula (I): | 5.0 g |
| Tetrasodium ethylenediaminetetraacetate: | 0.1 g |
| Additive 1 (P): | 1.0 g |
| Additive 2 (Q): | 1.0 g |
| pH [at 25° C.]: | 13.0 |

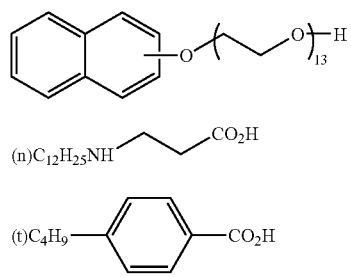

[Photosensitive Material A]

A photosensitive plate was prepared based on Example 1 of JP-A-2000-231188. The resulting photosensitive plate was image exposed for one minute using a printer FT26V2UPNS, manufactured by Nuarc Company, Inc. (light source: 2 kW metal halide lamp).

[Photosensitive Material B]

A photosensitive plate was prepared based on Example 1 of JP-A-7-295212. The resulting photosensitive plate was image exposed at 50 counts using a printer FT26V2UPNS, manufactured by Nuarc Company, Inc. (light source: 2 kW metal halide lamp).

[Photosensitive Material C]

An aluminum plate (material quality: 1050) having a thickness of 0.3 mm was washed with trichloroethylene and degreased. Thereafter, the surface of the aluminum plate was sand blasted using a nylon brush and a 400-mesh pumice aqueous suspension and then well washed with water. After washing, this aluminum plate was immersed for etching in a 25% sodium hydroxide aqueous solution at 45° C. for 9 seconds, washed with water, immersed in a 20% nitric acid aqueous solution for 20 seconds, and then again washed with water. At this time, the etching amount of the sand blasted surface was about 3 g/m². Next, the resulting aluminum plate was provided with an anodically oxidized film Of 3 g/m² using 7% sulfuric acid as an electrolytic liquid and a direct current having a current density of 15 A/dm², washed with water, and then dried. The resulting aluminum plate was treated with a 2.5% sodium silicate aqueous solution at 30° C. for 10 seconds and coated with a coating liquid for undercoat layer at 80° C. for 15 seconds to obtain a support. The coating amount after drying of the undercoat layer was 15 mg/m².

| <Coating liquid for undercoat layer> | |
|---|---|
| Copolymer P described below (molecular weight: 28,000): | 0.3 g |
| Methanol: | 100 g |
| Water: | 1 g |

Copolymer P $-\!\!\left(CH_2-\overset{H}{\underset{|}{C}}\right)_{\!85}\!\!-$   $-\!\!\left(CH_2-\overset{H}{\underset{|}{C}}\right)_{\!15}\!\!-$ (phenyl-COOH)   (phenyl-$CH_2N^+Et_3Cl^-$)

<Synthesis of specified copolymer>

Synthesis Example(specified copolymer 1)

A 500-mL three-necked flask equipped with a stirrer, a condenser and a dropping funnel was charged with 31.0g (0.36 moles) of methacrylic acid, 39.1 g (0.36 moles) of ethyl chloroformate and 200 mL of acetonitrile, and the mixture was stirred under cooling on an ice water bath. 36.4 g (0.36 moles) of triethylamine was dropped to this mixture over about one hour from the dropping funnel. After completion of dropping, the ice water bath was removed, and the mixture was stirred at room temperature for 30minutes. 51.7g(0.30 moles) of p-aminobenzenesulfonamide was added to the reaction mixture, and the mixture was stirred for one hour while warming on an oil bath at 70 ° C. After completion of the reaction, the reaction mixture was thrown into one liter of water while stirring this water; and the resulting mixture was stirred for 30 minutes. This mixture was filtered to take out a deposit, which was then formed into a slurry upon addition of water. This slurry was filtered, and the thus obtained solid was dried to obtain a white solid of N-(p-aminosulfonylphenyl) methacrylamide (yield: 46.9 g). Next, a 20 -mL three-necked flask equipped with a stirrer, a condenser and a dropping funnel was charged with 4.61 g(0.0192 moles) of N-(p-aminosulfonylphenyl)methaciylamide, 2,94 g (0.0258moles) of ethyl methacrylate, 0.80 g (0.0 15 moles) of acrylonitrile, and 20 g of N,N-dimethylacetarnide, and the mixture was stirred while heating on a warm water bath at 65 °C. 0.15 g of "V-65" (manufactured by Wako Pure Chemical Industries, Ltd.) was added to this mixture, and the mixture was stirred under a nitrogen gas stream for 2 hours while keeping at 65° C. To the reaction mixture, a mixture of 4.61 g of N-(p-amino -sulfonylphenyl)methacrylamide, 2,94 g of ethyl methacrylate, 0.80 g of acrylonitrile, N,N-dimethylacetamide, and 0.15 g of "V-65" was further dropped over 2 hours from the dropping funnel. After completion of dropping, the resulting mixture was further stirred at 65° C. for 2 hours. After completion of the reaction, 40 g of methanol was added to the mixture and cooled. The resulting mixture was thrown into two liters of water while stirring this water, and the mixture was stirred for 30 minutes. A deposit was taken out and dried to obtain 15 g of a white solid. The weight average molecular weight (as reduced into polystyrene) of this specified copolymer was measured by gel penneation chromatography and found to be 53,000.

A coating liquid for image recording layer described below was coated in the resulting support such that the coating amount after drying was 1.8 g/m2, to obtain a positive working infrared photosensitive lithographic printing plate.

<Coating liquid for image recording layer>

| | |
|---|---|
| Specified copolymer described above: | 0.4 g |
| m,p-Cresol novolak (m/p ratio = 6/4, weight average molecular weight: 8,000, containing 0.5% of unreacted cresol): | 0.6 g |
| Cyanine dye A: | 0.1 g |
| Phthalic anhydride: | 0.05 g |
| p-Toluenesulfonic acid: | 0.002 g |
| Ethyl Violet (counter ion: 6-hydroxy-β-naphthalenesulfonic acid): | 0.02 g |
| Esterified product of naphthoquinone 1,2-diazido-5-sulfonyl chloride and pyrogallol/acetone resin: | 0.01 g |
| Fluorine based surfactant (trade name: Megafac F-177, manufactured by Dainippon Ink and Chemicals, Incorporated): | 0.05 g |
| Methyl ethyl ketone: | 8 g |
| 1-Methoxy-2-propanol: | 4 g |

[Photosensitive material D]
[Preparation of support]

<Aluminum plate>

A molten metal was prepared using an aluminum alloy containing 0.06 % by weight of Si, 0.30 % by weight of Fe, 0.001 % by weight of Cu, 0001 % by weight of Mn, 0.001 % by weight of Mg, 0,001 % by weight of Zn, and 0.03 % by weight of Ti, with the remainder being Al and inevitable impurities, subjected to melting treatment and filtered. Then, an ingot having a thickness of 500 mm and a width of 1,200 mm was prepared by the DC casting method. After shaving off the surface in a thickness of 10 mm in average using a facing machine, the resulting ingot was soaked at 550 ° C. for about 5 hours. When the temperature dropped to 400 ° C., the ingot was processed using a hot rolling mill to obtain a rolled plate having a thickness of 2.7 mm. Further, the rolled plate was heat treated at 500 ° C. using a continuous annealing machine and then finished in a thickness of 0.24 mm by cold rolling to obtain an aluminum plate of JIS 1050 material. This aluminum plate was adjusted at a width of 1,030 mm and then subjected to the following surface processing.

<Surface processing>

The surface processing was achieved by continuously carrying out the following various processings. Incidentally, after the various processings and water washing, liquid drain off was carried out using nip rolls.

(a) Mechanical roughing processing:

The aluminum plate was subjected to mechanical roughing processing by rotatory roll-shaped nylon brushes while feeding a suspension made of a polisher (pumice) and water and having a specific gravity of 1.12 as a polishing slurry liquid onto the surface of the aluminum plate. The polisher had a mean particle size of 30 μm and a maximum particle size of 100 μm. The nylon brush was made of nylon 6/10 and had a hair length of 45 mm and a hair diameter of 0.3 mm. The nylon brush was one prepared by transplanting tightly nylon hairs in bores provided in a stainless steel-made cylinder of φ300 mm. Three rotatory brushes were used. The distance of two supporting rolls (φ200 ) in the lower portion of the brush was 300 mm. The brush rolls were pressed to such an extent that a load of a drive motor for rotating the brushes became +7 kW against the load prior to pressing the brush rolls onto the aluminum plate. The rotation direction of the brush was the same as the movement direction of the aluminum plate. The revolution number of the brush was 200 rpm.

(b) Alkali etching processing:

The obtained aluminum plate was subjected to etching processing by spraying an aqueous solution having a sodium hydroxide concentration of 2.6 % by weight, an aluminum ion concentration of 6.5 % by weight, and a temperature of 70° C., thereby dissolving 10 g/m² of time aluminum plate therein. Thereafter, the resulting aluminum plate was washed with water by spraying.

(c) Desmutting processing:

The aluminum plate was subjected to desmutting processing by spraying an aqueous solution having a nitric acid concentration of 1 % by weight (containing 0,5 % by weight of an aluminum ion) at a temperature of 30 ° C. and then washed with water by spraying. As the nitric acid aqueous solution used in the desmutting processing, a waste liquid in a step of achieving electrochemical roughing processing using an alternating current in a nitric acid aqueous solution was used.

(d) Electrochemical roughing processing:

The aluminum plate was subjected to continuous electrochemical roughing processing using an alternating current voltage of 60 Hz. The electrolytic liquid to be used at this time was an aqueous solution of 10.5 g/L of nitric acid (containing 5 gIL of an aluminum ion and 0.007 % by weight of an ammonium ion) having a liquid temperature of 50 ° C. The electrochemical processing was carried out using a trapezoidal rectangular water alternating current having an alternating current electric source waveform having a time TP of from zero of the current value till a peak of 0.8 msec and a duty ratio of 1/1 and using a carbon electrode as a counter electrode. Ferrite was used as an auxiliary anode.

The current density was 30 A/dm$_2$ at the peak value of the current, and the quantity of electricity was 220 C/dm² in terms of total sum of the quantity of electricity when the aluminum plate worked as an anode. 5 % of the current flowing from the electric source was shunted into the auxiliary anode. Thereafter, the resulting aluminum plate was washed with water by spraying.

(e) Alkali etching processing:

The aluminum plate was subjected to etching processing at 32° C. by spraying an aqueous solution having a sodium hydroxide concentration of 26 % by weight and an aluminum ion concentration of 6.5 % by weight, thereby dissolving 0.50 g/m2 of the aluminum plate therein to remove a smutting component mainly composed of aluminum hydroxide as formed when the preceding electrochemical roughing processing was carried out using an alternating current. Also, edge portions of formed pits were dissolved, thereby making the edge portions smooth. Thereafter, the resulting aluminum plate was washed with water by spraying.

(D Desmutting processing:

The aluminum plate was subjected to desmutting processing by spraying an aqueous solution having a nitric acid concentration of 15% by weight (containing 4.5 % by weight of an aluminum ion) at a temperature of 30 ° C. and then washed with water by spraying. As the nitric acid aqueous solution used in the desmutting processing, a waste liquid in a step of achieving electrochemical roughing processing using an alternating current in a nitric acid aqueous solution was used.

(g) Electrochemical roughing processing:

The aluminum plate was subjected to continuous electrochemical roughing processing using an alternating current voltage of 60 Hz. The electrolytic liquid to be used at this time was an aqueous solution of 5.0 g/L of hydrochloric acid (containing 5 g/L of an aluminum ion) having a liquid temperature of 35° C. The electrochemical processing was carried out using a trapezoidal rectangular water alternating current having an alternating current electric source waveform having a time TP of from zero of the current value till a peak of 0,8 msec and a duty ratio of 1/1 and using a carbon electrode as a counter electrode, Ferrite was used as an auxiliary anode.

The current density was 25 A/dm$_2$ at the peak value of the current, and the quantity of electricity was 50 C/dm$^2$ in terms of total sum of the quantity of electricity when the aluminum l)late worked as an anode. Thereafter, the resulting aluminum plate was washed with water by spraying.

(h)Alkali etching processing:

The aluminum plate was subjected to etching processing at 32° C. by spraying an aqueous solution having a sodium hydroxide concentration of 26 % by weight and an aluminum ion concentration of 6.5 % by weight, thereby dissolving 0.10 g/m$^2$of the aluminum plate therein to remove a smutting component mainly composed of aluminum hydroxide as formed when the preceding electrochemical roughing processing was carried out using an alternating current. Also, edge portions of formed pits were dissolved, thereby making the edge portions smooth. Thereafter, the resulting aluminum plate was washed with water by spraying.

(i)Desmutting processing:

The aluminum plate was subjected to desmutting processing by spraying an aqueous solution having a sulfuric acid concentration of 25 % by weight (containing 0,5 % by weight of an aluminum ion) at a temperature of 60 0C and then washed with water by spraying.

(j)Anodic oxidation processing:

The aluminum plate was subjected to anodic oxidation processing using an anodic oxidation device to obtain a support for lithographic printing plate. Sulfuric acid was used as electrolytic liquids to be fed into first and second electrolysis sections. Each of the electrolytic liquids had a sulfuric acid concentration of 170 g/L (containing 0.5 % by weight of an aluminum ion) and a temperature of 38° C. Thereafter, the aluminum support was washed with water by spraying. An ultimate amount of the oxide film was 2.7 g/m$^2.$ The support thus obtained through the foregoing processings had an Ra of 0.45.

[Undercoating]Next, the following undercoating liquid was coated on the aluminum support using a wire bar and then dried at 90 °0 C. for 30 seconds using a warm air type dryer. The coverage after drying was 10 mg/m$^{2.}$ <Undercoating liquid>

| | |
|---|---|
| Copolymer of ethyl acrylate and sodium 2-acryl-amido-2-methyl-propanesulfonate (molar ratio: 75/15): | 0.1 g |
| 2-Aminoethylphosphonic acid: | 0.1 g |
| Methanol: | 50 g |
| Ion-exchanged water: | 50 g |

[Photosensitive layer]

Next, the following coating liquid for photosensitive layer [P-1]was prepared and coated on the foregoing undercoated aluminum plate using a wire bar. Drying was carried out at 122 ° C. for 43.5 seconds using a warm air type dryer. The coverage after drying was 1.4 g/m$^{2.}$ <Coating liquid for photosensitive layer [P-1 ]>

| | |
|---|---|
| Infrared absorber (IR-1): | 0.08 g |
| Polymerization initiator (OS-1): | 0.25 g |
| Dipentaerythritol hexaacrylate: | 1.00 g |
| Binder polymer (BT-1): | 1.00 g |
| Chloride salt of Ethyl Violet: | 0.04 g |
| Fluorine based surfactant (Megafac F-780-F, manufactured by Dainippon Ink and Chemicals, Incorporated) | 0.03 g |
| Methyl ethyl ketone: | 10.4 g |
| Methanol: | 4.83 g |
| 1-Methoxy-2-propanol: | 10.4 g |

Structures of the infrared absorber (IR-1), polymerization initiator (OS-1) and binder polymer (BT-1) used in the foregoing coating liquid for photosensitive layer are shown below.

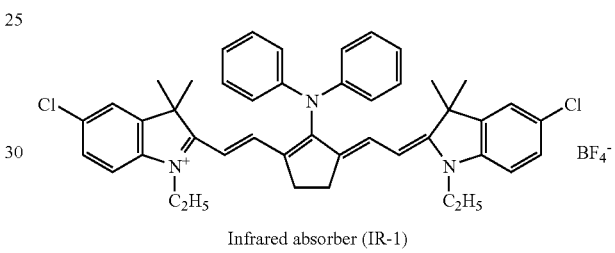

Infrared absorber (IR-1)

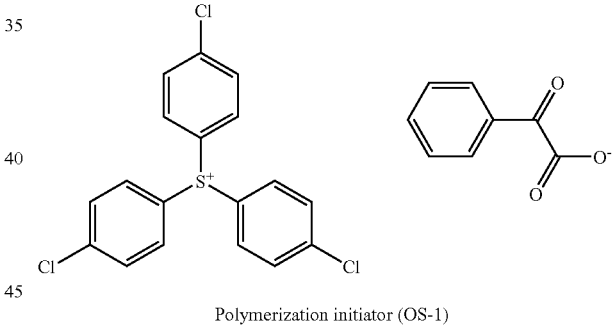

Polymerization initiator (OS-1)

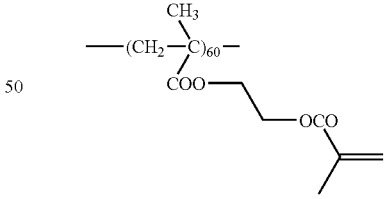

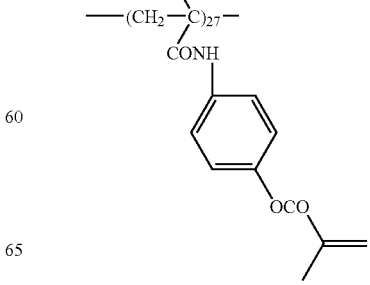

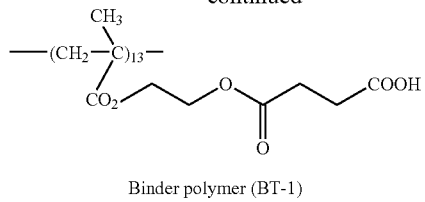

Binder polymer (BT-1)

[Protective layer (overcoat layer)]

A mixed aqueous solution of polyvinyl alcohol (degree of hydrolysis: 98 % by mole, degree of polymerization: 500) and polyvinylpyrrolidone (Luviskol K-30, manufactured by BASF AG) was coated on the surface of the foregoing photosensitive layer using a wire bar and dried at 125° C. for 75 seconds using a warm air type dryer. The context of PVA was 85 % by weight, and the coating amount (coverage after drying) was 2.45 g/m². The coefficient of dynamic friction of the surface was 0.45 .

There was thus obtained a photosensitive lithographic printing plate 1.

[Photosensitive material E]

An aluminum plate (material quality: IS) having a thickness of 0.3 mm was well washed with water and immersed for etching in 10 % sodium hydroxide at 70 ° C. for 60 seconds. After washing with running water, the aluminum plate was neutralized and washed with 20 % nitric acid and then washed with water. The aluminum plate was subjected to electrolytic roughing processing in a 1.5 % nitric acid aqueous solution at a quantity of electricity of 270 C/dm² when the aluminum plate worked as an anode using an alternating waveform current of sine wave under a condition at VA of 12.7 V. The surface roughness of the resulting aluminum plate was measured and found to be 0.30 μm (expressed by Ra). Subsequently, the aluminum plate was immersed in a 30 % sulfuric acid aqueous solution and subjected to desmutting processing at 40° C. for 2 minutes. Thereafter, the aluminum plate was anodically oxidized in a 20 % sulfuric acid aqueous solution at 33° C. for 50 seconds in a current density of 5 A/dm² while aligning a cathode on the sand blasted surface of the aluminum plate. As a result, the thickness was 2.7 g/m².

A coating liquid for interlaying having a composition described below was coated in a coating weight after drying of 2 mg/m² on the thus processed aluminum plate and then dried at 100 ° C. for 3 minutes. <Coating liquid for interlayer>

| Methanol: | 100 g |
| DDP-8 (phosphate compound, manufactured by Nikko Chemical Co., Ltd.): | 15 g |
| Water: | 10 g |
| Phosphoric acid: | 5 g |
| Tetraethoxysilane: | 50 g |
| 3-Methacryloxypropyltriethoxysilane: | 50 g |

A high-speed photopolymerizable composition 1 having a composition described below was coated in a coating weight after drying of 1.5 g/m² on this undercoat layer and then dried at 100 ° for 90 seconds to form a photosensitive layer. <Photopolymerizable composition 1>

| Ethylenically unsaturated bond-containing compound (A1): | 1.8 g |
| Linear organic high molecular binder (B1) | 1.5 g |
| Sensitizer (C1): | 0.15 g |
| Photopolymerization initiator (D1): | 0.2 g |
| Dispersion of β-phthalocyanine (F1) | 0.2 g |
| Fluorine based nonionic surfactant, Megafac F177 (manufactured by DIC): | 0.03 g |
| Methyl ethyl ketone: | 10 g |
| Propylene glycol monomethyl ether acetate: | 10 g |

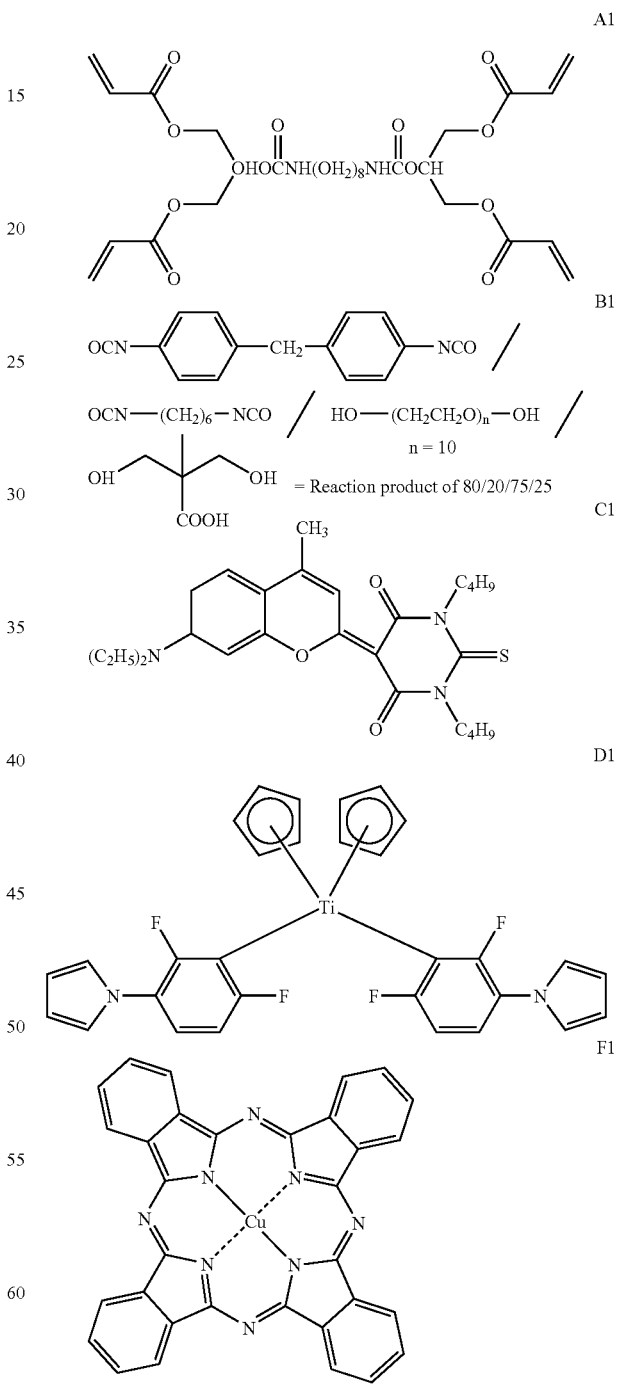

A 3 % by weight aqueous solution of polyvinyl alcohol (degree of hydrolysis: 98 % by mole, degree of polymerization; 500) was coated in a coating weight after drying of 2.5 g/m$^2$ on the thus formed photopolymerizable photosensitive layer and then dried at 100° C. for 90 seconds to obtain a photosensitive material E.

[Processing of Examples 1 to 4]

As shown in Tables 1 to 6, each photosensitive material was continuously processed using the replenishing method of this invention, thereby evaluating the sensitivity stability of the developer. The sensitivity stability of the developer was evaluated by determining to what extent the image density of an image having a gradation density of 50 % obtained by subjecting the photosensitive material to halftone processing (AM screening, screen line number: 175 lpi) and exposing it changed. The results obtained are shown in Table 7.

TABLE 1

|  | Replenishing system | Photosensitive material | Developer | Replenisher | Processing condition |
|---|---|---|---|---|---|
| Example 1 | System of the invention (control system shown in FIG. 7) | Photosensitive material A and photosensitive material B | Developer A | Replenisher A | Process condition 1 |
| Example 2 | System of the invention (control system shown in FIG. 7) | Photosensitive material A, photosensitive material B, and photosensitive material C | Developer B | Replenisher B | Process condition 2 |
| Example 3 | System of the invention (control system shown in FIG. 7) | Photosensitive material D | Developer C | Replenisher C | Process condition 3 |
| Example 4 | System of the invention (control system shown in FIG. 7) | Photosensitive material E | Developer D | Replenisher D | Process condition 4 |
| Comparative Example 1 | Area-based replenishing system due to aging (not including detection of electric conductivity) | Photosensitive material A and photosensitive material B | Developer A | Replenisher A | Process condition 5 |
| Comparative Example 2 | Area-based replenishing system due to aging (not including detection of electric conductivity) | Photosensitive material A, photosensitive material B, and photosensitive material C | Developer B | Replenisher B | Process condition 6 |
| Comparative Example 3 | Area-based replenishing system due to aging (not including detection of electric conductivity) | Photosensitive material D | Developer C | Replenisher C | Process condition 7 |
| Comparative Example 4 | Area-based replenishing system due to aging (not including detection of electric conductivity) | Photosensitive material E | Developer D | Replenisher D | Process condition 8 |
| Comparative Example 5 | Electric conductivity-based replenishing system (system described in JP-A-64-21451 (counterpart to U.S. Pat. No. 4,882,246)) | Photosensitive material A and photosensitive material B | Developer A | Replenisher A | Process condition 9 |
| Comparative Example 6 | Electric conductivity-based replenishing system (system described in JP-A-64-21451 (counterpart to U.S. Pat. No. 4,882,246)) | Photosensitive material A, photosensitive material B, and photosensitive material C | Developer B | Replenisher B | Process condition 10 |
| Comparative Example 7 | Electric conductivity-based replenishing system (system described in JP-A-64-21451 (counterpart to U.S. Pat. No. 4,882,246)) | Photosensitive material D | Developer C | Replenisher C | Process condition 11 |
| Comparative Example 8 | Electric conductivity-based replenishing system (system described in JP-A-64-21451 (counterpart to U.S. Pat. No. 4,882,246)) | Photosensitive material E | Developer D | Replenisher D | Process condition 12 |

TABLE 2

|  | Automatic processor | Volume of developing tank | Development temperature | Development time | Replenishing amount due to aging at the time of operation | Replenishing amount due to aging at the time of stopping | Replenishing amount due to processing | Processing pattern | Change of concentration of circumferential carbon dioxide gas |
|---|---|---|---|---|---|---|---|---|---|
| Process condition 1 | See FIG. 13 | 20,000 cc | 30° C. | 12 seconds | — | — | — | See Table 3-a | See Table 4 |
| Process condition 2 | See FIG. 1 | 20,000 cc | 30° C. | 12 seconds | — | — | — | See Table 3-b | See Table 4 |
| Process condition 3 | See FIG. 1 | 20,000 cc | 30° C. | 12 seconds | — | — | — | See Table 3-c | See Table 4 |
| Process condition 4 | See FIG. 1 | 20,000 cc | 28° C. | 18 seconds | — | — | — | See Table 3-c | See Table 4 |
| Process condition 5 | See FIG. 13 | 20,000 cc | 30° C. | 12 seconds | 220 cc/h | 100 cc/h | 40 cc/m$^2$ | See Table 3-a | See Table 4 |
| Process condition 6 | See FIG. 1 | 20,000 cc | 30° C. | 12 seconds | 50 cc/h | 15 cc/h | 20 cc/m$^2$ | See Table 3-b | See Table 4 |
| Process condition 7 | See FIG. 1 | 45,000 cc | 30° C. | 12 seconds | 40 cc/h | 30 cc/h | 40 cc/m$^2$ | See Table 3-c | See Table 4 |
| Process condition 8 | See FIG. 1 | 20,000 cc | 28° C. | 18 seconds | 40 cc/h | 40 cc/h | 100 cc/m$^2$ | See Table 3-c | See Table 4 |

TABLE 2-continued

| Automatic processor | Volume of developing tank | Development temperature | Development time | Replenishing amount due to aging at the time of operation | Replenishing amount due to aging at the time of stopping | Replenishing amount due to processing | Processing pattern | Change of concentration of circumferential carbon dioxide gas |
|---|---|---|---|---|---|---|---|---|
| Process condition 9 | See FIG. 13 | 20,000 cc | 30° C. | 12 seconds | — | — | — | See Table 3-a | See Table 4 |
| Process condition 10 | See FIG. 1 | 20,000 cc | 30° C. | 12 seconds | — | — | — | See Table 3-b | See Table 4 |
| Process condition 11 | See FIG. 1 | 20,000 cc | 30° C. | 12 seconds | — | — | — | See Table 3-c | See Table 4 |
| Process condition 12 | See FIG. 1 | 20,000 cc | 28° C. | 18 seconds | — | — | — | See Table 3-c | See Table 4 |

TABLE 3

Processing amount of each day [(area of one plate) × (number of sheets)]

| | | Date | | | | | | | | | |
|---|---|---|---|---|---|---|---|---|---|---|---|
| | | 1 | 2 | 3 | 4 | 5 | 8 | 9 | 10 | 11 | 12 |
| | | Day | | | | | | | | | |
| | | Mon. | Tue. | Wed. | Thu. | Fri. | Mon. | Tue. | Wed. | Thu. | Fri. |
| Photosensitive material A | | | | | | | | | | | |
| [m² × (number of sheets)] | AM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| | PM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| Photosensitive material B | | | | | | | | | | | |
| [m² × (number of sheets)] | AM | 0 | 0 | 0 | 0 | 0 | 0.8 × 7 | 0 | 0.8 × 7 | 0 | 0 |
| | PM | 0 | 0 | 0 | 0 | 0 | 0.8 × 7 | 0 | 0.8 × 7 | 0 | 0 |
| Total (m²) | | 21 | 21 | 21 | 67 | 11 | 11 | 11 | 11 | 11 | 6 |

TABLE 4

Processing amount of each day [(area of one plate) × (number of sheets)]

| | | Day | | | | | | | | | |
|---|---|---|---|---|---|---|---|---|---|---|---|
| | | Mon. | Tue. | Wed. | Thu. | Fri. | Mon. | Tue. | Wed. | Thu. | Fri. |
| Photosensitive material A | | | | | | | | | | | |
| [m² × (number of sheets)] | AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 |
| | PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 |
| Photosensitive material C | | | | | | | | | | | |
| [m² × (number of sheets)] | AM | 0.8 × 6 | 0.8 × 6 | 0.8 × 6 | 0.8 × 20 | 0.8 × 3 | 0 | 0.8 × 3 | 0 | 0.8 × 3 | 0 |
| | PM | 0.8 × 7 | 0.8 × 7 | 0.8 × 7 | 0.8 × 20 | 0.8 × 4 | 0 | 0.8 × 4 | 0 | 0.8 × 4 | 0 |
| Photosensitive material D | | | | | | | | | | | |
| [m² × (number of sheets)] | AM | 0 | 0 | 0 | 0 | 0 | 0.8 × 3 | 0 | 0.8 × 3 | 0 | 0 |
| | PM | 0 | 0 | 0 | 0 | 0 | 0.8 × 4 | 0 | 0.8 × 4 | 0 | 0 |
| Total (m²) | | 21 | 21 | 21 | 67 | 11 | 9 | 11 | 9 | 11 | 3 |

TABLE 5

Processing amount of each day [(area of one plate) × (number of sheets)]

| Photosensitive material | | Date | | | | | | | | | |
|---|---|---|---|---|---|---|---|---|---|---|---|
| | | 1 | 2 | 3 | 4 | 5 | 8 | 9 | 10 | 11 | 12 |
| | | Day | | | | | | | | | |
| | | Mon. | Tue. | Wed. | Thu. | Fri. | Mon. | Tue. | Wed. | Thu. | Fri. |
| [m² × (number of sheets)] | AM | 0.8 × 13 | 0.8 × 13 | 0.8 × 13 | 0.8 × 42 | 0.8 × 7 | 0.4 × 14 | 0.4 × 14 | 0.4 × 14 | 0.4 × 14 | 0.4 × 14 |
| | PM | 0.8 × 13 | 0.8 × 13 | 0.8 × 13 | 0.8 × 42 | 0.8 × 7 | 0.4 × 14 | 0.4 × 14 | 0.4 × 14 | 0.4 × 14 | 0.4 × 14 |
| Total (m²) | | 21 | 21 | 21 | 67 | 11 | 11 | 11 | 11 | 11 | 6 |

TABLE 6

| | Date | | | | | | | | | |
|---|---|---|---|---|---|---|---|---|---|---|
| | 1 | 2 | 3 | 4 | 5 | 8 | 9 | 10 | 11 | 12 |
| | Day | | | | | | | | | |
| | Mon. | Tue. | Wed. | Thu. | Fri. | Mon. | Tue. | Wed. | Thu. | Fri. |
| Concentration of circumferential carbon dioxide gas | 500 ppm | 500 ppm | 500 ppm | 500 ppm | 500 ppm | 500 ppm | 500 ppm | 2,000 ppm | 2,000 ppm | 2,000 ppm |

TABLE 7

Change of 50% gradation density (the density at the time of start on the first day being defined as ±0.0%)

| | Date | | | | | | | | | |
|---|---|---|---|---|---|---|---|---|---|---|
| | 1 | 2 | 3 | 4 | 5 | 8 | 9 | 10 | 11 | 12 |
| Example 1 | ±0.0% | −0.5% | −0.75% | −0.25% | −0.5% | ±0.0% | +0.25% | +0.5% | −0.25% | −0.25% |
| Example 2 | ±0.0% | +0.5% | +0.5% | +0.25% | +0.25% | −0.25% | ±0.0% | −0.5% | +0.25% | ±0.0% |
| Example 3 | ±0.0% | +0.25% | +0.25% | +0.5% | +0.25% | +0.25% | −0.25% | −0.75% | −0.5% | −0.5% |
| Example 4 | ±0.0% | −0.25% | +0.5% | +0.75% | +0.25% | ±0.0% | −0.25% | ±0.0% | +0.25% | +0.5% |
| Comparative Example 1 | ±0.0% | ±0.0% | ±0.0% | +0.25% | +0.25% | +0.75% | +1.5% | +2.75% | +3.75% | +4.25% |
| Comparative Example 2 | ±0.0% | −0.25% | +0.25% | +0.25% | ±0.0% | +1.25% | +1.5% | +2.5% | +3.5% | +4.0% |
| Comparative Example 3 | ±0.0% | +0.25% | +0.5% | −0.25% | ±0.0% | −1.5% | −1.25% | −0.5% | +2.0% | +2.75% |
| Comparative Example 4 | ±0.0% | ±0.0% | +0.25% | +0.25% | +0.25% | −0.5% | −1.25% | −0.5% | +1.0% | +2.5% |
| Comparative Example 5 | ±0.0% | +0.25% | +0.25% | −1.25% | −1.25% | −1.25% | −1.25% | −0.15% | +1.0% | +1.5% |
| Comparative Example 6 | ±0.0% | −0.25% | ±0.0% | −1.25% | −1.5% | −1.5% | −1.25% | +0.25% | +1.25% | +1.75% |
| Comparative Example 7 | ±0.0% | −0.25% | −0.25% | −1.5% | −1.5% | −1.25% | −1.0% | ±0.0% | +0.75% | +1.75% |
| Comparative Example 8 | ±0.0% | −0.25% | +0.5% | −1.5% | −1.5% | −1.25% | −1.25% | −0.25% | +0.75% | +2.0% |

[Processing of Comparative Examples 1 to 8]

As shown in Tables 1 to 6, each photosensitive material was continuously processed using the area-based replenishing system due to aging or the electric conductivity-based replenishing system, thereby evaluating the sensitivity stability of the developer. The sensitivity stability of the developer was evaluated by determining to which extent the image density of an image having a gradation density of 50 % obtained by subjecting the photosensitive material to halftone processing (AM screening, screen line number: 175 lpi) and exposing it changed. The results obtained are shown in Table 7.

It could be confirmed from the foregoing evaluation the Examples 1 to 4 fall within an allowable range in the change of the 50 % gradation density of from −1.0 % to +1.0 %, whereas Comparative Examples 1 to 8 exceed the foregoing allowable range of the 50 % gradation density.

This application is based on Japanese Patent application JP 2004-046269, filed Feb. 23, 2004, the entire contents of which is hereby incorporated by reference.

What is claimed is:

1. A developer replenishing method of a photosensitive lithographic printing plate including: developing an exposed photosensitive lithographic printing plate with a developer; and keeping a developer activity constant by replenishing with a replenisher, the method comprises repeating the following steps (1) to (10):

(1) obtaining an integrating value of replenishment due to aging ($I_{VC}$) by integrating a replenishing amount due to aging ($V_C \times T_K$) operated from a setting value of replenishing amount due to aging ($V_C$) at every fixed elapsed time ($T_K$), provided that an initial value of $V_C$ in a first cycle of the steps (1) to (10) is a predetermined value, and in a second or later cycle of the steps (1) to (10), when a value of $V_C$ is changed in a previous cycle of the steps (1) to (10), a value of $V_C$ represents a value obtained in the following step (8) in the previous cycle;

(2) obtaining an integrating value of replenishment due to processing ($I_{VB}$) by integrating a replenishing amount due to processing ($V_B \times S$) operated from a setting value of replenishing amount due to processing ($V_B$) in every processing of a plate having a fixed area (S), provided that an initial value of $V_B$ in a first cycle of the steps (1) to (10) is a predetermined value, and in a second or later cycle of the steps (1) to (10), when a value of $V_B$ is changed in a previous cycle of the steps (1) to (10), a value of $V_B$ represents a value obtained in the following step (8) in the previous cycle;

(3) obtaining a value of an electric conductivity of the developer ($d_M$) by measuring an electric conductivity of the developer at every predetermined fixed period;

(4) calculating a sum of the integrating value of replenishment due to aging ($I_{VC}$) and the integrating value of replenishment due to processing ($I_{VB}$), and comparing the sum with a predetermined replenishing amount per one time ($V_L$);

(5) when ($I_{VC}+I_{VB}$) is not larger than $V_L$, returning to the step (1), and when ($I_{VC}+I_{VB}$) is larger than $V_L$, replenishing the developer in a developing tank with a replenisher in an amount of ($I_{VC}+I_{VB}$);

(6) calculating an operating value of electric conductivity ($d_T$) by the following expression (3):

$$d_T = [V_T \times d_{To} + V_C \times T_P \times D_C + (I_{VC}+I_{VB}-V_C \times T_P) \times D_B] \div (V_T + I_{VC} + I_{VB}) \quad (3)$$

wherein $d_{To}$ in a first cycle of the steps (1) to (10) is an electric conductivity value ($D_M$) which is empirically predetermined, and $d_{To}$ in a second or later cycle of the steps (1) to (10) is $d_T$ calculated in the step (6) in the previous cycle; $V_T$ represents an amount of the developer in the developing tank; $T_P$ represents an elapse time from a point in time of the last replenishment to the present; and $D_C$ and $D_B$ each represents an empirically predetermined constant;

(7) comparing the operating value of electric conductivity ($d_T$) with the value of the electric conductivity of the developer ($d_M$);

(8) when $d_T$ is larger than $d_M$, renewing the value of $V_C$ by adding a predetermined constant ($C_1$) to the value of $V_C$ and renewing the value of $V_B$ by adding a predetermined constant ($C_2$) to the value of $V_B$, and when $d_T$ is not larger than $d_M$, renewing the value of $V_C$ by reducing a predetermined constant ($C_1$) from the value of $V_C$ and renewing the value of $V_B$ by reducing a predetermined constant ($C_2$) from the value of $V_B$;

(9) initializing $I_{VC}$ and $I_{VB}$, so as to substitute $I_{VC}$ and $I_{VB}$ with 0, respectively; and

(10) returning to the step (1).

2. An automatic development device of a photosensitive lithographic printing plate for developing an exposed photosensitive lithographic printing plate with a developer and keeping a developer activity constant by replenishing with a replenisher, the device comprises:

a development processing section for developing the photosensitive lithographic printing plate with a developer;

an electric conductivity measurement unit for measuring an electric conductivity of the developer; and a developer replenishing unit for replenishing the developer with a development replenisher, wherein replenishing the developer with the development replenisher is carried out based on the developer replenishing method according to claim 1.

3. A developer replenishing method of a photosensitive lithographic printing plate including: developing an exposed photosensitive lithographic printing plate with a developer; and keeping a developer activity constant by replenishing with a replenisher, the method comprises repeating the following steps (1) to (14):

(1) obtaining an integrating value of replenishment due to aging ($I_{VC}$) by integrating a replenishing amount due to aging ($V_C \times T_K$) operated from a setting value of replenishing amount due to aging ($V_C$) at every fixed elapsed time ($T_K$), provided that an initial value of $V_C$ in a first cycle of the steps (1) to (14) is a predetermined value, and in a second or later cycle of the steps (1) to (14), when a value of $V_C$ is changed in a previous cycle of the steps (1) to (14), a value of $V_C$ represents a value obtained in the following steps (8) to (11) in the previous cycle;

(2) obtaining an integrating value of replenishment due to processing ($I_{VB}$) by integrating a replenishing amount due to processing ($V_B \times S$) operated from a setting value of replenishing amount due to processing ($V_B$) in every processing of a plate having a fixed area (S), provided that an initial value of $V_B$ in a first cycle of the steps (1) to (14) is a predetermined value, and in a second or later cycle of the steps (1) to (14), when a value of $V_B$ is changed in a previous cycle of the steps (1) to (14), a value of $V_B$ represents a value obtained in the following steps (8) to (11) in the previous cycle;

(3) obtaining a value of an electric conductivity of the developer ($d_M$) by measuring an electric conductivity of the developer at every predetermined fixed period;

(4) calculating a sum of the integrating value of replenishment due to aging ($I_{VC}$) and the integrating value of replenishment due to processing ($I_{VB}$), and comparing the sum with a predetermined replenishing amount per one time ($V_L$);

(5) when ($I_{VC}+I_{VB}$) is not larger than $V_L$, returning to the step (1), and when ($I_{VC}+I_{VB}$) is larger than $V_L$, replenishing the developer in a developing tank with a replenisher in an amount of ($I_{VC}+I_{VB}$);

(6) calculating an operating value 2 of electric conductivity ($d_{T2}$) by the following expression (6):

$$d_{T2} = [V_T \times d_{T1} + (I_{VC}+I_{VB}) \times F \times D_C + (I_{VC}+I_{VB}) \times (1-F) \times D_B] \div (V_T+I_{VC}+I_{VB}) \quad (6)$$

wherein $d_{T1}$ in a first cycle of the steps (1) to (14) is an electric conductivity value ($D_M$) which is empirically predetermined, and $d_{T1}$ in a second or later cycle of the steps (1) to (14) is $d_{T1}$ calculated in the step (7) in the previous cycle; $V_T$ represents an amount of the developer in the developing tank; F represents a replenishment rate due to aging, provided that F in a first cycle of the steps (1) to (14) is a predetermined value, and F in a second or later cycle of the steps (1) to (14) is F calculated in the step (12) in the previous cycle; and $D_C$ and $D_B$ each represents an empirically predetermined constant;

(7) calculating an operating value 1 of electric conductivity ($d_{T1}$) by the following expression (7):

$$d_{T1} = [V_T \times d_{T1o} + V_C \times T_P \times D_C + (I_{VC}+I_{VB}-V_C \times T_P) \times D_B] \div (V_T+I_{VC}+I_{VB}) \quad (7)$$

wherein $d_{T1o}$ represents $d_{T1}$ before renewal, and $d_{T1o}$ in a first cycle of the steps (1) to (14) is an electric conductivity value ($D_M$) which is empirically predetermined; $V_T$ represents an amount of the developer in the developing tank; $V_C$ represents a setting value of replenishing amount due to aging; $T_P$ represents an elapse time from a point in time of the last replenishment to the present; and $D_C$ and $D_B$ each represents an empirically predetermined constant;

(8) comparing the operating value 1 of electric conductivity ($d_{T1}$) with the value of the electric conductivity of the developer ($d_M$);

(9) when $d_{T1}$ is larger than $d_M$, renewing the value of $V_C$ by adding a predetermined constant ($C_1$) to the value of $V_C$ and renewing the value of $V_B$ by adding a predetermined constant ($C_2$) to the value of $V_B$, and when $d_{T1}$ is not larger than $d_M$, renewing the value of $V_C$ by reducing a predetermined constant ($C_1$) from the value of $V_C$ and renewing the value of $V_B$ by reducing a predetermined constant ($C_2$) from the value of $V_B$;

(10) comparing the operating value 2 of electric conductivity ($d_{T2}$) with the value of the electric conductivity of the developer ($d_M$);

(11) when $d_{T2}$ is larger than $d_M$, renewing the value of $V_C$ by adding a predetermined constant ($C_3$) to the value of $V_C$ and renewing the value of $V_B$ by reducing a predetermined constant ($C_4$) from the value of $V_B$, and when $d_{T2}$ is not larger than $d_M$, renewing the value of $V_C$ by reducing a predetermined constant ($C_3$) from the value of $V_C$ and renewing the value of $V_B$ by adding a predetermined constant ($C_4$) to the value of $V_B$;

(12) calculating a renewed value of F by the following expression:

$$\text{Renewed value of } F = (V_L \times F + I_{VC}) \div (V_L + I_{VC} + I_{VB})$$

(13) initializing $I_{VC}$ and $I_{VB}$, so as to substitute $I_{VC}$ and $I_{VB}$ with 0, respectively; and

(14) returning to the step (1).

4. A developer replenishing method of a photosensitive lithographic printing plate including: developing an exposed photosensitive lithographic printing plate with a developer; and keeping a developer activity constant by replenishing with a replenisher, the method comprises repeating the following steps (1) to (15):

(1) obtaining an integrating value of replenishment due to aging ($I_{VC}$) by integrating a replenishing amount due to aging ($V_C \times T_K$) operated from a setting value of replenishing amount due to aging ($V_C$) at every fixed elapsed time ($T_K$), provided that an initial value of $V_C$ in a first cycle of the steps (1) to (15) is a predetermined value, and in a second or later cycle of the steps (1) to (15), when a value of $V_C$ is changed in a previous cycle of the steps (1) to (15), a value of $V_C$ represents a value obtained in the following steps (9) to (12) in the previous cycle;

(2) obtaining an integrating value of replenishment due to processing ($I_{VB}$) by integrating a replenishing amount due to processing ($V_B \times S$) operated from a setting value of replenishing amount due to processing ($V_B$) in every processing of a plate having a fixed area (S), provided that an initial value of $V_B$ in a first cycle of the steps (1) to (15) is a predetermined value, and in a second or later cycle of the steps (1) to (15), when a value of $V_B$ is changed in a previous cycle of the steps (1) to (15), a value of $V_B$ represents a value obtained in the following steps (9) to (12) in the previous cycle;

(3) obtaining a value of an electric conductivity of the developer ($d_M$) by measuring an electric conductivity of the developer at every predetermined fixed period;

(4) calculating a sum of the integrating value of replenishment due to aging ($I_{VC}$) and the integrating value of replenishment due to processing ($I_{VB}$), and comparing the sum with a predetermined replenishment amount per one time ($V_L$);

(5) when ($I_{VC} + I_{VB}$) is not larger than $V_L$, returning to the step (1), and when ($I_{VC} + I_{VB}$) is larger than $V_L$, replenishing the developer in a developing tank with a replenisher in an amount of ($I_{VC} + I_{VB}$);

(6) calculating an operating value 1 of electric conductivity ($d_{T1}$) by the following expression (11):

$$d_{T1} = (1-X) \times D_M + X \times [(1-F) \times D_B + F \times D_C] \quad (11)$$

wherein $D_M$ represents an electric conductivity value ($D_M$) which is empirically predetermined; X represents a displacement rate of replenisher, provided that X in a first cycle of the steps (1) to (15) is a predetermined value, and X in a second or later cycle of the steps (1) to (15) is X calculated in the step (13) in the previous cycle; F represents a replenishment rate due to aging, provided that F in a first cycle of the steps (1) to (15) is a predetermined value, and F in a second or later cycle of the steps (1) to (15) is F calculated in the step (13) in the previous cycle; and $D_C$ and $D_B$ each represents an empirically predetermined constant;

(7) calculating an operating value 2 of electric conductivity ($d_{T2}$) by the following expression (12):

$$d_{T2} = [V_T \times d_{T1} + V_C \times T_P \times D_C + (I_{VC} + I_{VB} - V_C \times T_P) \times D_B] \div (V_T + I_{VC} + I_{VB}) \quad (12)$$

wherein $V_T$ represents an amount of the developer in the developing tank; $V_C$ represents a setting value of replenishing amount due to aging; $T_P$ represents an elapse time from a point in time of the last replenishment to the present; and $D_C$ and $D_B$ each represents an empirically predetermined constant;

(8) calculating an operating value 3 of electric conductivity ($d_{T3}$) by the following expression (13):

$$d_{T3} = [V_T \times d_{T1} + (I_{VC} + I_{VB}) \times F \times D_C + (I_{VC} + I_{VB}) \times (1-F) \times D_B] \div (V_T + I_{VC} + I_{VB}) \quad (13)$$

(9) comparing the operating value 2 of electric conductivity ($d_{T2}$) with the value of the electric conductivity of the developer ($d_M$);

(10) when $d_{T2}$ is larger than $d_M$, renewing the value of $V_C$ by adding a predetermined constant ($C_1$) to the value of $V_C$ and renewing the value of $V_B$ by adding a predetermined constant ($C_2$) to the value of $V_B$, and when $d_{T2}$ is not larger than $d_M$, renewing the value of $V_C$ by reducing a predetermined constant ($C_1$) from the value of $V_C$ and renewing the value of $V_B$ by reducing a predetermined constant ($C_2$) from the value of $V_B$;

(11) comparing the operating value 3 of electric conductivity ($d_{T3}$) with the value of the electric conductivity of the developer ($d_M$);

(12) when $d_{T3}$ is larger than $d_M$, renewing the value of $V_C$ by adding a predetermined constant ($C_3$) to the value of $V_C$ and renewing the value of $V_B$ by reducing a predetermined constant ($C_4$) from the value of $V_B$, and when $d_{T3}$ is not larger than $d_M$, renewing the value of $V_C$ by reducing a predetermined constant ($C_3$) from the value of $V_C$ and renewing the value of $V_B$ by adding a predetermined constant ($C_4$) to the value of $V_B$;

(13) calculating a renewed value of F and a renewed value of X by the following expressions, respectively:

$$\text{Renewed value of } X = (V_T \times X + I_{VC} + I_{VB}) \div (V_T + I_{VC} + I_{VB})$$

$$\text{Renewed value of } F = (V_T \times X \times F + I_{VC}) \div (V_T \times X + I_{VC} + I_{VB})$$

(14) initializing $I_{VC}$ and $I_{VB}$, so as to substitute $I_{VC}$ and $I_{VB}$ with 0, respectively; and

(15) returning to the step (1).

* * * * *